(12) United States Patent
Nishihara et al.

(10) Patent No.: US 7,407,697 B2
(45) Date of Patent: Aug. 5, 2008

(54) INFORMATION RECORDING MEDIUM AND METHOD FOR MANUFACTURING THE SAME

(75) Inventors: Takashi Nishihara, Hirakata (JP); Yukako Doi, Takatsuki (JP); Rie Kojima, Kadoma (JP); Noboru Yamada, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 445 days.

(21) Appl. No.: 11/072,532

(22) Filed: Mar. 7, 2005

(65) Prior Publication Data

US 2005/0202204 A1 Sep. 15, 2005

(30) Foreign Application Priority Data

Mar. 10, 2004 (JP) ............................. 2004-066878
Mar. 12, 2004 (JP) ............................. 2004-070414

(51) Int. Cl.
*B32B 3/02* (2006.01)

(52) U.S. Cl. .................. 428/64.1; 428/64.4; 428/64.5; 428/64.6; 430/270.13

(58) Field of Classification Search ................ 428/64.5, 428/64.6; 430/270.13
See application file for complete search history.

(56) References Cited

U.S. PATENT DOCUMENTS

| | | | | |
|---|---|---|---|---|
| 5,095,479 A | * | 3/1992 | Harigaya et al. ............ | 369/288 |
| 5,234,737 A | * | 8/1993 | Ueno et al. ................. | 428/64.4 |
| 5,688,574 A | * | 11/1997 | Tamura et al. .............. | 428/64.1 |
| 5,753,413 A | * | 5/1998 | Nishida et al. .......... | 430/270.13 |
| 6,881,466 B2 | * | 4/2005 | Kojima et al. .............. | 428/64.1 |
| 2004/0121261 A1 | * | 6/2004 | Ashida et al. .......... | 430/270.13 |

FOREIGN PATENT DOCUMENTS

| | | |
|---|---|---|
| CN | 1445770 | 10/2003 |
| EP | 0 825 595 | 2/1998 |
| EP | 0 844 607 | 5/1998 |
| EP | 1 501 091 | 1/2005 |
| EP | 1 669 207 | 6/2006 |
| JP | 10-275360 | 10/1998 |
| JP | 2000-36130 | 2/2000 |

(Continued)

OTHER PUBLICATIONS

Chinese Office Action issued Jan. 4, 2008 in corresponding Chinese application.

*Primary Examiner*—Elizabeth Mulvaney
(74) *Attorney, Agent, or Firm*—Wenderoth Lind & Ponack, L.L.P.

(57) ABSTRACT

An information recording medium is provided that has high recording sensitivity for recording information and superior repeated rewriting performance. The information recording medium has at least a recording layer that is changeable between a crystalline phase and an amorphous phase by applying a laser beam or electric current and a dielectric layer. The dielectric layer contains at least C, Si, Sn and O. Alternatively, the information recording medium includes at least two information layers with at least one of the information layer including at least a recording layer that is changeable between a crystalline phase and an amorphous phase by applying a laser beam or electric current and a dielectric layer. The dielectric layer contains at least C, Si, Sn and O.

48 Claims, 14 Drawing Sheets

FOREIGN PATENT DOCUMENTS

| | | |
|---|---|---|
| JP | 2001-322357 | 11/2001 |
| JP | 2002-144736 | 5/2002 |
| JP | 2003-91870 | 3/2003 |
| JP | 2003/228881 | 8/2003 |
| JP | 2004-158145 | 6/2004 |
| WO | 97/34298 | 9/1997 |

* cited by examiner

INFORMATION RECORDING MEDIUM AND METHOD FOR MANUFACTURING THE SAME

CROSS-REFERENCE TO RELATED APPLICATIONS

This application claims priority to Japanese Patent Application Nos. 2004-066878 and 2004-070414. The entire disclosures of Japanese Patent Application Nos. 2004-066878 and 2004-070414 are hereby incorporated herein by reference.

BACKGROUND OF THE INVENTION

1. Field of the Invention

The present invention relates generally to an information recording medium for recording, erasing, rewriting or reproducing information optically or electrically and a method for manufacturing the same.

2. Background Information

One type of conventional information recording medium is a phase-change type information recording medium. Information is recorded, erased, and rewritten on the phase-change type information recording media by utilizing a phenomenon that a recording layer (a phase change material layer) changes between a crystalline phase and an amorphous phase for recording, erasing, rewriting or reproducing information. Among the phase-change type information recording media, a type that utilizes a laser beam for recording, erasing, rewriting or reproducing information optically is called an optical phase-change type information recording medium. This optical phase-change type information recording medium has a recording layer with a phase change material that changes between the crystalline phase and the amorphous phase by heat from a laser beam. A difference of reflectance between the crystalline phase and the amorphous phase is detected so as to read the information from the recording layer. Among the optical phase-change type information recording media, a rewritable optical phase-change type information recording medium is one in which recorded information can be erased or rewritten. In other words, a rewritable optical phase-change type information recording medium has a recording layer whose initial state is usually in the crystalline phase, and a recorded state that is usually in the amorphous phase. In general, when recording information, the recording layer is melted and cooled abruptly with irradiation of a laser beam having a higher power (a recording power) than that for erasing, so that the irradiated portion is changed to an amorphous phase. On the other hand, when erasing information, the recording layer is warmed and cooled gradually with irradiation of a laser beam having a lower power (an erasing power) than that for recording, so that the irradiated portion is changed to a crystalline phase. Therefore, it is possible to erase recorded information while recording or rewriting new information on the rewritable optical phase-change type information recording medium by irradiating a recording layer with a laser beam whose power is modulated between a high power level and a lower power level. In addition, among the optical phase-change type information recording media, a write once optical phase-change type information recording medium is one in which information can be recorded only once and the recorded information cannot be erased or rewritten. The write once optical phase-change type information recording medium has a recording layer whose initial state is usually in the amorphous phase. When recording information in this type of information recording medium, the recording layer is heated and then cooled gradually with irradiation of a laser beam having a high power (a recording power), so that so that the irradiated portion is changed to the crystalline phase.

Instead of applying a laser beam as described above, electric energy (for example, current) can be applied for another type of medium so as to generate Joule heat and to change a state of the phase change material of the recording layer for recording information. This type of medium is called an electric phase-change type information recording medium. In this electric phase-change type information recording medium, a state of the phase change material of the recording layer is changed between the crystalline phase (low resistance) and the amorphous phase (high resistance) by Joule heat generated by applying current. A difference of resistance between the crystalline phase and the amorphous phase is detected so as to read the information from the recording layer.

One example of an optical phase-change type information recording medium is a 4.7 GB/DVD-RAM that is disclosed in Japanese Unexamined Patent Publication No. 2001-322357. The 4.7 GB/DVD-RAM basically has a seven-layered structure, as shown in FIG. 12, in which the seven-layered structure includes a first dielectric layer 2, a first interface layer 3, a recording layer 4, a second interface layer 5, a second dielectric layer 6, an light absorption adjusting layer 7 and a reflecting layer 8 on the substrate 1 in this order viewed from the laser incident side to form an information recording medium 12. The first dielectric layer 2 and the second dielectric layer 6 have an optical function of adjusting an optical distance and increasing light absorption efficiency of the recording layer 4 so as to increase a difference of reflectance between the crystalline phase and the amorphous phase so that the signal intensity is enlarged.

The first dielectric layer 2 and the second dielectric layer 6 also have a thermal function of insulating thermally the substrate 1, a dummy substrate 10 or the like that is heat-sensitive from the recording layer 4 that becomes high temperature when information is recorded. The material of $(ZnS)_{80}(SiO_2)_{20}$ (mol %) that has been used is a superior dielectric material that is transparent and has a high refractivity, a low thermal conductivity for a good thermal insulation, good mechanical characteristics and good resistance to humidity. Note that film thickness values of the first dielectric layer 2 and the second dielectric layer 6 can be determined precisely by calculation in accordance with a matrix method so as to satisfy conditions that quantity of light reflected by the recording layer 4 changes substantially between the crystalline phase and that the amorphous phase and that light absorption by the recording layer 4 becomes large.

As a material of the recording layer 4, a fast crystallization material containing $(Ge—Sn)Te—Sb_2Te_3$ is used, which is obtained by replacing Ge with Sn partially in the $GeTe—Sb_2Te_3$ quasi-binary line of phase change materials. The $GeTe—Sb_2Te_3$ quasi-binary line is a mixture of compounds GeTe and $Sb_2Te_3$, that realize not only good initial recording and rewriting performance but also a good record conservation property (an indicator whether or not a recorded signal can be reproduced after a long conservation) as well as a good rewriting conservation property (an indicator whether or not a recorded signal can be erased or rewritten after a long conservation).

The first interface layer 3 and the second interface layer 5 have a function of preventing material transfer that may occur between the first dielectric layer 2 and the recording layer 4, as well as between the second dielectric layer 6 and the recording layer 4. This material transfer is a phenomenon in which S (sulfur) diffuses into the recording layer when the recording layer 4 is irradiated with the laser beam repeatedly when recording or rewriting information where the first dielectric layer 2 and the second dielectric layer 6 are made of $(ZnS)_{80}(SiO_2)_{20}$ (mol %). When sulfur diffuses into the recording layer, the reflectance of the recording layer 4 is deteriorated, so that repeated rewriting performance is deteriorated. In order to prevent this deterioration of the repeated rewriting performance, it has been proposed in Japanese Unexamined Patent Publication No. 10-275360 to use a nitride containing Ge for the first interface layer 3 and the second interface layer 5.

The light absorption adjusting layer 7 has a function of adjusting a ratio Ac/Aa of a light absorption rate Ac when the recording layer 4 is in the crystalline state to a light absorption rate Aa when the recording layer 4 is in the amorphous state, so as to suppress a distortion of a rewritten mark shape.

The reflecting layer 8 has an optical function of increasing quantity of light that is absorbed by the recording layer 4 and a thermal function of dispersing heat rapidly that is generated in the recording layer 4 for rapid cooling so that the recording layer 4 becomes the amorphous state easily. In addition, the reflecting layer 8 also has a function of protecting a multi-layered film from surrounding environment.

Utilizing the techniques described above, superior rewriting performance and high reliability have been realized in the process of commercializing the 4.7 GB/DVD-RAM.

Note that a material that contains no sulfur can be used for the dielectric layer in order to prevent deterioration of the repeated rewriting performance. It has been proposed in Japanese Unexamined Patent Publication Nos. 2003-091870 and 2003-228881 that a material that mainly contains $SnO_2$ can be used as one of the materials for the dielectric layer and that contains no sulfur.

Furthermore, in recent years, various techniques have been researched to provide larger storage capacity for information recording media. For example, a technique for achieving high density recording by using a blue-violet laser having a shorter wavelength than that of a conventionally used red laser or using a thin substrate on the side from which a laser beam is incident and a lens having a large numerical aperture NA to reduce the spot diameter of the laser beam has been researched. When the spot diameter is reduced for recording information, an area irradiated with the laser beam is restricted to a smaller area. As a result, a power density absorbed by the recording layer increases so that volume variation increases. Therefore, the material transfer phenomenon can occur more easily, and the repeated rewriting performance may be deteriorated if a material such as ZnS—$SiO_2$ containing sulfur is used in contact with the recording layer.

In addition, another technique has been researched, in which an optical phase-change type information recording medium is provided with two information layers. The two information layers are recorded/reproduced with a laser beam incident from one of the two information layers. This technique, which uses two information layers, can achieve about twice the recording density. An information recording medium including two information layers on/from which information is recorded/reproduced from one side can hereinafter be referred to as a two-information recording-layer medium. Information is recorded and/or reproduced on the two information layer by using a laser beam that enters from one side. It has been proposed in Japanese Unexamined Patent Publication Nos. 2000-036130 and 2002-144736. In this two-information recording-layer medium, a laser beam that has passed one information layer that is closer to the laser beam incident side (hereinafter referred to as a first information layer) is used for recording and reproducing information on the other information layer that is farther from the laser beam incident side (hereinafter referred to as a second information layer). Therefore, a film thickness of the first information layer is made very thin so that the transmittance thereof is enhanced. However, when the recording layer becomes thin, an influence of material transfer from a layer that contacts with the recording layer increase. Therefore, if a material containing sulfur is used such as ZnS—$SiO_2$ that is in contact with the recording layer, then the repeated rewriting performance may be deteriorated rapidly. In such a case, one method for preventing the deterioration of the repeated rewriting performance is to dispose interface layers made of a nitride containing Ge on both sides of the recording layer so as to reduce the influence of the material transfer in the same manner as the case of 4.7 GB/DVD-RAM.

However, in the case of optical phase-change type information recording medium for recording information in high density by reducing a spot diameter of the laser beam, larger energy (laser power) is applied to the recording layer when recording information. Therefore, if the conventional interface layer contains a nitride containing Ge, then heat generated in the recording layer may destroy the film of the interface layer. As a result, the diffusion of sulfur from the dielectric layer cannot be prevented, and the repeated rewriting performance may be deteriorated rapidly.

In addition, a nitride containing Ge has high thermal conductivity. Therefore, heat can disperse easily if the interface layer is thickened for suppressing the diffusion of sulfur from the dielectric layer. As a result, recording sensitivity may be deteriorated.

In view of the above, it will be apparent to those skilled in the art from this disclosure that there exists a need for an improved information recording medium. This invention addresses this need in the art as well as other needs, which will become apparent to those skilled in the art from this disclosure.

SUMMARY OF THE INVENTION

An object of the present invention is to provide a phase-change type information recording medium in which both the repeated rewriting performance and the recording sensitivity are improved.

An information recording medium according to the present invention includes an information layer including at least a recording layer that is changeable between a crystalline phase and an amorphous phase by applying a laser beam or electric current, and a dielectric layer that contains at least C, Si, Sn and O.

In addition, in an information recording medium that includes a plurality of information layers including at least one information layer including at least the above-mentioned recording layer and a dielectric layer, the dielectric layer can contains at least C, Si, Sn and O.

According to these structures, an information layer of a phase-change type information recording medium having improved repeated rewriting performance and recording sensitivity can be obtained.

In addition, the information recording medium according to the present invention is preferable to include the recording layer is arranged closer to a laser incident side of the information recording medium than the dielectric layer. Furthermore, an interface layer can be disposed between the recording layer and the dielectric layer.

According to this structure, material transfer that can occur between the recording layer and the dielectric layer can be prevented.

In the information recording medium according to the present invention, a composition of the dielectric layer can be represented by a composition formula $C_d Si_e Sn_f O_{100-d-e-f}$, where $0<d<25$, $0<e<25$, and $15<f<40$ (atom %). In addition, the dielectric layer can be made of a mixture of $SnO_2$ and SiC in the information recording medium according to the present invention. In this case, a composition of the dielectric layer can be represented by a composition formula $(SnO_2)_{100-x}(SiC)_x$, where $0<x \leqq 50$ (mol %).

In addition, the dielectric layer can further contain at least one of a following group of elements of Ti, Zr, Hf, Y, Zn, Nb, Ta, Al, Bi, Cr, Ga, Ge and La in the information recording medium according to the present invention. In addition, the dielectric layer can further contain at least one of a following group of compounds of $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Si—N, Ge—N, Cr—N and $LaF_3$.

According to these structures, repeated rewriting performance and recording sensitivity of the phase-change type information recording medium can be improved.

In the information recording medium according to the present invention, it is preferable that the dielectric layer has a film thickness within a range of 2-75 nm. It is more preferable that the film thickness is within a range of 2-40 nm.

According to this structure, heat generated in the recording layer can be diffused effectively to a reflecting layer side.

In the information recording medium according to the present invention, the recording layer can contain at least one of a following group of elements of Sb, Bi and Sn, and contains Ge and Te. In addition, the recording layer can be represented by one of a following group of compositions (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2Te_3$ and (Ge—Sn)Te—(Sb—Bi)$_2Te_3$. According to this structure, the repeated rewriting performance of the phase-change type information recording medium can be improved.

In the information recording medium according to the present invention, the interface layer can contain at least one of a following group of elements of Zr, Hf, Y and Si, contain at least one of a following group of elements of Ga and Cr and contain O.

In addition, the interface layer can contain at least one oxide of a following group of oxides of $ZrO_2$, $HfO_2$, $Y_2O_3$ and $SiO_2$, and contains at least one oxide of a following group of oxides of $Ga_2O_3$ and $Cr_2O_3$.

According to this structure, the repeated rewriting performance of the phase-change type information recording medium can be further improved.

In addition, it is preferable that the interface layer has a film thickness within a range of 0.5-15 nm. It is more preferable that the interface layer has a film thickness within a range of 1-7 nm.

According to this structure, a condition that a change of reflected light quantity should be large can be satisfied.

In addition, a method for manufacturing an information recording medium according to the present invention includes forming an information layer including at least forming a phase-change type recording layer and forming a dielectric layer, and using a sputtering target containing at least C, Si, Sn and O in forming the dielectric layer.

In addition, a method for manufacturing an information recording medium according to the present invention includes forming a plurality of information layers, and at least one of the forming of an information layers includes at least forming a phase-change type recording layer and forming a dielectric layer, and using a sputtering target containing at least C, Si, Sn and O in forming the dielectric layer.

According to these structures, an information layer having improved repeated rewriting performance and recording sensitivity can be manufactured.

In addition, the method for manufacturing the information recording medium according to the present invention can further include forming an interface layer between forming the recording layer and forming the dielectric layer.

In the method for manufacturing the information recording medium according to the present invention, the sputtering target used for forming the dielectric layer can be represented by a composition formula $C_g Si_h Sn_i O_{100-g-h-i}$, where $0<g<30$, $0<h<30$, and $15<i<40$ (atom %).

In addition, in the method for manufacturing the information recording medium according to the present invention, the sputtering target for forming the dielectric layer can be a mixture of $SnO_2$ and SiC. In this case, the sputtering target for forming the dielectric layer can be represented by a composition formula $(SnO_2)_{100-y}(SiC)_y$, where $0<y \leqq 55$ (mol %).

According to these structures, a phase-change type information recording medium having improved repeated rewriting performance and recording sensitivity can be manufactured.

In addition, in the method for manufacturing the information recording medium according to the present invention, the sputtering target used for forming the dielectric layer can further contain at least one of a following group of elements consisting of Ti, Zr, Hf, Y, Zn, Nb, Ta, Al, Bi, Cr, Ga, Ge and La.

In addition, the sputtering target used for forming the dielectric layer can further contain at least one of a following group of compound of $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Si—N, Ge—N, Cr—N and $LaF_3$.

According to these structures, a phase-change type information recording medium having improved repeated rewriting performance and recording sensitivity can be manufactured.

In the method for manufacturing the information recording medium according to the present invention, the dielectric layer can be formed using Ar gas or a mixed gas of Ar gas and $O_2$ gas. According to this structure, a phase-change type information recording medium can be manufactured more precisely.

The information recording medium according to the present invention, which is for at least one of recording and reproducing information by applying at least one of light or electric energy, includes an information layer including a dielectric layer that contains at least one of elements of a group GM consisting of Sn and Ga, contains at least one of elements of a group GL consisting of Si, Ta and Ti, and contains oxygen and carbon. According to this structure, it is not necessary to provide the interface layer.

In the information recording medium according to the present invention, the dielectric layer is represented by a composition formula $M_H O_I L_J C_K$ (atom %), where element M is at least one of elements of the group GM, element L is at least one of elements of the group GL, and the following relationships are satisfied $10 \leqq \leqq H \leqq \leqq 40$, $35 \leqq \leqq I \leqq \leqq 70$, $0<J \leqq \leqq 30$, $0<K \leqq \leqq 30$, and $H+I+J+K=100$.

Furthermore, the dielectric layer can contain at least one of Zr and Hf, and is represented by a composition formula $M_H A_P O_I L_J C_K$ (atom %), where element M is at least one of elements of the group GM, elemental is at least one of elements of the group consisting of Zr and Hf, element L is at least one of elements of the group GL, and the following relationships are satisfied $10 \leq H \leq 40$, $0 < P \leq 15$, $35 \leq I \leq 70$, $0 < J \leq 30$, $0 < K \leq 30$, and $H + P + I + J + K = 100$.

In addition, it is preferable that the element M is Sn in the dielectric layer, or that the dielectric layer can contain Sn and Ga as the element M. In addition, the dielectric layer can contain Zr as the element A. According to these structures, a phase-change type information recording medium having improved repeated rewriting performance and recording sensitivity can be manufactured.

The information recording medium according to the present invention is preferable to have a phase-change type recording layer. It is preferable that the recording layer contains one of a following group of materials of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

According to these structures, an information recording medium that can transfer information of high density at high speed can be manufactured.

Furthermore, it is preferable that the recording layer has a film thickness of less than or equal to 15 nm. According to this structure, an obstacle to rewriting information can be removed.

In the method for manufacturing an information recording medium according to the present invention, the information recording medium includes a dielectric layer, and the dielectric layer is formed by a sputtering method using a sputtering target that contains at least one of elements of a group GM consisting of Sn and Ga, contains at least one of elements of a group GL consisting of Si, Ta and Ti, and contains oxygen and carbon.

In addition, it is preferable that the sputtering target contains a material that is represented by a composition formula $M_H O_I L_J C_K$ (atom %), where element M is at least one of elements of the group GM, element L is at least one of elements of the group GL, and the following relationships are satisfied $10 \leq h \leq 40$, $35 \leq i \leq 70$, $0 < j \leq 30$, $0 < k \leq 30$, and $h + i + j + k = 100$.

Furthermore, it is preferable that the sputtering target contains at least one of Zr and Hf and contains a material that is represented by a composition formula $M_H A_P O_I L_J C_K$ (atom %), where element M is at least one of elements of the group GM, element A is at least one of elements of Zr and Hf, element L is at least one of elements of the group GL, and the following relationships are satisfied $10 \leq h \leq 40$, $0 < p \leq 15$, $35 \leq i \leq 70$, $0 < j \leq 30$, $0 < k \leq 30$, and $h + p + i + j + k = 100$.

In addition, it is preferable that the element M is Sn in the sputtering target, or that the element M contains Sn and Ga, or that the element A contains Zr.

According to these structures, a phase-change type information recording medium having improved repeated rewriting performance and recording sensitivity can be manufactured.

The sputtering target can contain an oxide of at least one of elements of the group GM consisting of Sn and Ga, and a carbide of at least one of elements of the group GL consisting of Si, Ta and Ti. In addition, the sputtering target can contain at least one of oxides of Zr and Hf.

Furthermore, it is preferable that the sputtering target contains oxides of elements of the group GM by 50 mol % or more, or contains an oxide of Sn and an oxide of Ga by total 50 mol % or more.

The sputtering target can contain a material that is represented by a composition formula $(D)_x (B)_{100-x}$ (mol %), where element D is at least one of compounds of $SnO_2$ and $Ga_2O_3$, element B is at least one of compounds of SiC, TaC and TiC, and term x falls in a range $50 \leq x \leq 95$. It is preferable that the sputtering target contains a material in which the element D is represented by a composition $SnO_2$, or contains a material that is represented by a composition $SnO_2$ and $Ga_2O_3$ as the element D.

In addition, it is preferable that the sputtering target contains a material that is represented by a composition $ZrO_2$ as the element A, and it is preferable that the sputtering target contains a material in which B is represented by a composition SiC.

According to these structures, a phase-change type information recording medium having improved repeated rewriting performance and recording sensitivity can be manufactured.

According to the phase-change type information recording medium of the present invention, repeated rewriting performance and recording sensitivity can be improved. In addition, according to the method of the present invention for manufacturing a phase-change type information recording medium, a phase-change type information recording medium of the present invention can be manufactured easily.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DESCRIPTION OF THE PREFERRED EMBODIMENTS

Figure 1:
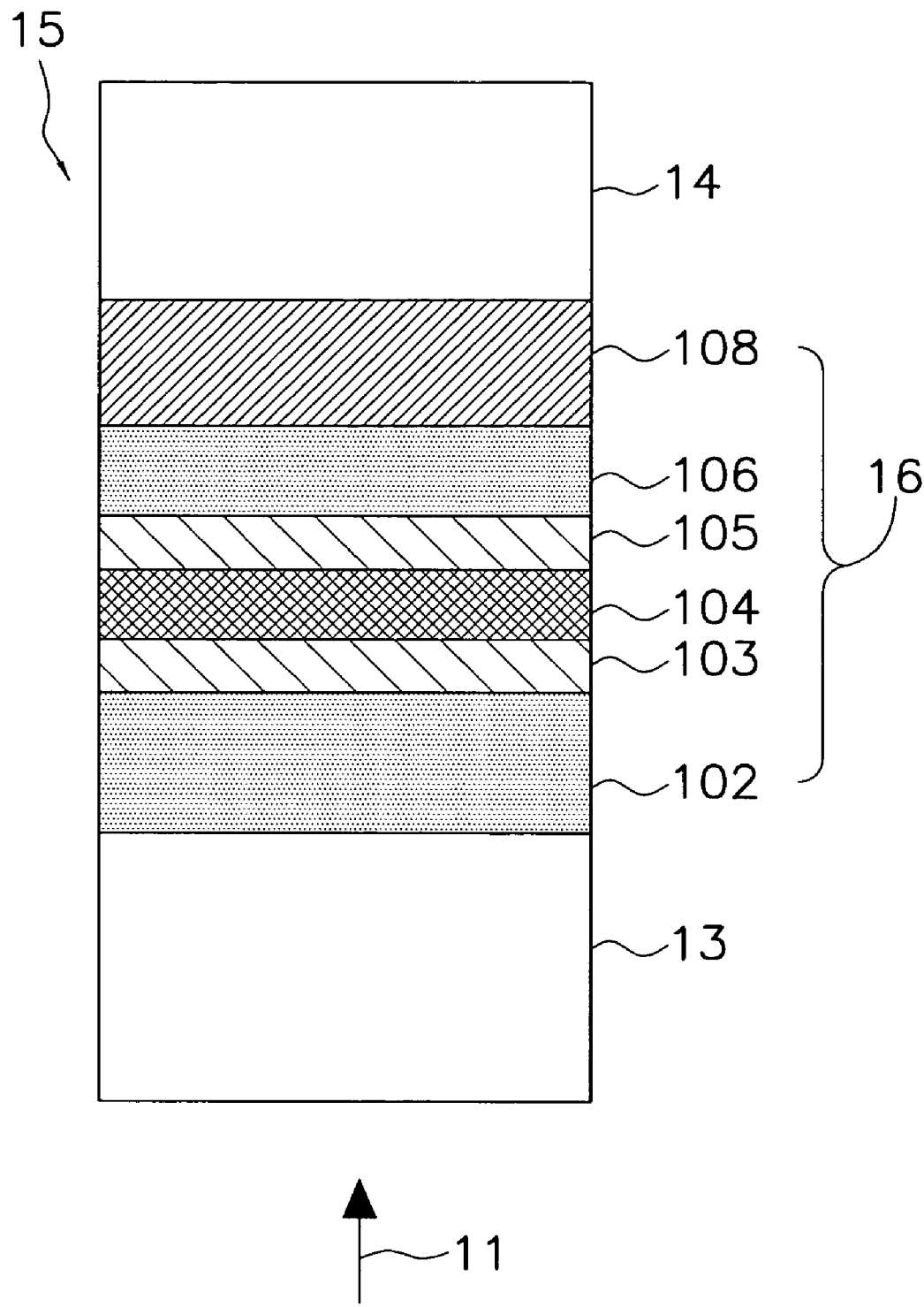
FIG. 1 is a partial cross sectional view of an information recording medium showing an example of a layer structure of the information recording medium with a single layered information layer according to one embodiment of the present invention.

Selected embodiments of the present invention will now be described with reference to drawings. Note that the following embodiments are just examples, and the present invention is not limited to these embodiments. In other words, it will be apparent to those skilled in the art from this disclosure that the following descriptions of the embodiments of the present invention are provided for illustration only and not for the purpose of limiting the invention as defined by the appended claims and their equivalents. In addition, in the following embodiments, overlapping description can be omitted by assigning the same reference numerals to the same elements.

Embodiment 1

As a first embodiment, an example of an information recording medium according to the present invention will be explained. A partial cross sectional view of an information recording medium 15 according to the first embodiment is shown in FIG. 1. The information recording medium 15 is preferably an optical information recording medium on which information can be recorded and/or reproduced by applying a laser beam 11.

The information recording medium 15 includes a transparent layer 13 and a substrate 14 with an information layer 16 disposed between the transparent layer 13 and the substrate 14. The transparent layer 13 is made of a resin material such as a photo-curing resin (especially an ultraviolet curing resin) or a delayed action resin, a dielectric, or the like. The resin material of the transparent layer 13 preferably has a small value of light absorption of the laser beam 11 as well as a small value of optical double refraction in the short wavelength range. In addition, the transparent layer 13 can be a transparent disk-like resin such as a polycarbonate, an amorphous polyolefin or a PMMA, or a glass. In this case, the transparent layer 13 can be bonded to a first dielectric layer 102 by using a resin such as a photo-curing resin (especially an ultraviolet curing resin), a delayed action resin or the like.

A wavelength $\lambda$ of the laser beam 11 is preferably less than or equal to 450 nm for high density recording because the spot diameter of the collected laser beam 11 depends on the wavelength $\lambda$ (the shorter the wavelength $\lambda$ is, the smaller the spot diameter becomes). In addition, if the wavelength $\lambda$ is shorter than 350 nm, then the light absorption by the transparent layer 13 and others becomes excessive. Thus, it is more preferable that the wavelength $\lambda$ be within the range of 350-450 nm.

The substrate 14 is a transparent disk-like substrate. The substrate 14 can be made of a resin such as a polycarbonate, an amorphous polyolefin, a PMMA or the like, or a glass. The side surface of the substrate 14 that faces the information layer 16 can be provided with a guide groove for leading the laser beam 11 if necessary. The other side surface of the substrate 14 that faces away from the information layer 16 is preferably smooth. As a material of the substrate 14, a polycarbonate is particularly useful for its superiority in transferring property and productivity and for its low cost. Note that a thickness of the substrate 14 is preferably within the range of 0.5-1.2 mm so that sufficient intensity is ensured and a thickness of the information recording medium 15 becomes approximately 1.2 mm. Note that if the thickness of the transparent layer 13 is approximately 0.6 mm, then good recording and reproducing can be performed with the numeral aperture (NA) of the objective lens being equal to 0.6. Accordingly, it is preferable for the transparent layer 13 to be within the range of 5.5-6.5 mm when recording and reproducing at NA=0.6. In addition, if the thickness of the transparent layer 13 is approximately 0.1 mm, then good recording and reproducing can be performed at NA=0.85. Accordingly, it is preferable for the transparent layer 13 to be within the range of 1.05-1.15 mm when recording and reproducing at NA=0.85.

Hereinafter, a structure of the information layer 16 will be described in detail.

The information layer 16 includes the first dielectric layer 102, a first interface layer 103, a recording layer 104, a second interface layer 105, a second dielectric layer 106 and a reflecting layer 108 that are arranged in this order from the incident side of the laser beam 11.

The first dielectric layer 102 is made of a dielectric material. This first dielectric layer 102 has a function of protecting the recording layer 104 from oxidation, corrosion, deformation or the like. This first dielectric layer 102 also has a function of adjusting the optical distance so as to enhance the light absorption efficiency of the recording layer 104, and increasing a difference of reflected light quantity between before and after recording so that the signal intensity is enlarged. The first dielectric layer 102 can be made of an oxide such as $TiO_2$, $ZrO_2$, $HfO_2$, $ZnO$, $Nb_2O_5$, $Ta_2O_5$, $SiO_2$, $SnO_2$, $Al_2O_3$, $Bi_2O_3$, $Cr_2O_3$ or $Ga_2O_3$. In addition, the first dielectric layer 102 can be made of a nitride such as C—N, Ti—N, Zr—N, Nb—N, Ta—N, Si—N, Ge—N, Cr—N, Al—N, Ge—Si—N or Ge—Cr—N. In addition, the first dielectric layer 102 can be made of a sulfide such as ZnS, a carbide such as SiC, a fluoride such as $LaF_3$ and C. In addition, the first dielectric layer 102 can be made of a mixture of the above-mentioned materials. For example, the material $ZnS$—$SiO_2$ that is a mixture of ZnS and $SiO_2$ is an excellent material for the first dielectric layer 102. The material ZnS—$SiO_2$ is an amorphous material having a high refractivity, a high deposition rate, good mechanical characteristics and good humidity resistance.

The film thickness of the first dielectric layer 102 can be determined precisely by calculation in accordance with the matrix method so that quantity of reflected light changes substantially between the case where the recording layer 104 is in the crystalline phase and the case where it is in the amorphous phase.

The first interface layer 103 has a function of preventing material transfer that can be generated between the first dielectric layer 102 and the recording layer 104 by recording repeatedly. The first interface layer 103 is preferably made of a material that has little absorption of light and a high melting point so that it is not melted when recording information as well as a material that has good adhesiveness to the recording layer 104. It is a preferable characteristic that the material of the first interface layer 103 has a high melting point so that it is not melted when recording information, in order to prevent it from melting into the recording layer 104 when the laser beam 11 with high power is applied. If the material of the first interface layer 103 is mixed, a composition of the recording layer 104 changes and the rewriting performance is deteriorated especially. In addition, it is a preferable characteristic that the material of the first interface layer 103 has good adhesiveness to the recording layer 104 in order to securing reliability.

The first interface layer 103 can be made of a material that belongs to the same line as the material of the first dielectric layer 102. Among them, a material containing Cr and O is particularly preferable for promoting crystallization of the recording layer 104. Among them, a material containing an oxide in which Cr and O form $Cr_2O_3$ is preferable for the first interface layer 103. The material containing $Cr_2O_3$ has a good adhesiveness to the recording layer 104. In addition, the first interface layer 103 can be made of a material that contains Ga and O as well. Among them, a material containing an oxide in which Ga and O forms $Ga_2O_3$ is preferable. The material containing $Ga_2O_3$ has a good adhesiveness to the recording layer 104.

In addition, the first interface layer 103 can further contain Cr and O, or Ga and O, as well as M1 (the element M1 is preferably at least one element of Zr and Hf). The material containing $ZrO_2$ and $HfO_2$ is transparent and has a high melting point at approximately 2700-2800 degrees Celsius. It also has a low thermal conductivity among oxides and has a good repeated rewriting performance. Mixing these two types of oxides, even if the first interface layer 103 is formed so as to contact the recording layer 104 partially, it is possible to realize the information recording medium 15 having superior repeated rewriting performance and high reliability.

In order to secure the adhesiveness to the recording layer 104, it is preferable that a material such as $Cr_2O_3$-$M1O_2$ or $Ga_2O_3$-$M1O_2$ that contains 10 mol % or more of $Cr_2O_3$ or $Ga_2O_3$ be used. Furthermore, a material $Cr_2O_3$-$M1O_2$ that contains 70 mol % or less of $Cr_2O_3$ can be used so that the light absorption by the first interface layer 103 is kept in a small quantity (there is a tendency that light absorption increases if $Cr_2O_3$ increases).

The first interface layer 103 can also be made of a material that contains Cr, M1 and O, or Ga, M1 and O, as well as Si. The material containing $SiO_2$ has high transparency so that the first information layer 16 has good recording performance. A content of $SiO_2$ in $SiO_2$—$Cr_2O_3$-$M1O_2$ or $SiO_2$—$Ga_2O_3$-$M1O_2$ is preferably more than or equal to 5 mol % and less than or equal to 50 mol % so as to secure adhesiveness to the recording layer 104. More preferably, the content of $SiO_2$ is more than or equal to 10 mol % and less than or equal to 40 mol %.

The first interface layer 103 preferably has a film thickness within the range of 0.5-15 nm, and more preferably in the range of 1-7 nm so that the difference of quantity of the light reflected by the information layer 16 between before and after recording information is not reduced due to the light absorption in the first interface layer 103.

The second interface layer 105 has a function of preventing material transfer that can be generated between the second dielectric layer 106 and the recording layer 104 by recording repeatedly, similarly to the first interface layer 103. The second interface layer 105 can be made of a material of the same line as the first dielectric layer 102. Among them, a material containing Ga and O is particularly preferable for the second interface layer 105. Also, a material containing an oxide in which Ga and O form $Ga_2O_3$ is preferable for the second interface layer 105. In addition, the second interface layer 105 can also made of a material containing Cr and O. Among them, a material containing an oxide in which Cr and O form $Cr_2O_3$ is preferable for the second interface layer 105. In addition, it is possible that the material for the second interface layer 105 contain Cr and O, or Ga and O, as well as the element M1. It is also possible that the material for the second interface layer 105 contain Cr, M1 and O, or Ga, M1 and O, as well as Si. As the second interface layer 105 has a tendency to have worse adhesiveness than the first interface layer 103, it is preferable that $Cr_2O_3$-$M1O_2$, $Ga_2O_3$-$M1O_2$, $SiO_2$—$Cr_2O_3$-$M1O_2$ or $SiO_2$—$Ga_2O_3$-$M1O_2$ contain 20 mol % or more of $Cr_2O_3$ or $Ga_2O_3$, which is more than the content in the first interface layer 103.

The second interface layer 105 preferably has a film thickness within the range of 0.5-15 nm and more preferably within the range of 1-7 nm similarly to the first interface layer 103.

The second dielectric layer 106 can be made of a material in the same line as the first dielectric layer 102. Among them, a material containing C, Si, Sn and O is particularly preferable for the second dielectric layer 106. Among them, a material for the second dielectric layer 106 containing a compound is preferable, in which Sn and O form $SnO_2$, and Si and C form SiC. The material containing $SnO_2$—SiC that is a mixture of $SnO_2$ and SiC has low thermal conductivity and does not contain S, so it is a superior material for the second dielectric layer 106 and can also be used for the first dielectric layer 102. Note that when the composition of the second dielectric layer 106 is represented by a composition formula $C_dSi_eSn_fO_{100-d-e-f}$ (atom %), d, e and f are preferably within the range of 0<d<25, 0<e<25, 15<f<40, more preferably within the range of 1<d<12, 1<e<12, 26<f<33, respectively. In addition, when the composition of the second dielectric layer 106 is represented by a composition formula $(SnO_2)_{100-x}(SiC)_x$ (mol %), x is preferably within the range of 0<x≦50 and more preferably within the range of 5≦x≦30. Note that the second dielectric layer 106 can further contain at least one of elements of the group consisting of Ti, Zr, Hf, Y, Zn, Nb, Ta, Al, Bi, Cr, Ga, Ge and La. In this case, it is preferable the element is contained in a manner forming a compound such as $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Si—N, Ge—N, Cr—N or $LaF_3$.

The second dielectric layer 106 preferably has a film thickness within the range of 2-75 nm and more preferably within the range of 2-40 nm. By selecting the film thickness of the second dielectric layer 106 in this range, heat that is generated in the recording layer 104 can be diffused effectively to the reflecting layer 108 side.

The recording layer 104 is made of a material that causes the phase change between the crystalline phase and the amorphous phase when being irradiated with the laser beam 11. The recording layer 104 can be formed using a material containing Ge, Te and M2 (the element M2 is preferably at least one element of Sb and Bi) that causes reversible phase change. More specifically, the recording layer 104 can be made of a material that is represented by a composition formula $Ge_aM2_bTe_{3+a}$. A value of "a" preferably satisfies the relationship $0<a\leq60$ and more preferably satisfies the relationship $4\leq a\leq40$. In particular, the value of "a" is selected so that the amorphous phase is stable, the record conservation property is good at a low transfer rate, there are little increase of the melting point and little drop of the crystallization speed, and the rewriting conservation property is good at a high transfer rate. In addition, the value of "b" preferably satisfies the relationship $1.5\leq b\leq7$ and more preferably satisfies the relationship $2\leq b\leq4$. In particular, the value of "b" is selected so that the amorphous phase is stable amorphous phase and there is little drop of the crystallization speed.

In addition, the recording layer 104 can be made of a material represented by a composition formula $(Ge-M3)_aM2_bTe_{3+a}$ (the element M3 is preferably at least one of elements of the group consisting Sn and Pb) that causes a reversible phase change. When this material is used, the element M3 that substitutes Ge improves crystallization ability so that a sufficient erasing ratio can be obtained even if the recording layer 104 is thin. The element M3 is preferably Sn because it has little toxicity. When this material is used for element M3, it is also preferable the following relationships are satisfied: $0<a\leq60$ (more preferably $4\leq a\leq40$) and $1.5\leq b\leq7$ (more preferably $2\leq b\leq4$).

In addition, the recording layer 104 can also be made of a material containing Sb and the element M4 for example (term M4 is at least one of elements of the group consisting of V, Mn, Ga, Ge, Se, Ag, In, Sn, Te, Pb, Bi, Tb, Dy and Au) that causes the reversible phase change. More specifically, the recording layer 104 can be made of a material represented by a composition formula of $Sb_zM4_{100-z}$ (atom %). If the value of "z" satisfies the relationship $50\leq z\leq95$, then a difference between a reflectance of the information recording medium 15 when the recording layer 104 is in the crystalline phase and the reflectance when it is in the amorphous phase can be increased, so that good recording and reproducing characteristics can be obtained. If the relationship $75\leq z\leq95$ is satisfied, then the crystallization speed is particularly fast, and good rewriting performance is obtained at a high transfer rate. In addition, if the relationship $50\leq z\leq75$ is satisfied, then the amorphous phase is particularly stable, and good recording performance is obtained at a low transfer rate.

The recording layer 104 preferably has a film thickness within a range of 6-15 nm so that recording sensitivity of the information layer 16 is increased. Even in this range, if the recording layer 104 is thick, then thermal influence to neighboring areas increases due to diffusion of heat in the direction along the surface. In addition, if the recording layer 104 is thin, then the reflectance of the information layer 16 decreases. Therefore, it is more preferable that the film thickness of the recording layer 104 be within the range of 8-13 nm.

In addition, the recording layer 104 can also be made of a material that is represented by Te—Pd—O and that causes an irreversible phase change. In this case, it is preferable that the film thickness of the recording layer 104 be within the range of 10-40 nm.

The reflecting layer 108 has an optical function of increasing quantity of light that is absorbed by the recording layer 104. In addition, the reflecting layer 108 also has a thermal function of diffusing heat quickly that is generated in the recording layer 104, so that the recording layer 104 can become in the amorphous state easily. Furthermore, the reflecting layer 108 also has a function of protecting the multi-layered film from environment of the use.

The reflecting layer 108 can be made of a material of a single metal such as Ag, Au, Cu and Al, which has a high thermal conductivity. In addition, it can be made of a material of an alloy such as Al—Cr, Al—Ti, Al—Ni, Al—Cu, Au—Pd, Au—Cr, Ag—Pd, Ag—Pd—Cu, Ag—Pd—Ti, Ag—Ru—Au, Ag—Cu—Ni, Ag—Zn—Al, Ag—Nd—Au, Ag—Nd—Cu, Ag—Bi or Cu—Si. Particularly, an Ag alloy is suitable as a material of the reflecting layer 108 for its high thermal conductivity. It is preferable that the reflecting layer 108 has a film thickness of more than or equal to 30 nm so that sufficient thermal diffusion function can be obtained. In this range too, if the reflecting layer 108 is thicker than 200 nm, then the thermal diffusion function becomes so large that the recording sensitivity of the information layer 16 is decreased. Therefore, it is more preferable that the film thickness of the reflecting layer 108 be within the range of 30-200 nm.

It is possible to dispose an interface layer 107 between the reflecting layer 108 and the second dielectric layer 106. In this case, the interface layer 107 can be made of a material having lower thermal conductivity than the material for the reflecting layer 108 mentioned above. If an Ag alloy is used for the reflecting layer 108, then Al or an Al alloy can be used for the interface layer 107. In addition, the interface layer 107 can be made of an element such as Cr, Ni, Si or C, or an oxide such as $TiO_2$, $ZrO_2$, $HfO_2$, ZnO, $Nb_2O_5$, $Ta_2O_5$, $SiO_2$, $SnO_2$, $Al_2O_3$, $Bi_2O_3$, $Cr_2O_3$, $Ga_2O_3$. In addition, a nitride such as C—N, Ti—N, Zr—N, Nb—N, Ta—N, Si—N, Ge—N, Cr—N, Al—N, Ge—Si—N or Ge—Cr—N can also be used. In addition, a sulfide such as ZnS, a carbide such as SiC, or a fluoride such as $LaF_3$, and C can also be used. In addition, a mixture of the above-mentioned materials can also be used. In addition, the film thickness is preferably within the range of 3-100 nm (more preferably within the range of 10-50 nm).

Concerning the information layer 16, it is preferable that the reflectance $R_c(\%)$ when the recording layer 104 is in the crystalline phase and the reflectance $R_a(\%)$ when the recording layer 104 is in the amorphous phase satisfy the relationship $R_a<R_c$. Thus, the reflectance is high in the initial state where information is not recorded, so that recording and reproducing operations can be performed stably. In addition, it is preferable that $R_c$ and $R_a$ satisfy the relationships $0.2\leq R_a\leq10$ and $12\leq R_c\leq40$. It is more preferable that $R_c$ and $R_a$ satisfy the relationships $0.2\leq R_a\leq5$ and $12\leq R_c\leq30$, so that the reflectance difference $(R_c-R_a)$ increases and good recording and reproducing characteristics are obtained.

The information recording medium 15 can be produced by the method described below.

First, the information layer 16 is deposited on the substrate 14 (whose thickness is 1.1 mm, for example). The information layer includes a single layered film or a multi-layered film. The layers can be formed by sputtering the sputtering targets to be materials one by one in a deposition device.

More specifically, the reflecting layer 108 is deposited first on the substrate 14. The reflecting layer 108 can be formed by sputtering a sputtering target consisting of a metal or an alloy that constitutes the reflecting layer 108 in an atmosphere of Ar gas or in an atmosphere of a mixed gas of Ar gas and a reactive gas (at least one gas selected from the group consisting of oxygen gas and nitrogen gas).

Then, the interface layer 107 is deposited on the reflecting layer 108, if necessary. The interface layer 107 can be formed by sputtering a sputtering target consisting of an element or a compound that constitutes the interface layer 107 in an atmosphere of Ar gas or in an atmosphere of a mixed gas of Ar gas and a reactive gas.

Then, the second dielectric layer 106 is deposited on the reflecting layer 108 or the interface layer 107. The second dielectric layer 106 can be formed by sputtering a sputtering target (for example, $SnO_2$—SiC) consisting of a compound that constitutes the second dielectric layer 106 in an atmosphere of Ar gas or in an atmosphere of a mixed gas of Ar gas and a reactive gas. In addition, the second dielectric layer 106 can also be formed by reactively sputtering a sputtering target consisting of a metal that constitutes the second dielectric layer 106 in an atmosphere of a mixed gas of Ar gas and a reactive gas. Note that when the second dielectric layer 106 is deposited, the sputtering target is represented by a composition formula $C_g Si_h Sn_i O_{1-g-h-i}$ atom %) where terms g, h and i preferably satisfy the relationships 0<g<30, 0<h<30 and 15<i<40 and more preferably satisfy the relationships 1<g<17, 1<h<17 and 26<i<33, respectively. In addition, when the second dielectric layer 106 is deposited, the sputtering target is represented by a composition formula $(SnO_2)_{100-y}(SiC)_y$ (mol %) where term y preferably satisfies the relationship 0<y≦55 and more preferably satisfies the relationship 5≦y≦35.

Then, the second interface layer 105 is deposited on the reflecting layer 108, the interface layer 107 or the second dielectric layer 106, if necessary. The second interface layer 105 can be formed by the same method as the second dielectric layer 106.

Then, the recording layer 104 is deposited on the second dielectric layer 106 or the second interface layer 105. The recording layer 104 can be formed by sputtering a sputtering target consisting of a Ge—Te-M2 alloy, a sputtering target consisting of a Ge-M3-Te-M2 alloy, a sputtering target consisting of a Sb-M4 alloy, or a sputtering target consisting of a Te—Pd alloy in accordance with its composition by using one power source.

As the atmosphere gas for sputtering, a mixed gas of Ar gas, Kr gas, Ar gas and a reactive gas, or a mixed gas of Kr gas and a reactive gas can be used. In addition, the recording layer 104 can also be formed by sputtering plural sputtering targets of Ge, Te, M2, M3, Sb, M4 and Pd simultaneously using plural power sources. In addition, the recording layer 104 can also be formed by sputtering a binary sputtering target or a ternary sputtering target in which some elements of Ge, Te, M2, M3, Sb, M4 and Pd are combined, simultaneously using plural power sources. In these cases too, the sputtering is performed in an Ar gas atmosphere, a Kr gas atmosphere, an atmosphere of a mixed gas of Ar gas and a reactive gas, or an atmosphere of a mixed gas of Kr gas and a reactive gas.

Then, the first interface layer 103 is deposited on the recording layer 104, if necessary. The first interface layer 103 can be formed by the same method as the second dielectric layer 106.

Then, the first dielectric layer 102 is deposited on the recording layer 104 or the first interface layer 103. The first dielectric layer 102 can be formed by the same method as the second dielectric layer 106.

Finally, the transparent layer 13 is formed on the first dielectric layer 102. The transparent layer 13 can be formed by applying a photo-curing resin (especially an ultraviolet curing resin) or a delayed action resin on the first dielectric layer 102 as spin coating and by curing the resin. In addition, a transparent disk-like substrate made of a resin such as polycarbonate, amorphous polyolefin or PMMA, or a glass can be used as the transparent layer 13. In this case, the transparent layer 13 can be formed by applying a resin such as a photo-curing resin (especially an ultraviolet curing resin) or a delayed action resin on the first dielectric layer 102, bringing the substrate into intimate contact with the first dielectric layer 102 for spin coating, and then curing the resin. In addition, it is possible to apply an adherent resin on the substrate uniformly in advance and then to bringing it into intimate contact with the first dielectric layer 102.

Note that an initialization process can be performed for crystallizing the entire surface of the recording layer 104 after the first dielectric layer 102 is deposited, or after the transparent layer 13 is formed, if necessary. The crystallization of the recording layer 104 can be performed by applying a laser beam.

The information recording medium 15 can be produced as described above. Although the sputtering method is used for depositing a film of each layer in this embodiment, it will be apparent from this disclosure that other methods can be used. For example, a vacuum evaporation method, an ion plating method, a CVD method, an MBE method or the like can be used.

Embodiment 2

Figure 2:
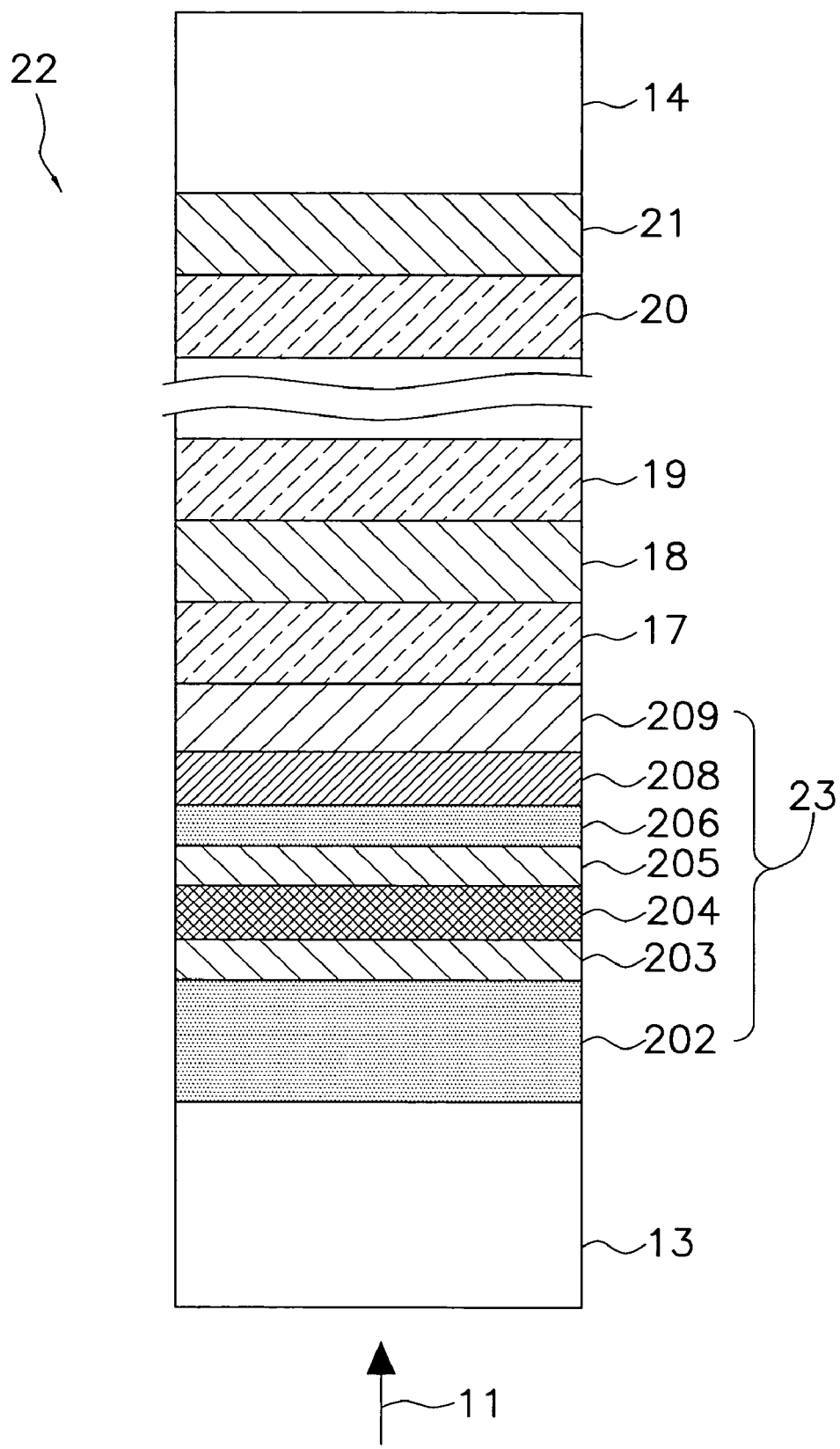
FIG. 2 is a partial cross sectional view of an information recording medium showing an example of a layer structure of the information recording medium having an N-layered information layer according to another embodiment of the present invention.

As a second embodiment, an example of an optical information recording medium 22 of the present invention will now be described according to the second embodiment. A partial cross sectional view of the information recording medium 22 is shown in FIG. 2. The optical information recording medium 22 is an optical information recording medium with a multi-layer structure that includes a plurality of information layers, and enables recording and/or reproducing information by applying the laser beam 11 from one side. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity. Thus, unless otherwise specified the descriptions of the parts of the first embodiment applies to the parts of the second embodiment.

The information recording medium 22 includes the transparent layer 13 and the substrate 14 with a plurality of information layers disposed between the transparent layer 13 and the substrate 14. The information layers includes N sets (N is a natural number that satisfies the relationship N≧2) of information layers with only information layers 18, 21 and 23 being shown. The first information layer 23 is formed on the transparent layer 13, while the information layer 21 is formed on the substrate 14. Each adjacent pair of the information layers adjacent to each other are laminated through an optical separation layer (only optical separation layers 17, 19 and 20 are shown). Here, preferably all of the information layers except for the information layer 21 are transparent information layers. In other words, the second information layer 18, the first information layer 23 (with sub-layers), and the information layers of up to (N−1)th set counted from the incident side of the laser beam 11 are transparent information layers. This is because it is necessary to allow laser beams to reach the N-th information layer 21. The information layer 21 is the N-th information layer counted from the incident side of the laser beam 11, and thus, the information layer 21 can be hereinafter referred to as "the N-th information layer". The substrate 14 and the transparent layer 13 can be made of the same material as that described in the first embodiment. In addition, their shapes and functions are also the same as the shapes and the functions described in the first embodiment.

The optical separation layers 17, 19, 20 and other optical separation layers are made of a resin such as a photo-curing resin (especially an ultraviolet curing resin) or a delayed action resin, a dielectric or the like. It is preferable that light absorption of each of them is small to the laser beam 11 that is used, and that optical double refraction is small in the short wavelength range.

The optical separation layers 17, 19, 20 and other optical separation layers are provided for discriminating focal positions of the layers 18, 21, 23 and the other informational layers (not shown) of the information recording medium 22. The optical separation layers 17, 19, 20 and other optical separation layers are required to have a thickness more than or equal to a focal depth $\Delta Z$ that is determined by a numerical aperture NA of an objective lens and the wavelength $\lambda$ of the laser beam 11. The value of $\Delta Z$ can be obtained by the approximate equation $\Delta Z=\lambda/\{2(NA)^2\}$ supposing that a reference of intensity at a focal point is 80% of a stigmatic case. If $\lambda$ equal 405 nm and NA equal 0.85, $\Delta Z$ is determined to be 0.280 µm. The range from −0.3 µm to +0.3 µm is within the focal depth. In this case, therefore, the optical separation layers 17, 19, 20 and other optical separation layers are required to have a thickness of 0.6 µm or more. It is desirable that a distance between the first information layer 23 and each of the other information layers 18, 21, etc. is set to a value in a range that enables collection of the laser beam 11 using the objective lens. Therefore, it is preferable that a total sum of the thickness values of the optical separation layers 17, 19, 20 and other optical separation layers be within a tolerance that the objective lens can permit (less than or equal to 50 µm, for example).

It is possible that a guide groove for leading the laser beam if formed on the surface of the incident side of the laser beam 11 on the optical separation layers 17, 19, 20 and other optical separation layers, if necessary.

In this case, information can be recorded and/or reproduced on the k-th information layer (K is a natural number that satisfies the relationship $1<K\leq N$) by the laser beam 11 that is applied from one side and passes the first through (K−1)th information layers.

Note that any of the first information layer through the N-th information layer can be a read only type (ROM) information layer or a write once type (WO) information layer.

Hereinafter, a structure of the first information layer 23 will be described in detail.

The first information layer 23 includes a third dielectric layer 202, a third interface layer 203, a first recording layer 204, a fourth interface layer 205, a first reflecting layer 208 and a transmittance adjusting layer 209 that are arranged in this order from the incident side of the laser beam 11.

The third dielectric layer 202 can be made of the same material as the first dielectric layer 102 in the first embodiment. In addition, functions of them are the same as the first dielectric layer 102 in the first embodiment.

A film thickness of the third dielectric layer 202 can be determined precisely by calculation in accordance with the matrix method so that quantity of reflected light changes substantially between the case where the recording layer 204 is in the crystalline phase and the case where it is in the amorphous phase, and that the first recording layer 204 absorbs light largely, and that the first information layer 23 has large transmittance.

The third interface layer 203 can be made of the same material as the first interface layer 103 in the first embodiment. In addition, functions and shapes of them are the same as the first interface layer 103 in the first embodiment.

The fourth interface layer 205 has a function of adjusting an optical distance so as to enhance the light absorption efficiency of the first recording layer 204 and a function of increasing a difference of the reflected light quantity between before and after recording so as to enlarge the signal intensity. The fourth interface layer 205 can be made of a material in the same line as the second interface layer 105 in the first embodiment. In addition, the fourth interface layer 205 preferably has a film thickness within a range of 0.5-75 nm and more preferably within the range of 1-40 nm. By selecting the film thickness of the fourth interface layer 205 in the above range, heat generated in the first recording layer 204 can be diffused effectively to the side of the first reflecting layer 208.

Note that a fourth dielectric layer 206 can be disposed between the fourth interface layer 205 and the first reflecting layer 208. The fourth dielectric layer 206 can be made of a material in the same line as the second dielectric layer 106 in the first embodiment.

The first recording layer 204 is made of a material that causes the phase change between the crystalline phase and the amorphous phase when being irradiated with the laser beam 11. The first recording layer 204 can be made up of a material that causes a reversible phase change and contains Ge, Te or M2, for example. More specifically, the first recording layer 104 can be made of a material that can be represented by the composition formula $Ge_aM2_bTe_{3+a}$. It is preferable that the relationship $0<a\leq 60$ is satisfied, and it is more preferable that the relationship $4\leq a\leq 40$ is satisfied, so that the amorphous phase is stable, the record conservation property at a low transfer rate is good, increase of the melting point is little, drop of the crystallization speed is little and rewriting conservation property at a high transfer rate is good. In addition, it is more preferable that the relationship $1.5\leq b\leq 7$ is satisfied, and it is more preferable that the relationship $2\leq b\leq 4$ is satisfied, so that the amorphous phase is stable, and the drop of the crystallization speed is little.

In addition, the first recording layer 204 can be made of a material that is represented by a composition formula $(Ge-M3)_aM2_bTe_{3+a}$ and causes a reversible phase change. When this material is used, the element M3 that substitutes Ge improves the crystallization ability so that a sufficient erasing ratio is obtained even if the first recording layer 204 is thin. As the element M3, Sn is more preferable for its little toxicity. When this material is used too, it is preferable to satisfy the relationships $0<a\leq 60$ (more preferably $4\leq a\leq 40$) and $1.5\leq b\leq 7$ (more preferably $2\leq b\leq 4$).

In order to ensure light quantity of laser necessary for recording and reproducing that reaches the information layer at the farther side than the first information layer 23 from the incident side of the laser beam 11, transmittance of the first information layer 23 is required to be high. For this reason, it is preferable that the first recording layer 204 has a film thickness of less than or equal to 9 nm, and it is more preferable that the film thickness is within the range of 2-8 nm.

In addition, the first recording layer 204 can also be made of a material that causes an irreversible phase change and is represented by compound Te—Pd—O. In this case, it is preferable that the first recording layer 204 has a film thickness of within a range of 5-30 nm.

The first reflecting layer 208 has an optical function of increasing quantity of light that is absorbed by the first recording layer 204. In addition, the first reflecting layer 208 also has a thermal function of diffusing quickly heat that is generated in the first recording layer 204 so that the first recording layer 204 becomes in the amorphous state easily. Furthermore, the first reflecting layer 208 also has a function of protecting the multi-layered film from an environment of use.

The first reflecting layer 208 can be made of the same material as the reflecting layer 108 in the first embodiment. In addition, functions of them are the same as the reflecting layer 108 in the first embodiment. Particularly, an Ag alloy is preferable as a material of the first reflecting layer 208 because it has a large thermal conductivity. The first reflecting layer 208 preferably has a film thickness within the range of 3-15 nm and is more preferable to be within the range of 8-12 nm so that transmittance of the first information layer 23 becomes as high as possible. When the film thickness of the first reflecting layer 208 is within this range, its thermal diffusion function is sufficient, and sufficient reflectance of the first information layer 23 is secured. Furthermore, sufficient transmittance of the first information layer 23 can be secured.

The transmittance adjusting layer 209 is made of a dielectric and has a function of adjusting the transmittance of the first information layer 23. This transmittance adjusting layer 209 enables to raise both the transmittance $T_c$(%) of the first information layer 23 when the first recording layer 204 is in the crystalline phase and the transmittance $T_a$(%) of the first information layer 23 when the first recording layer 204 is in the amorphous phase. More specifically, the transmittance of the first information layer 23 with the transmittance adjusting layer 209 is higher than that without the transmittance adjusting layer 209 by approximately 2-10%. In addition, the transmittance adjusting layer 209 also has an effect of diffusing heat that is generated in the first recording layer 204.

A refractivity n and an extinction coefficient k of the transmittance adjusting layer 209 are preferable to satisfy the relationships $2.0 \leq n$ and $k \leq 0.1$, and are more preferable to satisfy the relationships $2.4 \leq n \leq 3.0$ and $k \leq 0.05$, so as to enhance the action of increasing the transmittances $T_c$ and $T_a$ of the first information layer 23.

It is preferable that a film thickness l of the transmittance adjusting layer 209 satisfies the relationship $(1/32)\lambda/n \leq l \leq (3/16)\lambda/n$ or $(17/32)\lambda/n \leq l \leq (11/16)\lambda/n$, and it is more preferable to satisfy the relationship $(1/16)\lambda/n \leq l \leq (5/32)\lambda/n$ or $(9/16)\lambda/n \leq l \leq (21/32)\lambda/n$. Note that the above relationships are preferable to be 3 nm$\leq l \leq$40 nm or 60 nm$\leq l \leq$130 nm and are more preferable to be 7 nm$\leq l \leq$30 nm or 65 nm$\leq l \leq$120 nm by selecting the wavelength $\lambda$ of the laser beam 11 and the refractivity n of the transmittance adjusting layer 209 to satisfy the relationships 350 nm$\leq \lambda \leq$450 nm and $2.0 \leq n \leq 3.0$, for example. By selecting a value of l within this range, both the transmittances $T_c$ and $T_a$ of the first information layer 23 can be set to high values.

The transmittance adjusting layer 209 can be made of an oxide such as $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Sr—O or the like. In addition, it can also be made of a nitride such as Ti—N, Zr—N, Nb—N, Ta—N, Si—N, Ge—N, Cr—N, Al—N, Ge—Si—N, Ge—Cr—N or the like. In addition, it can also be made of a sulfide such as ZnS. In addition, it can also be made of a mixture of the above-mentioned materials. Among them, particularly $TiO_2$ and a material containing $TiO_2$ are preferable for the transmittance adjusting layer 209. These materials have a large refractivity (n=2.6-2.8) and a small extinction coefficient (k=0.0-0.05), so the action of increasing transmittance of the first information layer 23 is enhanced.

Transmittances $T_c$ and $T_a$ of the first information layer 23 are preferable to satisfy $40<T_c$ and $40<T_a$ and are more preferable to satisfy $46<T_c$ and $46<T_a$, so that sufficient quantity of laser necessary for recording and reproducing can reach the information layer that is farther than the first information layer 23 from the incident side of the laser beam 11.

Transmittances $T_c$ and $T_a$ of the first information layer 23 are preferable to satisfy $-5 \leq (T_c-T_a) \leq 5$ and are preferable to satisfy $-3 \leq (T_c-T_a) \leq 3$. When the values of $T_c$ and $T_a$ satisfy these conditions, influence of change of the transmittance depending on a state of the first recording layer 204 of the first information layer 23 becomes small upon recording and reproducing on the information layer that is farther than the first information layer 23 from the incident side of the laser beam 11, and good recording and reproducing characteristics can be obtained.

In the first information layer 23, it is preferable that a reflectance $R_{c1}$ (%) when the first recording layer 204 is in the crystalline phase and a reflectance $R_{a1}$ (%) when the first recording layer 204 is in the amorphous phase satisfy the relationship $R_{a1}<R_{c1}$. Thus, the reflectance become high in the initial state where no information is recorded, so that recording and reproducing operation can be performed stably. In addition, it is preferable that values of $R_{c1}$ and $R_{a1}$ satisfy $0.1 \leq R_{a1} \leq 5$ and $4 \leq R_{c1} \leq 15$, and it is more preferable that they satisfy $0.1 \leq R_{a1} \leq 3$ and $4 \leq R_{c1} \leq 10$ so that a reflectance difference $(R_{c1}-R_{a1})$ becomes large, thereby good recording and reproducing characteristics can be obtained.

The information recording medium 22 can be produced in the method described below.

First, (N−1) layers of the information layers are formed or laminated in order on the substrate 14 (having a thickness of 1.1 mm, for example) one by one with one of the optical separation layers separating adjacent pair of the information layers. The information layer consists of a single layered film or a multi-layered film, and the layers can be formed by sputtering the sputtering targets to be the materials one by one in the deposition device. In addition, the optical separation layers can be formed by applying a photo-curing resin (especially an ultraviolet curing resin) or a delayed action resin on the information layer, rotating the substrate 14 so as to extend the resin uniformly (spin coat), and curing the resin. Note that if the optical separation layer has a guide groove for the laser beam 11, the guide groove can be formed by bringing a substrate (a die) with the groove into intimate contact with the resin before being cured, rotating the substrate 14 and the top die for spin-coating, curing the resin, and then removing the substrate (the die).

In this way, the (N−1) layers of the information layers are formed on the substrate 14 together with the optical separation layers separating adjacent pair of the information layers. Then, the optical separation layer 17 further is formed on these information layers.

Next, the first information layer 23 is formed on the optical separation layer 17. More specifically, the substrate 14, on which (N−1) layers of the information layers are formed together with the optical separation layers, is placed in a film forming or deposition device, and then the transmittance adjusting layer 209 is deposited on the optical separation layer 17. The transmittance adjusting layer 209 can be formed by the same method as the second dielectric layer 106 in the first embodiment.

Then, the first reflecting layer 108 is deposited on the transmittance adjusting layer 209. The first reflecting layer 108 can be formed by the same method as the reflecting layer 108 in the first embodiment.

Then, the fourth dielectric layer 206 is deposited on the first reflecting layer 208, if necessary. The fourth dielectric layer 206 can be formed by the same method as the second dielectric layer 106 in the first embodiment.

Then, the fourth interface layer 205 is deposited on the first reflecting layer 208 or the fourth dielectric layer 206. The fourth interface layer 205 can be formed by the same method as the second dielectric layer 106 in the first embodiment.

Then, the first recording layer 204 is deposited on the fourth interface layer 205. The first recording layer 204 can be formed by using a sputtering target corresponding to the composition thereof and by the same method as the recording layer 104 in the first embodiment.

Then, the third interface layer 203 is deposited on the first recording layer 204. The third interface layer 203 can be formed by the same method as the second dielectric layer 106 in the first embodiment.

Then, the third dielectric layer 202 is deposited on the third interface layer 203. The third dielectric layer 202 can be formed by the same method as the second dielectric layer 106 in the first embodiment.

Finally, the transparent layer 13 is formed on the third dielectric layer 202. The transparent layer 13 can be formed by the method that is described in the first embodiment.

Note that the initialization process can be performed for crystallizing the entire surface of the first recording layer 204 after forming the third dielectric layer 202 or after forming the transparent layer 13, if necessary. The crystallization of the first recording layer 204 can be performed by applying the laser beam.

In this way, the information recording medium 22 can be manufactured. Note that although the sputtering method is used for forming films of layers in this embodiment, a vacuum evaporation method, an ion plating method, a CVD method, an MBE method or other methods can be used without limiting to the sputtering method.

Embodiment 3

Figure 3:
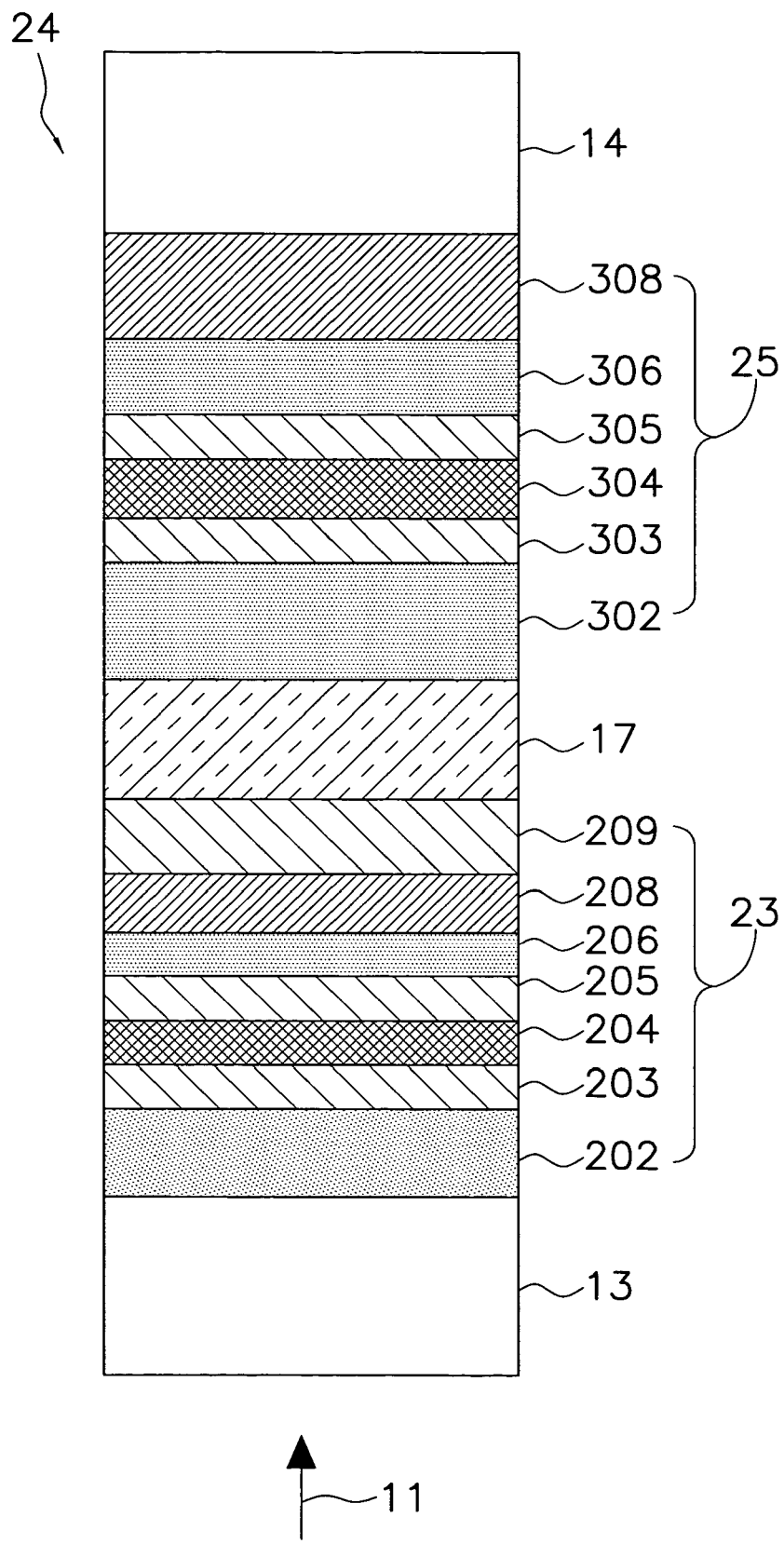
FIG. 3 is a partial cross sectional view of an information recording medium showing an example of a layer structure of the information recording medium having a double layered information layer according to the present invention.

As a third embodiment, an example of an optical information recording medium 24 will be described with reference to FIG. 3. The optical information recording medium 24 is an optical information recording medium with a multi-layer structure that includes a plurality of information layers, and enables recording and/or reproducing information by applying the laser beam 11 from one side. In view of the similarity between this embodiment and the prior embodiments, the parts of this embodiment that are identical to the parts of the prior embodiment will be given the same reference numerals as the parts of the prior embodiments. Moreover, the descriptions of the parts of this embodiment that are identical to the parts of the prior embodiments may be omitted for the sake of brevity. Thus, unless otherwise specified the descriptions of the parts of the prior embodiments apply to the parts of this embodiment. The optical information recording medium 24 includes two sets (N=2) of the multi-layered information layers of the second embodiment of the present invention. A partial cross sectional view of the information recording medium 24 according to the third embodiment is shown in FIG. 3. The information recording medium 24 is a double-layered optical information recording medium that can record and reproduce information by applying a laser beam 11 from a single side.

The information recording medium 24 includes the transparent layer 13 and the substrate 14 with a plurality of information layers disposed between the transparent layer 13 and the substrate 14. In particular, the information layers includes the first information layer 23 used in the second embodiment and a second information layer 25 with the optical separation layer 17 disposed between the first and second information layers 23 and 25. The substrate 14, the optical separation layer 17, the first information layer 23 and transparent layer 13 can be made of the same material as described in the first and the second embodiments. In addition, the shapes and the functions are also the same as the shapes and the functions described in the first and the second embodiments.

Hereinafter, a structure of the second information layer 25 will be described in detail.

The second information layer 25 includes a first dielectric layer 302, a first interface layer 303, a second recording layer 304, a second interface layer 305, a second dielectric layer 306 and a second reflecting layer 308 that are arranged in this order from the incident side of the laser beam 11. The second information layer 25 records and reproduces information by the laser beam 11 that passed the transparent layer 13, the first information layer 23 and the optical separation layer 17.

The first dielectric layer 302 can be made of the same material as the first dielectric layer 102 in the first embodiment. In addition, the functions of the first dielectric layer 302 are also the same as the first dielectric layer 102 in the first embodiment.

A film thickness of the first dielectric layer 302 can be determined precisely by calculation in accordance with a matrix method so that a condition that a difference of reflected light quantity between the case where the second recording layer 304 is in the crystalline phase and the case where it is in the amorphous phase becomes large can be satisfied.

The first interface layer 303 can be made of the same material as the first interface layer 103 in the first embodiment. In addition, the functions and shapes of the first interface layer 303 are also the same as the first interface layer 103 in the first embodiment.

The second interface layer 305 can be made of the same material as the second interface layer 105 in the first embodiment. In addition, the functions and shapes of the second interface layer 305 are also the same as the second interface layer 105 in the first embodiment.

The second dielectric layer 306 can be made of the same material as the second dielectric layer 106 in the first embodiment. In addition, the functions and shapes of the second dielectric layer 306 are also the same as the second dielectric layer 106 in the first embodiment.

The second recording layer 304 can be made of the same material as the recording layer 104 in the first embodiment. The second recording layer 304 preferably has a film thickness within the range of 6-15 nm so as to increase the recording sensitivity of the second information layer 25 if the material thereof is a material that causes a reversible phase change (for example, $Ge_aM2_bTe_{3+a}$). In this range too, thermal influence to a neighboring area due to diffusion of heat in the direction along the surface increase if the second recording layer 304 is thick. In addition, if the second recording layer 304 is thin, a reflectance of the second information layer 25 decreases. Therefore, it is more preferable that the second recording layer 304 has a film thickness within a range of 8-13 nm. In addition, if a material that causes an irreversible phase change (for example, Te—Pd—O) is used for the second recording layer 304, it is preferable that the second recording layer 304 has a film thickness within a range of 10-40 nm in the same manner as the first embodiment.

The second reflecting layer 308 can be made of the same material as the reflecting layer 108 in the first embodiment. In addition, the functions and the shapes of the second reflecting layer 308 are also the same as the reflecting layer 108 in the first embodiment.

It is possible to dispose an interface layer 307 between the second reflecting layer 308 and the second dielectric layer 306. The interface layer 307 can be made of the same material as the interface layer 107 in the first embodiment. In addition, the functions and the shapes of the interface layer 307 are also the same as the interface layer 107 in the first embodiment.

The information recording medium 24 can be manufactured by the method described below.

First, the second information layer 25 is formed. More specifically, the substrate 14 (having a thickness of 1.1 mm, for example) is prepared first and is placed in the deposition device.

Then, the second reflecting layer 308 is deposited on the substrate 14. On this occasion, if a guide groove for leading the laser beam 11 is formed on the substrate 14, the second reflecting layer 308 is deposited on the side where the guide groove is formed. The second reflecting layer 308 can be formed by the same method as the reflecting layer 108 in the first embodiment.

Then, the interface layer 307 is deposited on the second reflecting layer 308, if necessary. The interface layer 307 can be formed by the same method as the second dielectric layer 106 in the first embodiment.

Then, the second dielectric layer 306 is deposited on the second reflecting layer 308 or the interface layer 307. The second dielectric layer 306 can be formed by the same method as the second dielectric layer 106 in the first embodiment.

Then, second reflecting layer 308, the second interface layer 305 is deposited on the interface layer 307 or the second dielectric layer 306, if necessary. The second interface layer 305 can be formed by the same method as the second dielectric layer 106 in the first embodiment.

Then, the second recording layer 304 is deposited on the second dielectric layer 306 or the second interface layer 305. The second recording layer 304 can be formed by using a sputtering target corresponding to the composition thereof and by the same method as the recording layer 104 in the first embodiment.

Then, the first interface layer 303 is deposited on the second recording layer 304, if necessary. The first interface layer 303 can be formed by the same method as the second dielectric layer 106 in the first embodiment.

Then, the first dielectric layer 302 is deposited on the second recording layer 304 or the first interface layer 303. The first dielectric layer 302 can be formed by the same method as the second dielectric layer 106 in the first embodiment.

In this way, the second information layer 25 is formed.

Then, the optical separation layer 17 is formed on the first dielectric layer 302 of the second information layer 25. The optical separation layer 17 can be formed by applying a photo-curing resin (especially an ultraviolet curing resin) or a delayed action resin onto the first dielectric layer 302 for spin coating and by curing the resin. Note that if the optical separation layer 17 has a guide groove for the laser beam 11, a substrate (a die) on which the groove is formed is brought into intimate contact with the resin before being cured, and then the resin is cured. After that, the substrate (the die) is removed so that the guide groove can be formed.

Note that an initialization process can be performed for crystallizing the entire surface of the second recording layer 304 after forming the first dielectric layer 302 or after forming the optical separation layer 17, if necessary. The crystallization of the second recording layer 304 can be performed by applying the laser beam.

Then, the first information layer 23 is formed on the optical separation layer 17. More specifically, the transmittance adjusting layer 209, the first reflecting layer 208, the fourth interface layer 205, the first recording layer 204, the third interface layer 203 and the third dielectric layer 202 are deposited in this order on the optical separation layer 17 first. On this occasion, the fourth dielectric layer 206 can be formed between the first reflecting layer 208 and the fourth interface layer 205, if necessary. These layers can be formed by the method described in the second embodiment.

Finally, the transparent layer 13 is formed on the third dielectric layer 202. The transparent layer 13 can be formed by the method that is described in the first embodiment.

Note that an initialization process can be performed for crystallizing the entire surface of the first recording layer 204 after forming the third dielectric layer 202 or after forming the transparent layer 13, if necessary. The crystallization of the first recording layer 204 can be performed by applying the laser beam.

In addition, an initialization process can be performed for crystallizing the entire surface of the second recording layer 304 and the first recording layer 204 after forming the third dielectric layer 202 or after forming the transparent layer 13, if necessary. In this case, there is a tendency that a laser power necessary for crystallizing the second recording layer 304 increases if the crystallization of the first recording layer 204 is performed first. Therefore, it is preferable that crystallization of the second recording layer 304 is performed first.

In this way, the information recording medium 24 can be manufactured. Note that although the sputtering method is used for forming films of layers in this embodiment, a vacuum evaporation method, an ion plating method, a CVD method, an MBE method or other methods can be used without limiting to the sputtering method.

Embodiment 4

Figure 4:
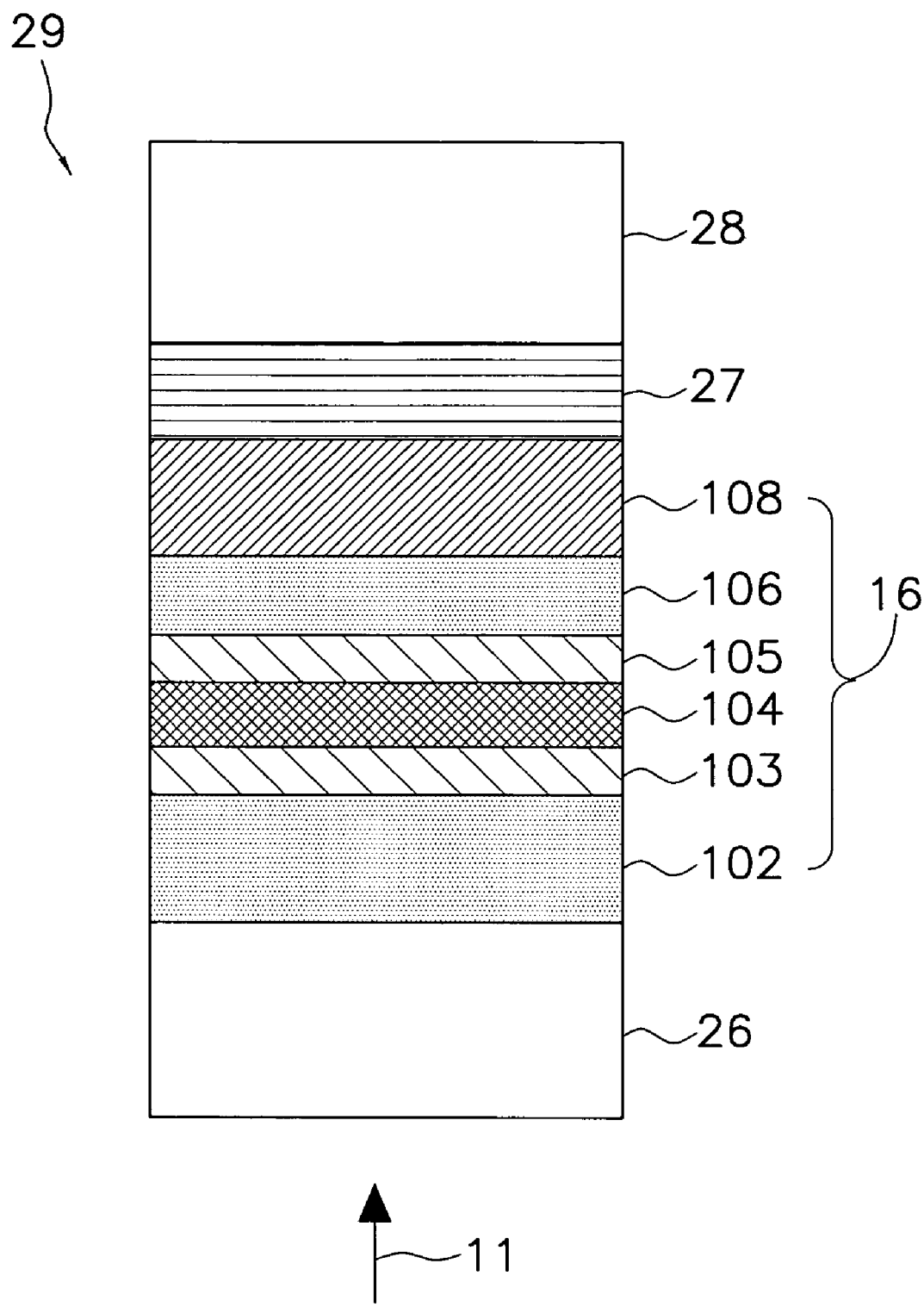
FIG. 4 is a partial cross sectional view of an information recording medium showing an example of a layer structure of the information recording medium having a single layered information layer according to another embodiment of the present invention.

As a fourth embodiment, an example of an optical information recording medium 29 according to the present invention will be described will now be described with reference to FIG. 4. A partial cross section view of the information recording medium 29 according to the fourth embodiment is shown in FIG. 4. The information recording medium 29 is an optical information recording medium that can record and reproduce information by applying a laser beam 11 in the same way as the information recording medium 15 in the first embodiment.

The information recording medium 29 has a structure in which the information layer 16 is formed on the substrate 26 and a dummy substrate 28 is glued onto the information layer 16 via an adhesive layer 27.

The substrate 26 and the dummy substrate 28 are transparent and have a disk-like shape. The substrate 26 and the dummy substrate 28 can be made of a resin such as a polycarbonate, an amorphous polyolefin, a PMMA or the like, or a glass, for example in the same manner as the substrate 14 in the first embodiment.

The surface of the substrate 26 on side that faces the first dielectric layer 102 can be provided with a guide groove for leading the laser beam, if necessary. It is preferable that the surface of the substrate 26 on the side opposite to the first dielectric layer 102 and the surface of the dummy substrate 28 on the side opposite to the adhesive layer 27 are smooth. As a material of the substrate 26 and the dummy substrate 28, a polycarbonate is particularly useful for its superior transferring property and productivity as well as a low cost. Note that thickness values of the substrate 26 and the dummy substrate 28 are preferable to be within the range of 0.3-0.9 mm so that sufficient intensity is secured and a thickness of the information recording medium 29 can be approximately 1.2 mm.

It is preferable that the adhesive layer 27 is made of a resin such as a photo-curing resin (especially an ultraviolet curing resin) or a delayed action resin, and it has little light absorption to the laser beam 11 that is used. It is also preferable that the adhesive layer 27 has a small optical double refraction in the short wavelength range. Note that it is preferable that a thickness of the adhesive layer 27 is within the range of 0.6-50 μm for the same reason as the optical separation layers 19, 17 and the others optical separation layers.

Descriptions about other portions that are denoted by the same reference numerals as the first embodiment are omitted.

The information recording medium 29 can be manufactured by the method described below.

First, the information layer 16 is formed on the substrate 26 (having a thickness of 0.6 mm for example). On this occasion, if a guide groove for leading the laser beam 11 is formed on the substrate 26, the information layer 16 is formed on the side where the guide groove is formed. More specifically, the substrate 26 is placed in the deposition device, and then the first dielectric layer 102, the first interface layer 103, the recording layer 104, the second interface layer 105, the second dielectric layer 106 and the reflecting layer 108 are deposited sequentially. Note that the interface layer 107 can be deposited between the second dielectric layer 106 and the reflecting layer 108, if necessary. The method for forming the layers is the same as the first embodiment.

Next, the substrate 26 on which the information layer 16 formed and the dummy substrate 28 (having a thickness of 0.6 mm, for example) are glued to each other via the adhesive layer 27. More specifically, a resin such as a photo-curing resin (especially an ultraviolet curing resin) or a delayed action resin is applied on the dummy substrate 28. The substrate 26 on which the information layer 16 is formed is brought into intimate contact with the dummy substrate 28 for spin coating, and then the resin is cured. In addition, it is possible to apply an adherent resin on the dummy substrate 28 uniformly in advance and bring it into intimate contact with the substrate 26 on which the information layer 16 is formed.

Note that an initialization process can be performed for crystallizing the entire surface of the recording layer 104 after bringing the substrate 26 into intimate contact with the dummy substrate 28, if necessary. The crystallization of the recording layer 104 can be performed by applying the laser beam.

In this way, the information recording medium 29 can be manufactured. Note that although the sputtering method is used for forming films of layers in this embodiment, a vacuum evaporation method, an ion plating method, a CVD method, an MBE method or other methods can be used without limiting to the sputtering method.

Embodiment 5

Figure 5:
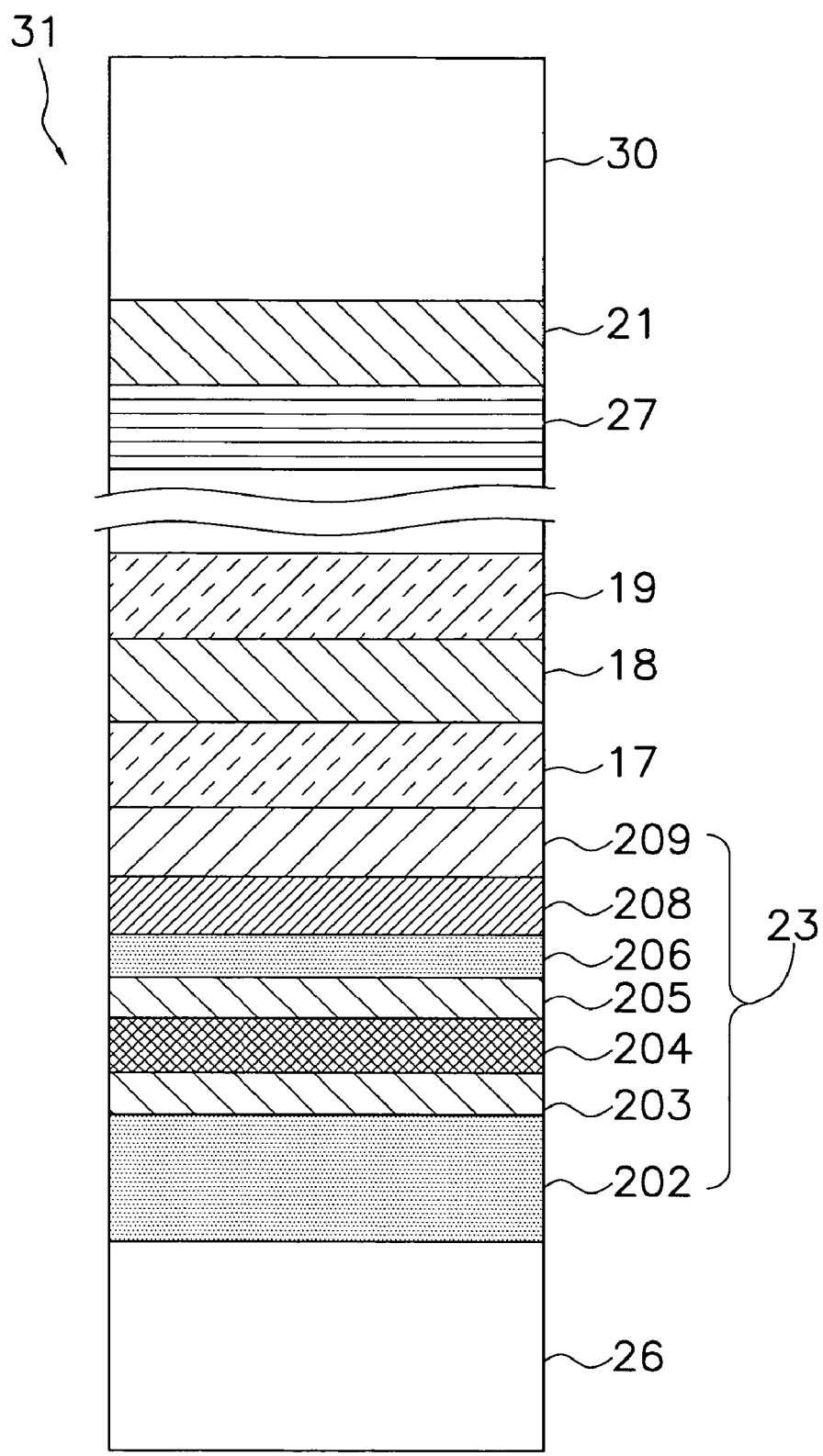
FIG. 5 is a partial cross sectional view of an information recording medium showing an example of a layer structure of the information recording medium having an N-layered information layer according to another embodiment of the present invention.

As a fifth embodiment, an example of an optical information recording medium 31 according to the present invention will be described with reference to FIG. 5. A partial cross section view of the information recording medium 31 according to the fifth embodiment is shown in FIG. 5. The information recording medium 31 is a multi-layered optical information recording medium that can record and reproduce information by applying a laser beam 11 from one side similarly to the information recording medium 22 in the second embodiment.

The information recording medium 31 has a structure in which N sets of first information layers 23 and the information layer 18 that are formed successively on the substrate 26 via the optical separation layers 17, 19 and other optical separation layers, and the information layer 21 formed on the substrate 30 are brought into intimate contact via the adhesive layer 27.

The substrate 30 is transparent and has a disk-like shape. The substrate 30 can be made of a resin such as a polycarbonate, an amorphous polyolefin, a PMMA or the like, or a glass, for example in the same manner as the substrate 14.

The surface of the substrate 30 on the information layer 21 side can be provided with a guide groove for leading the laser beam, if necessary. It is preferable that the surface of the substrate 30 on the side opposite to the information layer 21 is smooth. As a material of the substrate 30, a polycarbonate is particularly useful for its superior transferring property and productivity as well as a low cost. Note that it is preferable that a thickness of the substrate 30 is within the range of 0.3-0.9 mm so that sufficient intensity is secured and a thickness of the information recording medium 31 can be approximately 1.2 mm.

Furthermore, descriptions about other portions that are denoted by the same reference numerals as the second and fourth embodiments are omitted.

The information recording medium 31 can be manufactured by the method described below.

First, the first information layer 23 is formed on the substrate 26 (having a thickness of 0.6 mm for example). On this occasion, if a guide groove for leading the laser beam 11 is formed on the substrate 26, the first information layer 23 is formed on the side where the guide groove is formed. More specifically, the substrate 26 is placed in the deposition device, and then the third dielectric layer 202, the third interface layer 203, the first recording layer 204, the fourth interface layer 205, the first reflecting layer 208, the transmittance adjusting layer 209 are deposited successively. Note that the fourth dielectric layer 206 can be deposited between the fourth interface layer 205 and the first reflecting layer 208, if necessary. The method for forming the layers is the same as the second embodiment. After that, (N−2) layers of the information layers are deposited one by one via the optical separation layer.

In addition, the information layer 21 is formed on the substrate 30 (having a thickness of 0.6 mm, for example). The information layer consists of a single layered film or a multi-layered film, and the layers can be formed by sputtering the sputtering targets to be the materials one by one in the deposition device in the same manner as the second embodiment.

Finally, the substrate 26 on which the information layer is formed and the substrate 30 are glued to each other via the adhesive layer 27. More specifically, a resin such as a photo-curing resin (especially an ultraviolet curing resin) or a delayed action resin is applied on the information layer 21. The substrate 26 on which the first information layer 23 is formed is brought into intimate contact with the information layer 21 for spin coating, and then the resin is cured. In addition, it is possible to apply an adherent resin on the information layer 21 uniformly in advance and bring it into intimate contact with the substrate 26.

Note that an initialization process can be performed for crystallizing the entire surface of the first recording layer 204 after bringing the substrate 26 into intimate contact with the substrate 30, if necessary. The crystallization of the first recording layer 204 can be performed by applying the laser beam.

In this way, the information recording medium 31 can be manufactured. Note that although the sputtering method is used for forming films of layers in this embodiment, a vacuum evaporation method, an ion plating method, a CVD method, an MBE method or other methods can be used without limiting to the sputtering method.

Embodiment 6

Figure 6:
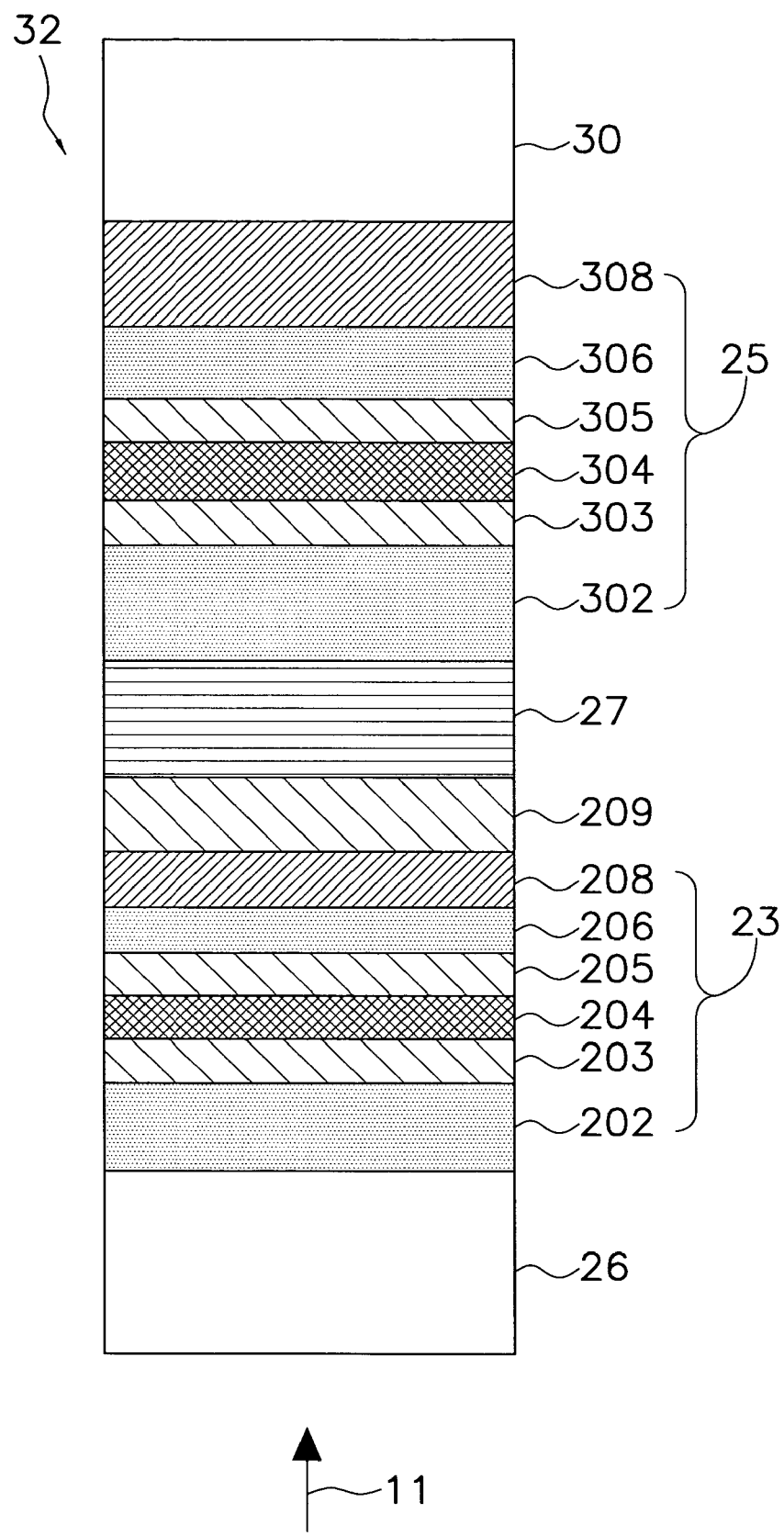
FIG. 6 is a partial cross sectional view of an information recording medium showing an example of a layer structure of the information recording medium having a double layered information layer according to another embodiment of the present invention.

As a sixth embodiment, an example of the information recording medium will be described, which includes two sets (N=2) of information layers in the multi-layered optical information recording medium in the fifth embodiment of the present invention. A partial cross sectional view of the information recording medium 32 according to sixth embodiment is shown in FIG. 6. The information recording medium 32 is a two-information-recording-layer medium information recording medium that can record and reproduce information by applying a laser beam 11 from a single side similarly to the information recording medium 24 in the third embodiment.

The information recording medium 32 has a structure in which the first information layer 23 is formed on the substrate 26, the second information layer 25 is formed on the substrate 30, and they are brought into intimate contact with each other via the adhesive layer 27.

A guide groove for leading the laser beam can be formed on the surface of the substrate 30 on the side close to the second reflecting layer 308, if necessary. It is preferable that the surface of the substrate 30 on the side opposite to the second reflecting layer 308 is smooth.

Furthermore, descriptions about other portions that are denoted by the same reference numerals as the third, the fourth and the fifth embodiments are omitted.

The information recording medium 32 can be manufactured by the method described below.

First, the first information layer 23 is formed on the substrate 26 (having a thickness of 0.6 mm for example) in the same method as the fifth embodiment.

Note that an initialization process can be performed for crystallizing the entire surface of the first recording layer 204 after forming the transmittance adjusting layer 209, if necessary. The crystallization of the first recording layer 204 can be performed by applying the laser beam.

In addition, the second information layer 25 is formed on the substrate 30 (having a thickness of 0.6 mm, for example). On this occasion, if a guide groove for leading the laser beam 11 is formed on the substrate 30, the second information layer 25 is formed on the side where the guide groove is formed. More specifically, the substrate 30 is placed in the deposition device, and then the second reflecting layer 308, the second dielectric layer 306, the second interface layer 305, the second recording layer 304, the first interface layer 303, the first dielectric layer 302 are deposited successively. Note that the interface layer 307 can be deposited between the second reflecting layer 308 and the second dielectric layer 306, if necessary. The method for forming the layers is the same as the third embodiment.

Note that an initialization process can be performed for crystallizing the entire surface of the second recording layer 304 after forming the first dielectric layer 302, if necessary. The crystallization of the second recording layer 304 can be performed by applying the laser beam.

Finally, the substrate 26 on which the first information layer 23 is formed and the substrate 30 on which the second information layer 25 is formed are glued to each other via the adhesive layer 27. More specifically, a resin such as a photo-curing resin (especially an ultraviolet curing resin) or a delayed action resin is applied on the first information layer 23 or the second information layer 25, the substrate 26 and the substrate 30 are brought into intimate contact with each other for spin coating, and then the resin is cured. In addition, it is possible to apply an adherent resin on the first information layer 23 or the second information layer 25 uniformly in advance and bring the substrate 26 into intimate contact with the substrate 30.

After that an initialization process can be performed for crystallizing the entire surface of the second recording layer 304 and the first recording layer 204, if necessary. In this case, it is preferable that the second recording layer 304 is crystallized first for the same reason as the third embodiment.

In this way, the information recording medium 32 can be manufactured. Note that although the sputtering method is used for forming films of layers in this embodiment, a vacuum evaporation method, an ion plating method, a CVD method, an MBE method or other methods can be used without limiting to the sputtering method.

Embodiment 7

As a seventh embodiment, a method for recording and reproducing information on the information recording medium described in the first through sixth embodiments of the present invention will be described.

Figure 7:
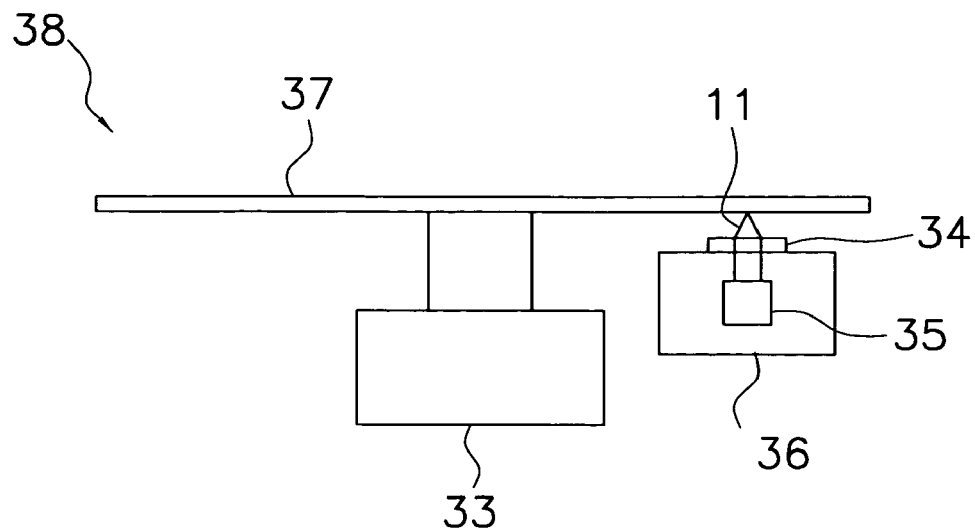
FIG. 7 is a simplified schematic illustration of a part of a structure of a recording and/or reproducing device that is used for recording and/or reproducing information on the information recording medium according to the present invention.

A structure of a part of a recording and reproducing device 38 that is used for the method of recording and reproducing information according to the present invention is shown schematically in FIG. 7. As shown in FIG. 7, the recording and reproducing device 38 includes a spindle motor 33 for rotating an information recording medium 37, a semiconductor laser 35 and an optical head 36 having an objective lens 34 for collecting the laser beam 11 emitted by the semiconductor laser 35. The information recording medium 37, which is described in the first through the sixth embodiments, includes a single (the information layer 16, for example), or a plurality of information layers (first information layer 23 and the second information layer 25, for example). The objective lens 34 collects the laser beam 11 on the information layer.

Recording, erasing and rewriting information on the information recording medium are performed by modulating a power of the laser beam 11 between a peak power ($P_p$ (mW)) that is a high power and a bias power ($P_b$ (mW)) that is a low power. When the laser beam 11 of the peak power is applied, the amorphous phase is formed at a portion of the recording layer, and the amorphous phase becomes a record mark. The laser beam 11 of the bias power is applied to a portion between the record marks so as to form the crystalline phase (an erased portion). Note that when the laser beam 11 of the peak power is applied, a pulse train is usually used, which is called a multipulse. Note that the multipulse can be modulated only between the peak power and the bias power or can be modulated within the range from the zero power to the peak power.

In addition, a reproducing power ($P_r$ (mW)) can have lower power level than the peak power or the bias power, does not affect an optical state of the record mark when the laser beam 11 is applied at the power level, and enables to obtain sufficient reflected light quantity necessary for reproducing a record mark from the information recording medium. Then, the laser beam 11 of the reproducing power is applied so as to obtain a signal from the information recording medium, and the signal is read by a detector so that the information signal can be reproduced.

It is preferable that a numerical aperture NA of the objective lens 34 is within the range of 0.5-1.1 (more preferably within the range of 0.6-0.9) so that a spot diameter of the laser beam is adjusted to a value within the range of 0.4-0.7 μm. It is preferable that a wavelength of the laser beam 11 is less than or equal to 450 nm (more preferably within the range of 350-450 nm). It is preferable that a line speed of the information recording medium when information is recorded is within the range of 1-20 m/second (more preferably within the range of 2-15 m/second) so that reproducing light hardly causes crystallization and sufficient erasing performance can be obtained.

When information is recorded on the first information layer 23 of the information recording medium 24 or the information recording medium 32 having two information layers, the laser beam 11 is focuses on the first recording layer 204, so that laser beam 11 that passes through the transparent layer 13 is used for recording information on the first recording layer 204. Reproduction is performed by using the laser beam 11 that is reflected by the first recording layer 204 and passes through the transparent layer 13. When information is recorded on the second information layer 25, the laser beam 11 is focuses on the second recording layer 304, the laser beam 11 that passes through the transparent layer 13, the first information layer 23 and the optical separation layer 17 is used for recording information. Reproduction is performed by using the laser beam 11 that is reflected by the second recording layer 304 and passes the optical separation layer 17, the first information layer 23 and the transparent layer 13.

Note that if a guide groove for leading the laser beam 11 is formed on the substrate 14 and the optical separation layers 20, 19 and 17, information can be recorded in grooves that are close to the incident side of the laser beam 11 or in lands that is far from the same. In addition, it is possible to record information in both grooves and lands.

The recording performance was evaluated by modulating the power of the laser beam 11 within the range of 0-$P_p$ (mW), recording random signals having mark lengths of 0.149 μm (2T) to 0.596 μm (8T) by (1-7) modulation method, and measuring jitters of leading edges and trailing edges of the record marks (errors of mark positions) by a time interval analyzer. Note that smaller a value of the jitter is, the better the recording performance is. Note that the values of $P_p$ and $P_b$ are determined so that an average value of jitters of leading edges and trailing edges (an average jitter) becomes the minimum. An optimal $P_p$ on this occasion is determined as the recording sensitivity.

In addition, the signal intensity was evaluated by modulating the power of the laser beam 11 within the range of 0-$P_p$ (mW), recording signals having mark lengths of 0.149 μm (2T) and 0.671 μm (9T) in the same groove ten times alternately and successively, and finally overwriting a 2T signal and measuring a ratio (CNR: Carrier to Noise Ratio) of a signal amplitude (a carrier level) to a noise amplitude (a noise level) at a frequency of the 2T signal by a spectrum analyzer. Note that the larger the CNR is, the signal intensity is larger.

Furthermore, a repeated rewriting number of times was evaluated by modulating the power of the laser beam 11 within the range of 0-$P_p$ (mW), recording random signals having mark lengths of 0.149 μm (2T) to 0.596 μm (8T) in the same groove successively, and measuring jitters of leading edges and trailing edges at each number of recording times by a time interval analyzer. The number of rewriting times that increases the average jitter value of the leading edges and the trailing edges by 3% from the first time is set as the maximum value. Note that the values of $P_p$ and $P_b$ are determined so that the average jitter value becomes the minimum.

Embodiment 8

Figure 8:
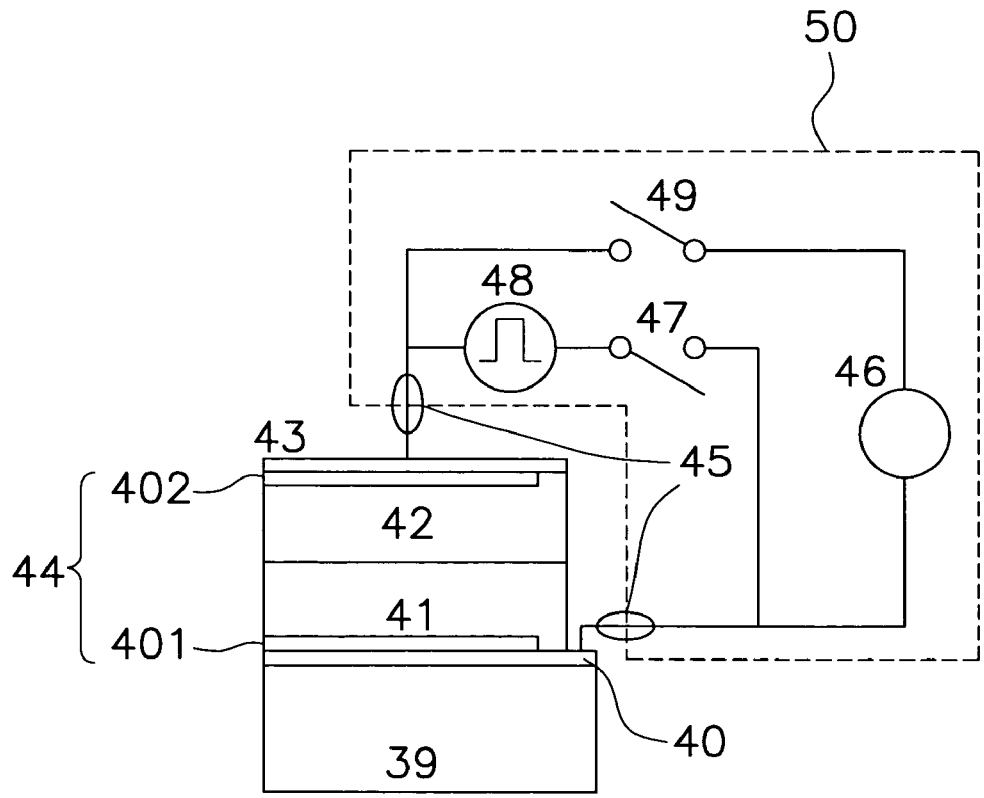
FIG. 8 is a simplified schematic illustration of a part of a structure of an information recording medium and an electrical information recording and/or reproducing device according to the present invention.

As an eighth embodiment, an example of the information recording medium according to the present invention will be described. An example of a structure of an electrical information recording medium 44 and a recording and reproducing device 50 according to the eighth embodiment are shown in FIG. 8. The electrical information recording medium 44 can record and reproduce information by applying electric energy (especially electric current).

As a material of the substrate 39, a resin substrate such as a polycarbonate, a glass substrate, a ceramic substrate such as $Al_2O_3$, various types of semiconductor substrates such as Si, various types of metal substrates such as Cu can be used. Here, the case where a Si substrate is used will be described. The electrical information recording medium 44 has a structure in which a lower electrode 40, a first dielectric layer 401, a first recording layer 41, a second recording layer 42, a second dielectric layer 402 and an upper electrode 43 are deposited in this order on the substrate 39. The lower electrode 40 and the upper electrode 43 are formed for applying electric current to the first recording layer 41 and the second recording layer 42. Note that the first dielectric layer 401 adjusts quantity of electric energy that is applied to the first recording layer 41, while the second dielectric layer 402 is provided for adjusting quantity of electric energy that is applied to the second recording layer 42.

The first dielectric layer 401 and the second dielectric layer 402 can be made of the same material as the second dielectric layer 106 in the first embodiment.

The first recording layer 41 and the second recording layer 42 are made of a material that causes a reversible phase change between the crystalline phase and the amorphous phase by Joule heat generated when electric current is applied, and a phenomenon that a specific resistance changes between the crystalline phase and the amorphous phase is utilized for recording information. The first recording layer 41 is made of the same material as the first recording layer 204 in the second embodiment, and the second recording layer 42 is made of the same material as the second recording layer 304 in the third embodiment.

The first recording layer 41 and the second recording layer 42 can be formed by the same method as the first recording layer 204 in the second embodiment and the second recording layer 304 in the third embodiment, respectively.

In addition, the lower electrode 40 and the upper electrode 43 can be made of an alloy material containing a single metal material such as Al, Au, Ag, Cu, Pt, or the like, or one or plural elements among them as a main component, and one or more other elements added for improving humidity resistance or adjusting thermal conductivity. The lower electrode 40 and the upper electrode 43 can be formed by sputtering a metal parent material or an alloy parent material to be the material in an Ar gas atmosphere. Note that a vacuum evaporation method, an ion plating method, a CVD method, an MBE method or the like can be used for forming films of the layers.

Figure 11:
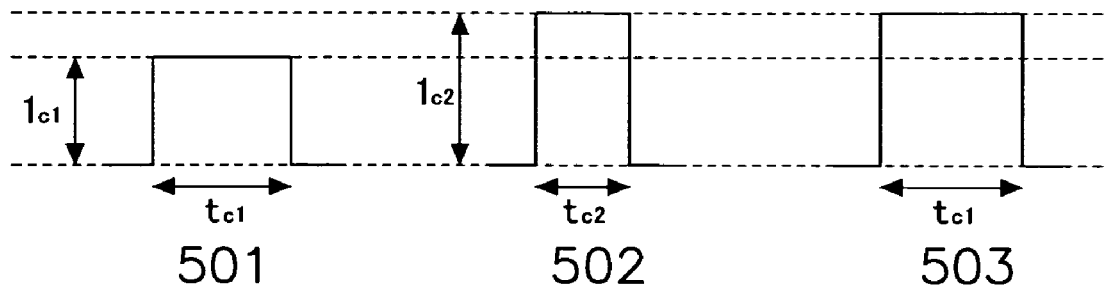
FIG. 11 shows an example of recording and erasing pulse waveforms of an electrical information recording medium according to another embodiment of the present invention.
Figure 11:
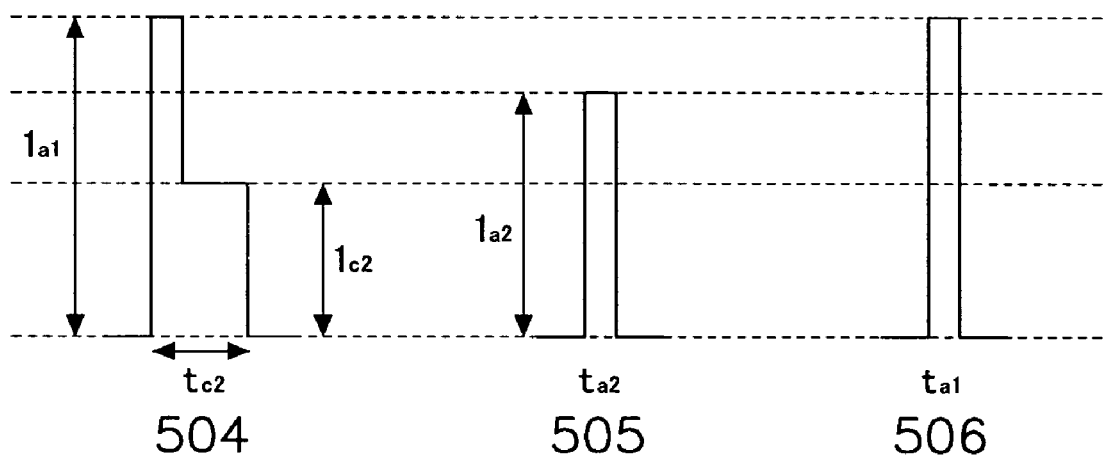
Figure 11:
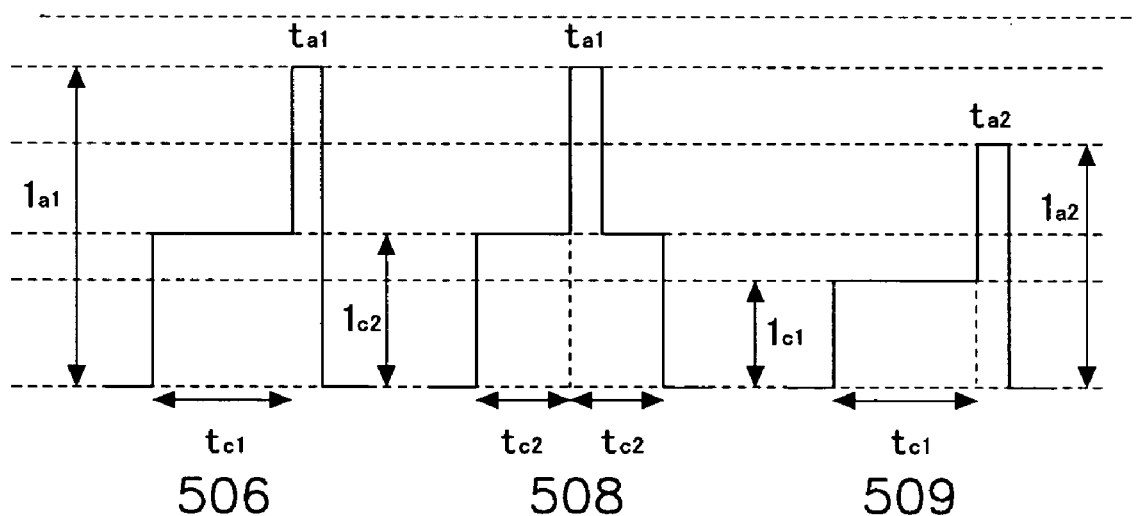

As shown in FIG. 8, the electrical information recording and reproducing device 50 is connected electrically to the electrical information recording medium 44 via an application portion 45. Using this electrical information recording and reproducing device 50, a pulse power source 48 is connected via a switch 47 across the lower electrode 40 and the upper electrode 43 for applying a current pulse to the first recording layer 41 and the second recording layer 42. In addition, a resistance measuring device 46 is connected via a switch 49 across the lower electrode 40 and the upper electrode 43 for detecting a change in resistance due to the phase change of the first recording layer 41 and the second recording layer 42. In order to change the first recording layer 41 or the second recording layer 42 that is in the amorphous phase (a high resistance state) to the crystalline phase (a low resistance state), the switch 47 is closed (the switch 49 is opened) so as to apply the current pulse across the electrodes, thereby a temperature in the portion to which the current pulse is applied becomes higher than the crystallization temperature and lower than the melting point of the material, and lower temperature is maintained during the crystallization time. In order to change from the crystalline phase to the amorphous phase again, a current pulse that is relatively higher than a crystallizing current pulse for a shorter period, so that the recording layer becomes a temperature higher than the melting point to be melted, and then it is cooled rapidly. Note that the pulse power source 48 of the electrical information recording and reproducing device 50 is a power source that can deliver the recording and erasing pulse waveform as shown in FIG. 11.

Here, a resistance value when the first recording layer 41 is in the amorphous phase is represented by $r_{a1}$, a resistance value when the first recording layer 41 in the crystalline phase is represented by $r_{c1}$, a resistance value when the second recording layer 42 is in the amorphous phase is represented by $r_{a2}$, and a resistance value when the second recording layer 42 is in the crystalline phase is represented by $r_{c2}$. Then, if the relationship $r_{c1} \leq r_{c2} < r_{a1} < r_{a2}$, or $r_{c1} \leq r_{c2} < r_{a2} < r_{a1}$, or $r_{c2} \leq r_{c1} < r_{a1} < r_{a2}$, or $r_{c2} \leq r_{c1} < r_{a2} < r_{a1}$ is satisfied, then a sum of resistance values of the first recording layer 41 and the second recording layer 42 can be set to four different values $r_{a1}+r_{a2}$, $r_{a1}+r_{a2}$, $r_{a2}+r_{c1}$, and $r_{c1}+r_{c2}$. Therefore, when the resistance values between the electrodes are measured by the resistance measuring device 46, four different states, namely binary value information can be detected at one time.

Figure 9:
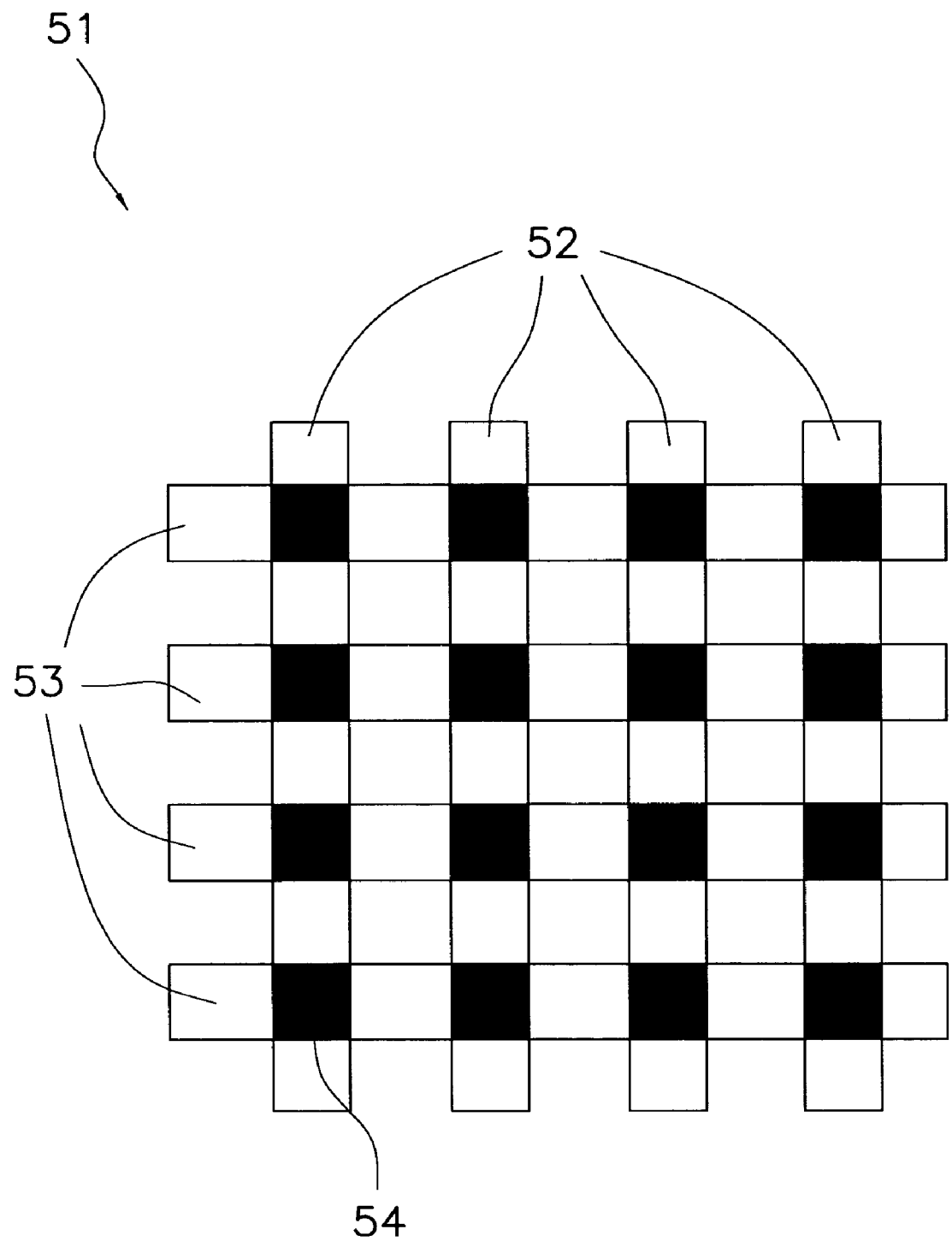
FIG. 9 is a simplified schematic illustration of a part of a structure of a large capacity electrical information recording medium according to the present invention.

By arranging a plurality of the electrical information recording medium 44 are arranged in a matrix, a large capacity electrical information recording medium 51 can be structured as shown in FIG. 9. Each of memory cells 54 is provided with a structure at a micro area in the same manner as the electrical information recording medium 44. Recording and reproducing information on each of the memory cells 54 is performed by designating one of word lines 52 and one of bit lines 53.

Figure 10:
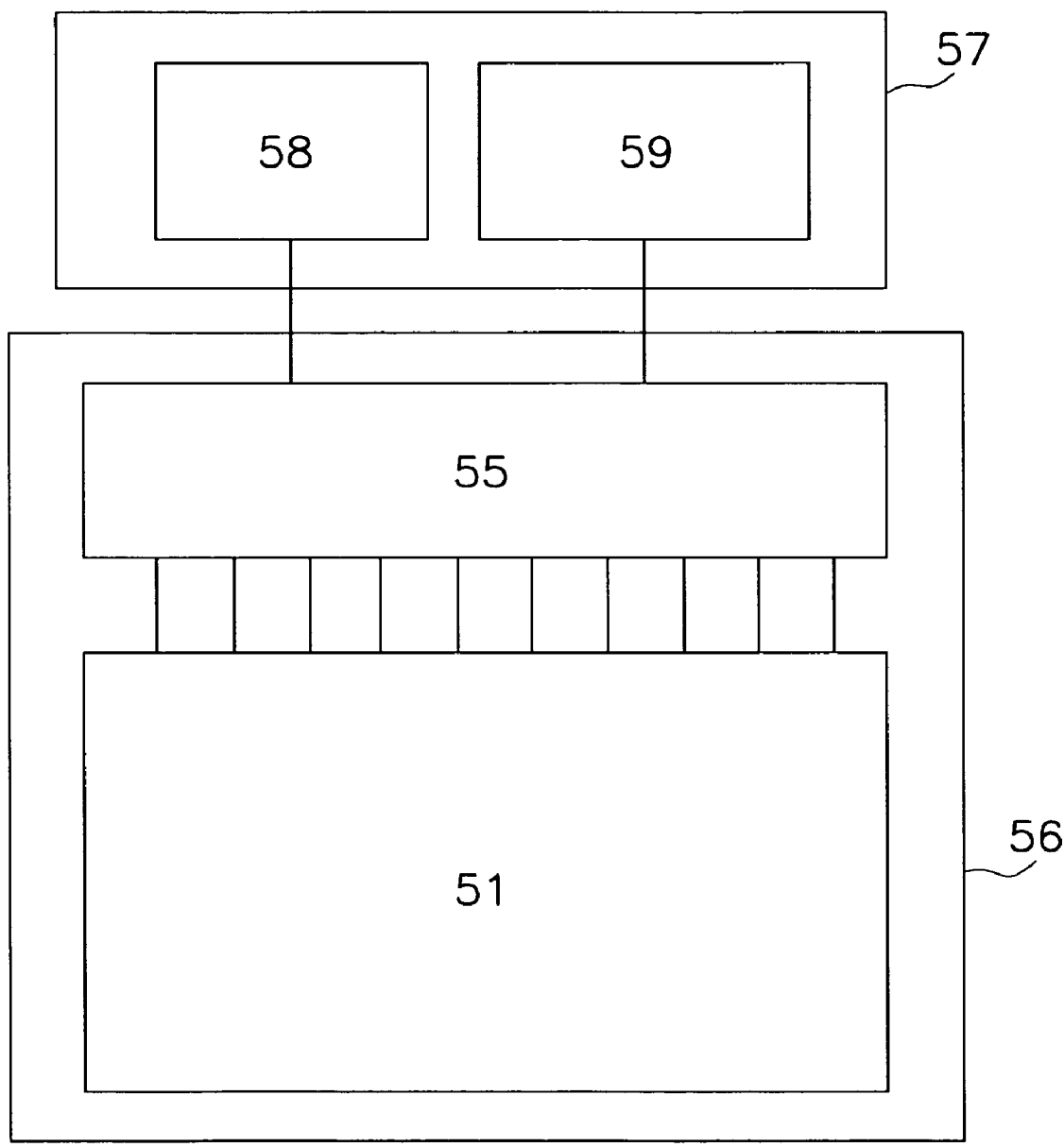
FIG. 10 is a simplified schematic illustration of a part of a structure of an electrical information recording medium and a recording and/or reproducing system according to the present invention.

FIG. 10 shows an example of a structure of an information recording system that utilizes the electrical information recording medium 51. A storage device 56 includes the electrical information recording medium 51 and an address designation circuit 55. The address designation circuit 55 designates the word line 52 and the bit line 53 of the electrical information recording medium 51, and information can be recorded and/or reproduced in the memory cell 54. In addition, the storage device 56 can be connected electrically to the external circuit 57 that includes at least a pulse power source 58 and a resistance measuring device 59, so that information can be recorded and/or reproduced on the electrical information recording medium 51.

Embodiment 9

In the information recording medium according to the present invention, the material layer that is formed so as to be adjacent to the recording layer contains at least one element selected from one of elements of the group GM consisting of Sn and Ga as well as at least one element selected from one of elements of the group GL consisting of Si, Ta and Ti as well as oxygen and carbon. Moreover, the material layer can contain at least one element selected from the group consisting of Zr and Hf. When the material layer is made of such a material, it is possible to realize a deposition rate equal to or higher than ZnS-20 mol % SiO$_2$ that is used for the dielectric layer of the conventional information recording medium. In addition, as the element that constitutes the material layer does not contain S, it is not necessary to provide an additional interface layer when the material layer is used for the dielectric layer. In addition, the dielectric layer that has a certain transparency to light of a wavelength to be used for recording and reproducing can be formed. Furthermore, when this material layer is used for the dielectric layer, sufficient recording sensitivity and rewriting performance can be secured even if the dielectric layers are provided to the upper and lower sides of the recording layer directly without interface layers. Note that the information recording medium according to the present invention is a media for recording and reproducing information by applying light or electric energy. In general, the application of light is performed by applying a laser beam, and the application of electric energy is performed by applying a voltage to the recording layer. Hereinafter, a material of the material layer that constitutes the information recording medium according to the present invention will be described more specifically.

In the information recording medium according to the present invention, the material layer can contain a material that is represented by the composition formula (1).

$$M_H O_I L_J C_K \text{(atom \%)} \quad (1)$$

In the formula (1), element M represents at least one element selected from one of elements of the group GM, element L represents at least one element selected from one of elements of the group GL, and terms H, I, J and K satisfy the relationships $10 \leq H \leq 40$, $35 \leq I \leq 70$, $0 < J \leq 30$, $0 < K \leq 30$, and $H+I+J+K=100$. Here, the expression "atom %" indicates that the composition formula (1) is expressed with the reference (100%) that is a total number of the "M" atom, the oxygen atom, the "L" atom, and the carbon atom. Also in the description below, the expression "atom %" has the same meaning. In addition, the formula (1) is expressed by counting only the "M" atom, the oxygen atom, "L" atom, and carbon atom contained in the material layer. Therefore, the material layer containing the material represented by the composition formula (1) can contain components other than the above-mentioned atoms. Furthermore, it is not important what type of compound each atom exists as in the formula (1). The reason why this composition formula is used for specifying the material is that the composition of the compound is difficult to be determined when studying the composition of the layer formed as a thin film, and that only the element composition (namely, ratio of atoms) is usually determined actually. In the material expressed in the formula (1), it is considered that most of the element M exists with oxygen atoms as an oxide, while most of the element L exists with carbon atoms as a carbide. However, it is effective that each of the element M and the element L is connected to oxygen atoms or the carbon atoms so as to form a compound.

If the information recording medium according to the present invention is an optical information recording medium, it is preferable to use a material layer containing an element selected from the group GM, an element selected from the group GL, oxygen and carbon (hereinafter referred to as a "oxide-carbide system material layer") so as to form one of or both the two dielectric layers that are adjacent to the recording layer. For example, in the case of the recording medium using the phase change, a melting point of the main material system that constitutes the recording layer is approximately 500-700 degrees Celsius, while both the melting points of the oxides of Sn and Ga that constitute group GM are more than or equal to 1000 degrees Celsius and they are superior in thermal stability. The dielectric layer containing a material having good thermal stability is hardly deteriorated and is superior in durability even if information is rewritten repeatedly on the information recording medium including this dielectric layer. On the other hand, a carbide of Si, Ta and Ti that constitute the group GL has good humidity resistance and can improve recording sensitivity largely when it is mixed to an oxide. In addition, both the oxide and the carbide mentioned above have good adhesiveness to the recording layer formed by a chalcogenide material. Therefore, in the information recording medium including this oxide-carbide system material layer as the dielectric layer, the following effects can be obtained.

(1) An interface layer is not necessary because the dielectric layer that does not contain S can be formed to be brought into intimate contact with the recording layer in good condition.

(2) Durability, humidity and resistance can be given to the information recording medium for the repeated rewriting performance in the same manner as or more than the conventional information recording medium shown in FIG. 5.

(3) As the structure becomes complicated due to the plural oxides or carbides that are mixed, thermal conductivity of the dielectric layer decreases, thereby the recording layer can be cooled rapidly so that recording sensitivity is enhanced.

When the information recording medium according to the present invention is an optical information recording medium, the material layer can contain the material represented by the composition formula as follows.

$$M_H A_P O_I L_J C_K \text{(atom \%)} \quad (2)$$

In the formula (2), element M represents at least one element selected from one of elements of the group GM, element A represents at least one element selected from one of elements of the group consisting of Zr and Hf, element L represents at least one element selected from one of elements of the group GL, and terms H, P, I, J and K satisfy relationships $10 \leq H \leq 40$, $0 < P \leq 15$, $35 \leq I \leq 70$, $0 < J \leq 30$, $0 < K \leq 30$, and $H+P+I+J+K=100$.

In the material layer containing the material represented by the formula (2), it is considered that most of the element A exists as an oxide. It is effective that the element A is connected to oxygen atoms or the carbon atoms so as to form a compound similarly to the element M or the element L. The element A has an effect of enhancing thermal resistance of the material layer, and it is preferable to add it for giving the material layer good thermal resistance so that fast recording characteristics and high density are obtained. When the material layer containing the material represented by the formula (2) is used for one of or both the two dielectric layers that are adjacent to the recording layer of the information recording medium, an information recording medium having better recording sensitivity, superior repeated rewriting performance and productivity can be manufactured at low cost. In addition, it is also to support higher density and faster recording of the information recording medium.

In the above-mentioned oxide-carbide system material layer, it is more preferable that element M in the formula (1) and the formula (2) is Sn, particularly in the case where Sn and Ga are contained. In addition, it is more preferable that element A in the formula (2) is Zr because the thermal resistance of the material layer is improved and the recording sensitivity is secured.

As described above, it is considered that at least one element selected from one of elements of the group GM consisting of Sn and Ga in the above-mentioned oxide-carbide system material layer exists with oxygen to form an oxide, and that at least one element selected from one of elements of the group GL consisting of Si, Ta and Ti exists with carbon to form a carbide, so it can be defined as a layer containing these. Furthermore, at least one element selected from one of elements of a group consisting of Zr and Hf can exist with oxygen to form an oxide and contains the same freely. In the material layer defined in this manner, it is preferable that the oxides of at least one element selected from one of elements of the group GM is contained more than or equal to 50 mol % and more preferably within the range of 50-95 mol % when total quantity of it and carbides of at least one element selected from one of elements of the group GL is regarded as the reference (100 mol %).

Here, the term "oxides" is used as a general name of all oxides when there are two elements selected from the group GM and two types of oxides are contained in the layer. Otherwise, the term "oxides" is used for indicating one oxide if there is only one element selected from one of elements of the group GM and one type of oxide is contained in the layer. This is the same concerning the term "carbides". In other words, the oxide-carbide system material layer can contain a compound except the above-specified (such a compound is also called a "third component") by 10 mol % at most. This is because that if a ratio of the third component exceeds 10 mol %, the thermal stability of the material layer can be reduced, the recording sensitivity and the rewriting characteristics can be deteriorated, and the humidity resistance can be deteriorated easily, so that the above-mentioned effect can be hardly obtained.

Note that the dielectric layer made of the material layer as specified above can contain impurities less than or equal to a few mol % or some elements of material compositions that constitute the neighboring layer.

There is a tendency that the deposition rate decreases when a ratio of the oxides of the element selected from the group GM becomes less than 50 mol %. Although a deposition rate of carbides of the element selected from the group GL is not fast, the material layer can be formed without decreasing the deposition rate so much if it is used by being mixed with an oxide.

In addition, in the information recording medium according to the present invention, the material layer can contain an oxide of at least one element selected from one of elements of the group GM preferably consisting of $SnO_2$ and $Ga_2O_3$, a carbide of at least one element selected from one of elements of the group GL preferably consisting of SiC, TaC and TiC. More specifically, it can contain a material represented by the composition formula as follows.

$$(D)_x(B)_{100-x} \text{ (mol \%)} \quad (3)$$

In the formula (3), D represents at least one oxide selected from a group consisting of $SnO_2$ and $Ga_2O_3$, B represents at least one carbide selected from a group consisting of SiC, TaC and TiC, and the term X satisfies the relationship $50 \leq X \leq 95$.

Both $SnO_2$ and $Ga_2O_3$ have high melting point over 1000 degrees Celsius, good thermal stability, and a high deposition rate. SiC, TaC and TiC have good humidity resistance and have particularly a high effect of reducing thermal conductivity when being mixed with the above-mentioned oxides, so they have good action of improving the recording sensitivity as a result. In addition, their costs are low, so they are most suitable for a practical use. A preferred ratio of the compounds is defined by x as described above. By using this oxide-carbide system material layer for the dielectric layer that is adjacent to the recording layer, it is possible to eliminate the interface layer between the dielectric layer and the recording layer. Therefore, the information recording medium including this material layer as the dielectric layer has good recording performance, good humidity resistance, good recording sensitivity, and good recording and rewriting conservation property.

In addition, in the information recording medium according to the present invention, the material layer can contain a material that is represented by the composition formula as follows.

$$(D)_X(E)_Y(B)_{100-(X+Y)} \text{ (mol \%)} \quad (4)$$

In the formula (4), element D represents at least one oxide selected from a group consisting of $SnO_2$ and $Ga_2O_3$, E represents at least one oxide selected from a group consisting of $ZrO_2$ and $HfO_2$, element B represents at least one carbide selected from a group consisting of SiC, TaC and TiC, and the terms X and Y satisfy the relationships $50 \leq X \leq 95$ and $0 < Y \leq 40$.

A preferable ratio thereof is defined by terms X and Y as described above. A more preferable ratio of at least one oxide selected from a group consisting of $ZrO_2$ and $HfO_2$ that is added freely is less than or equal to 40 mol %. It is preferable to add it within the range where a deposition rate necessary for production can be secured for giving the material layer better thermal stability so that desired fast recording characteristics are obtained.

A composition analysis of the oxide-carbide system material layer that exists in the information recording medium according to the present invention can be performed by using an x-ray micro analyzer, for example. On this occasion, the composition can be obtained as atom densities of elements.

The oxide-carbide system material layer described above is preferably disposed so as to be adjacent to the recording layer in the information recording medium according to the present invention and it can be disposed so as to be adjacent to both surfaces of the recording layer. The material layer in the information recording medium according to the present invention can exist as the interface layer that is disposed between the recording layer and the dielectric layer.

The information recording medium according to the present invention is provided preferably as a medium that causes a reversible phase change in the recording layer, namely as a rewritable information recording medium. The recording layer that causes the reversible phase change is preferable to contain one material selected from a group consisting of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te, more specifically. Each of them is a fast crystallization material. Therefore, when the recording layer is made of these materials, an information recording medium that can record information in high density and in high transfer rate, and has good reliability (specifically, good record conservation property or good rewriting conservation property) can be obtained.

In addition, it is desirable that the recording layer has a film thickness of less than or equal to 15 nm in order that the recording layer causes the reversible phase change in the information recording medium according to the present invention. If the film thickness exceeds 15 nm, heat that is added to the recording layer may diffuse along the surface but diffuse hardly in the direction of the thickness, which may be an obstacle to rewriting information.

The information recording medium according to the present invention can have a structure in which the first dielectric layer, the recording layer, the second dielectric layer and the reflecting layer are formed in this order on one surface of the substrate. The information recording medium having this structure is a media for recording information by applying light. The applied light passes through the first dielectric layer and the recording layer to reach the second dielectric layer. The information recording medium having this structure is used in the case where a laser beam having a wavelength of approximately 660 nm is used for recording and reproducing information, for example. If the information recording medium according to the present invention has this structure, it is preferable that at least one dielectric layer of the first dielectric layer and the second dielectric layer is made of the above-mentioned oxide-carbide system material layer. In addition, it is possible that the both dielectric layers are made of any of the above-mentioned material layers, and they can be made of material layers having the same composition or material layers having different compositions.

As one embodiment of the information recording medium having this structure, an information recording medium can includes the first dielectric layer, the interface layer, the recording layer, the second dielectric layer, the light absorption adjusting layer and the reflecting layer that are formed in this order on one surface of the substrate, and the second dielectric layer is made of the oxide-carbide system material layer to be adjacent to the recording layer.

The information recording medium according to the present invention can have a structure in which the reflecting layer, the second dielectric layer, the recording layer, and the first dielectric layer are formed in this order on one surface of the substrate. This structure can be adopted particularly in the case where it is necessary to realize a thin substrate that light enters. For example, if a short wavelength laser beam having a wavelength of approximately 405 nm is used for recording and reproducing, a numerical aperture NA of the objective lens is set to a large value such as 0.85 so that a focal position becomes shallow. In this case the information recording medium of this structure is used. When using such wavelength and numerical aperture NA, it is necessary to set the thickness of the substrate that light enters to a value of approximately 60-120 μm, for example. It is difficult to form layers on a surface of such a thin substrate. Therefore, the information recording medium of this structure is defined as structured by forming the reflecting layer and other layers on one surface of the substrate as a support that light does not enter.

If the information recording medium according to the present invention has this structure, at least one dielectric layer of the first dielectric layer and the second dielectric layer is the above-mentioned oxide-carbide system material layer. If both dielectric layers are the above-mentioned oxide-carbide system material layer, then both dielectric layer can be layers made of the same composition or layers made of different compositions.

As one embodiment of the information recording medium having this structure, an information recording medium can includes the reflecting layer, the light absorption adjusting layer, the second dielectric layer, the recording layer, the interface layer, and the first dielectric layer are formed in this order on one surface of the substrate, and the second dielectric layer is made of the oxide-carbide system material layer.

The information recording medium according to the present invention can have two or more recording layers. Such an information recording medium has a single sided double layered structure, for example, in which two recording layers are formed on one surface of the substrate via a dielectric layer and an intermediate layer or the like. Alternatively, it can have a structure in which recording layers are formed on both sides of the substrate. According to these structures, recording capacity can be increased.

In addition, the information recording medium according to the present invention can have a structure in which the recording layer itself includes a plurality of laminated layers. This is used for the case where it is necessary to laminate the recording layer itself for securing characteristics so as to realize high density or fast recording performance. It is possible that the oxide-carbide system material layer is formed so as to be adjacent to at least one interface of the laminated recording layer.

Next, a method for manufacturing the information recording medium according to the present invention will be described.

The method for manufacturing the information recording medium according to the present invention includes a process for forming the material layer that is included in the information recording medium according to the present invention by the sputtering method. According to the sputtering method, the material layer containing substantially the same composition as the composition of a sputtering target can be formed. Therefore, according to this manufacturing method, an oxide-carbide system material layer of a desired composition can be formed easily by selecting the sputtering target appropriately. More specifically, a sputtering target can be used that contains a material represented by the following composition formula.

$M_H O_I L_J C_K$ (atom %)　　(5)

In the formula (5), element M represents at least one element selected from one of elements of the group GM, element L represents at least one element selected from one of elements of the group GL, and terms h, i, j and k satisfy relationships $10 \leq h \leq 40$, $35 \leq i \leq 70$, $0 < j \leq 30$, $0 < k \leq 30$, and $h+i+j+k=100$.

The formula (5) corresponds to a formula that expresses a material in which most of the element M exists in a form of an oxide and most of the element L can exist with carbon atoms to form a carbide by the element composition. According to this sputtering target, the dielectric layer that contains a material represented by the formula (1) can be formed.

As another sputtering target can be used that contains a material represented by the following composition formula.

$M_H A_P O_I L_J C_K$ (atom %)　　(6)

In the formula (6), M represents at least one element selected from one of elements of the group GM, A represents at least one element selected from one of elements of the group consisting of Zr and Hf, L represents at least one element selected from one of elements of the group GL, and h, p, i, j and k satisfy relationships $10 \leq h \leq 40$, $0 < p \leq 15$, $35 \leq i \leq 70$, $0 < j \leq 30$, $0 < k \leq 30$, and $h+p+i+j+k=100$.

In the composition formula (6), most of the element A exists as an oxide. According to this sputtering target, the material layer represented by the formula (2) can be formed.

In the above-mentioned oxide-carbide system material layer, it is more preferable that element M of the formula (5) and the formula (6) is Sn, and still more preferably it contains Sn and Ga. In addition, it is more preferable that element A of the formula (6) is Zr about the effect of increasing the thermal resistance of the material layer.

In addition, the inventors of this application have confirmed that the element composition obtained by analyzing the sputtering target whose composition is expressed in this way by an x-ray micro analyzer becomes substantially the same as the element composition calculated from the expressed composition (namely, that the composition expression (a nominal composition) is correct). Therefore, the sputtering target that is provided as a mixture of an oxide and a carbide can be used preferably in the method for manufacturing the information recording medium according to the present invention.

Concerning the sputtering target that is provided as a mixture of an oxide and a carbide, when total quantity of the oxides of the element selected from the group GM and the carbides of at least one element selected from one of elements of the group GL is regarded as the reference (100 mol %), it is preferable that the oxides of the element selected from the group GM is contained more than or equal to 50 mol % for high productivity and more preferably within the range of 50-95 mol %. If a sputtering target containing less than 50 mol % of oxides of this group GM is used, the obtained oxide-carbide system material layer also contains less than 50 mol % of oxides of the group GM, so that obtaining the information recording medium that gives the above-mentioned effect can become difficult. This is the same concerning the sputtering target that is provided by further mixing at least one oxide selected from a group consisting of Zr and Hf.

More specifically, the sputtering target that is preferably used contains at least one oxide selected from a group consisting of $SnO_2$ and $Ga_2O_3$ as the oxide of the element selected from a group GM and SiC as the carbide of at least one element selected from one of elements of the group GL. It is preferable that the sputtering target contains a material that is represented by the following composition formula.

$(D)_x(B)_{100-x}$ (mol %)　　(7)

In the formula (7), element D represents at least one oxide selected from a group consisting of $SnO_2$ and $Ga_2O_3$, B represents at least one carbide selected from a group consisting of SiC, TaC and TiC, and x satisfies the relationship $50 \leq x \leq 95$.

By using this sputtering target, the material layer represented by the formula (3) can be formed.

The sputtering target represented by the formula (7) can contain a material that contains at least one oxide selected from a group consisting of $ZrO_2$ and $HfO_2$ and is represented by the following composition formula.

$(D)_x(E)_y(B)_{100-(x+y)}$ (mol %)　　(8)

In the formula (8), element D represents at least one oxide selected from a group consisting of $SnO_2$ and $Ga_2O_3$, element E represents at least one oxide selected from a group consisting of $ZrO_2$ and $HfO_2$, element B represents at least one carbide selected from a group consisting of SiC, TaC and TiC, and terms X and Y satisfy the relationships $50 \leq X \leq 95$ and $0 < Y \leq 40$.

By using this sputtering target, the material layer represented by the formula (4) can be formed.

Embodiment 10

Figure 13:
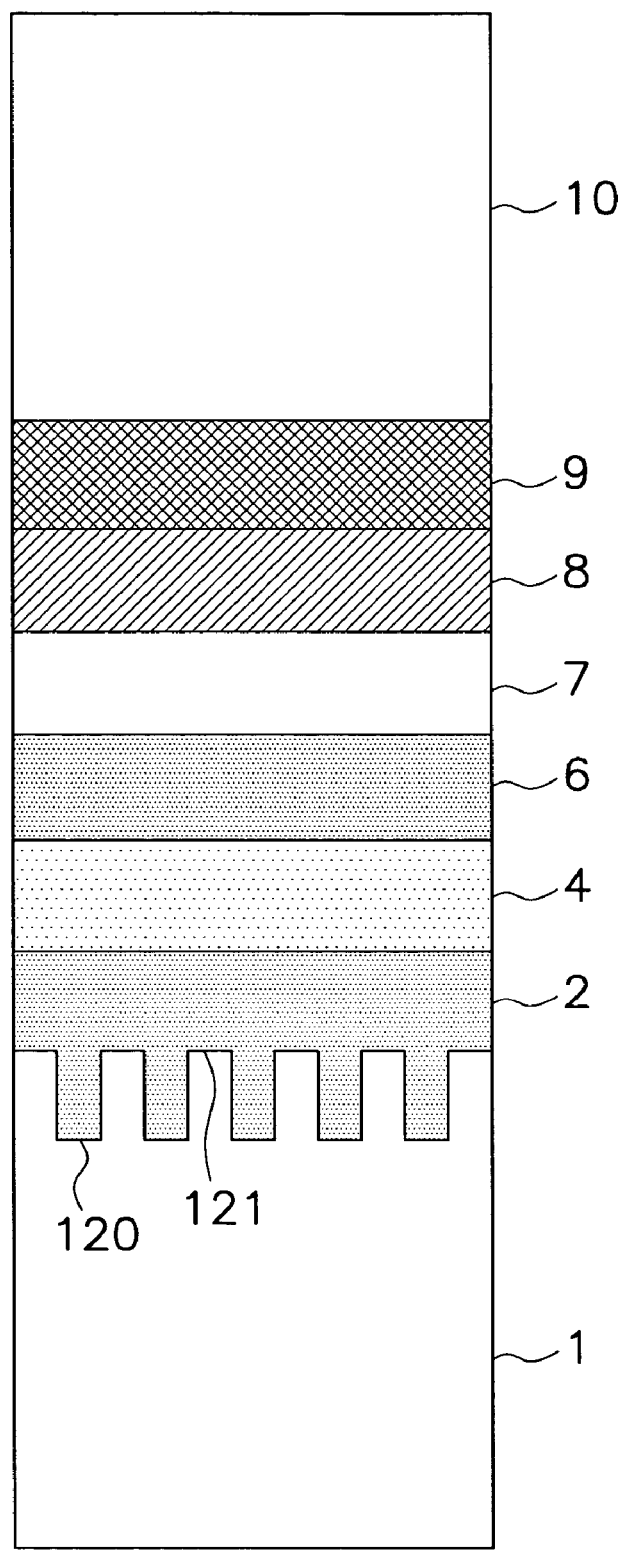
FIG. 13 is a partial cross sectional view of an information recording medium according to another embodiment of the present invention.

As a tenth embodiment of the present invention, an example of an information recording medium for recording and reproducing information by using a laser beam will be described. FIG. 13 shows a partial cross section of the information recording medium.

As shown in FIG. 13, the information recording medium in this embodiment has a structure in which the first dielectric layer 2, the recording layer 4, the second dielectric layer 6, the light absorption adjusting layer 7, and the reflecting layer 8 are formed in this order on one surface of the substrate 1, and the dummy substrate 10 is further glued to the reflecting layer 8 via the adhesive layer 9. The information recording medium having this structure can be used as the 4.7 GB/DVD-RAM for recording and reproducing information by a red color laser beam having a wavelength of approximately 660 nm. When using the information recording medium having this structure, the laser beam enters the side of the substrate 1, and information is recorded and/or reproduced by the entering laser beam. The information recording medium in this embodiment is different from the conventional information recording medium shown in FIG. 17 in that it has no interface layer between the recording layer 4 and each of the first and the second dielectric layer 2 and 6.

The substrate 1 is usually a transparent disk-like plate. The substrate 1 can has a guide groove for leading the laser beam as shown in FIG. 13 that is formed on the surface of the side where the first dielectric layer 2 and the recording layer 4 and the like are formed. If the guide groove is formed on the substrate 1, groove portions and land portions are formed on the substrate 1 as viewed in the cross section thereof. The groove portion is positioned between two neighboring land portions. Therefore, the surface of the substrate 1 on which the guide groove is formed has top faces and bottom faces that are connected by side walls. In this specification, in the direction of the laser beam, the surface that is closer to the laser beam is called a "groove face" for the sake of convenience, while the surface that is farther from the laser beam is called a "land face" for the sake of convenience. In FIG. 13, the bottom face 120 of the guide groove of the substrate 1 corresponds to the groove face, while the top face 121 corresponds to the land face. Note that this is the same concerning the information recording medium shown in FIG. 14 that will be described later in the second embodiment.

It is preferable that a step difference between the groove face 120 and the land face 121 of the substrate 1 is within the range of 40-60 nm. Note that it is also preferable that the step difference between the groove face 120 and the land face 121 of the substrate 1 constituting the information recording medium shown in FIG. 14 that will be described later is within this range. In addition, it is desirable in the substrate 1 that the surface of the side that does not form the other layer is smooth. As a material of the substrate 1, a material that is optically transparent resin such as a polycarbonate, an amorphous polyolefin or a polymethyl methacrylate (PMMA), or a glass can be used, for example. In consideration of formability, a cost, and a mechanical intensity, a polycarbonate can be used preferably. Note that in the information recording medium of this embodiment, a thickness of the substrate 1 is approximately 0.5-0.7 mm.

The recording layer 4 is a layer that causes a phase change between the crystalline phase and the amorphous phase when light or electric energy is applied so as to form a record mark. As the phase change is reversible, erasing and rewriting can be performed. It is preferable that Ge—Sb—Te or Ge—Sn—Sb—Te that is a fast crystallization material is used as the reversible phase change material. More specifically, GeTe—$Sb_2Te_3$ quasi-binary line composition is preferable in the case of the Ge—Sb—Te. In this case it is preferable that the relationship $4Sb_2Te_3 \leq GeTe \leq 50Sb_2Te_3$ is satisfied. If the relationship $GeTe < 4Sb_2Te_3$ is satisfied, then a change of reflected light quantity between before and after the recording is small, so quality of read signal is deteriorated. If the relationship $50Sb_2Te_3 < GeTe$ is satisfied, then a change of volume between the crystalline phase and the amorphous phase is large so that the repeated rewriting performance is deteriorated. The material Ge—Sn—Sb—Te has faster crystallization speed than the material Ge—Sb—Te. Ge—Sn—Sb—Te is made by replacing a part of Ge in the GeTe—$Sb_2Te_3$ quasi-binary line composition with Sn, for example. It is preferable that content of Sn is less than or equal to 20 atom % in the recording layer 4. If the content of Sn exceeds 20 atom %, the crystallization speed is so high that stability of the amorphous phase is deteriorated, and reliability of the record mark is lowered. Note that the content of Sn can be adjusted in accordance with a record condition.

In addition, the recording layer 4 can be made of a material containing Bi such as Ge—Bi—Te, Ge—Sn—Bi—Te, Ge—Sb—Bi—Te or Ge—Sn—Sb—Bi—Te. Bi can be crystallized more than Sb. Therefore, the crystallization speed of the recording layer can be improved also by replacing at least a part of Sb in Ge—Sb—Te or Ge—Sn—Sb—Te with Bi.

The material Ge—Bi—Te is a mixture of GeTe and $Bi_2Te_3$. It is preferable that the relationship $8Bi_2Te_3 \leq GeTe \leq 25Bi_2Te_3$ is satisfied in this mixture. If the relationship $GeTe < 8Bi_2Te_3$ is satisfied, then the crystallization temperature is lowered and the record conservation property is deteriorated easily. If the relationship $25Bi_2Te_3 < GeTe$ is satisfied, then a change of volume between the crystalline phase and the amorphous phase is large so that the repeated rewriting performance is deteriorated.

The material Ge—Sn—Bi—Te is made by replacing a part of Ge in the Ge—Bi—Te with Sn. It is possible to adjust the density of replacement with Sn so as to control the crystallization speed in accordance with the record condition. The replacement with Sn is more suitable than the replacement with Bi for fine adjustment of crystallization speed of the recording layer 4. It is preferable that the content of Sn is less than or equal to 10 atom % in the recording layer 4. If the content exceeds 10 atom %, the crystallization speed becomes so high that stability of the amorphous phase is deteriorated and conservation property of record marks is deteriorated.

The material Ge—Sn—Sb—Bi—Te is made by replacing a part of Ge with Sn and a part of Sb with Bi in Ge—Sb—Te. This corresponds to a mixture of GeTe, SnTe, $Sb_2Te_3$ and $Bi_2Te_3$. In this mixture, it is possible to adjust the density of replacement with Sn and Bi so as to control the crystallization speed in accordance with the record condition. It is preferable that the relationship $4(Sb-Bi)_2Te_3 \leq (Ge-Sn)Te \leq 25(Sb-Bi)_2Te_3$ is satisfied in the material Ge—Sn—Sb—Bi—Te. If the relationship $(Ge-Sn)Te < 4(Sb-Bi)_2Te_3$ is satisfied, then a change of reflected light quantity between before and after recording is small so that quality of the read signal is deteriorated. If the relationship $25(Sb-Bi)_2Te_3 < (Ge-Sn)Te$ is satisfied, then a change of volume between the crystalline phase and the amorphous phase is large so that the repeated rewriting performance is deteriorated. In addition, it is preferable that the content of Bi is less than or equal to 10 atom % in the recording layer 4. It is preferable that the content of Sn is less than or equal to 20 atom %. If each of the contents of Bi and Sn is within this range, a good conservation property of record marks can be obtained.

Other materials that cause a reversible phase change can include Ag—In—Sb—Te, Ag—In—Sb—Te—Ge, and Sb—Te that contain Sb by more than or equal to 70 atom %, for example.

As an irreversible phase change material, it is preferable to use $TeO_x + \alpha$, for example, where $\alpha$ is Pd, Ge or the like. The information recording medium having the recording layer 4 made of an irreversible phase change material can record information only once, and it is called a write once type. Such an information recording medium also has a problem that heat during recording information may deteriorate quality of signal because atoms in the dielectric layer diffuse into the recording layer. Therefore, the present invention can be applied not only to a rewritable information recording medium but also to a write once type information recording medium preferably.

If the recording layer 4 is made of a material that causes a reversible phase change, it is preferable that a thickness of the recording layer 4 is less than or equal to 15 nm and more preferably less than or equal to 12 nm as described before.

Each of the first dielectric layer 2 and the second dielectric layer 6 in this embodiment is an oxide-carbide system material layer containing an oxide of at least one element selected from one of elements of the group GM consisting of Sn and Ga and a carbide of at least one element selected from one of elements of the group GL consisting of Si, Ta and Ti. Furthermore, each of the first dielectric layer 2 and the second dielectric layer 6 can be an oxide-carbide system material layer containing at least one oxide selected from a group consisting of Zr and Hf in the above-mentioned oxide-carbide system material.

In general, a material of the dielectric layer that constitutes the information recording medium is required (1) to have transparency, (2) to have recording sensitivity of the same level as or more than the structure in which an interface layer is provided between the dielectric layer and the recording layer, (3) to have a high melting point so as hardly to be melted upon recording, (4) to have a large deposition rate, and (5) to have good adhesiveness to the recording layer 4 that is made of a chalcogenide material. The good transparency is a characteristic necessary for the laser beam entering from the side of the substrate 1 to pass and reach the recording layer 4. This characteristic is particularly required to the first dielectric layer 2 of the incident side. In addition, materials of the first and the second dielectric layers 2 and 6 are required to be selected so that the obtained information recording medium has recording sensitivity of the same level as or more than the conventional information recording medium in which an interface layer is disposed between the dielectric layer made of ZnS-20 mol % SiO$_2$ and the recording layer. In addition, a high melting point is a characteristic that is necessary for preventing materials of the first and the second dielectric layers 2 and 6 from mixing into the recording layer 4 when the laser beam having a peak power level is applied. This characteristic is required to both the first and the second dielectric layers 2 and 6. If the materials of the first and the second dielectric layers 2 and 6 are mixed into the recording layer 4, the repeated rewriting performance is deteriorated largely. Good adhesiveness to the recording layer 4 made of a chalcogenide material is a characteristic that is necessary for securing reliability of the information recording medium and is required to both the first and the second dielectric layers 2 and 6. In order to obtain good productivity, it is required to have a large deposition rate.

Among components contained in the above-mentioned oxide-carbide system material layer, each of the oxides of the element selected from the group GM has transparency, a high melting point, good thermal stability, and good adhesiveness to the recording layer. Therefore, these compound can secure good repeated rewriting performance of the information recording medium. In addition, each of the carbides of the element selected from the group GL has good adhesiveness to the recording layer, and good humidity resistance. When it is mixed to an oxide of the element selected from the group GM, the thermal conductivity is decreased so that the recording sensitivity is improved, and a crack of the film and a break of the film due to repeated rewriting and record can be suppressed. Therefore, by mixing a carbide of an element selected from the group GL, recording sensitivity and reliability of the information recording medium can be secured. Oxides of the element selected from the group GM include SnO$_2$ and Ga$_2$O$_3$, for example. In addition, carbides of the element selected from the group GL include SiC, TaC and TiC, for example.

Using a material that is a mixture of an oxide and a carbide without S, the first dielectric layer 2 and the second dielectric layer 6 are formed to be adjacent to the recording layer 4, so that the information recording medium can be realized that has good repeated rewriting performance and good adhesiveness to the recording layer 4 as well as between the first and the second dielectric layers 2 and 6. In addition, thermal conductivity in the first and the second dielectric layers 2 and 6 can be suppressed by adding the carbide of the element selected from the group GL to the oxide of the element selected from the group GM so that the structure of the layer is complicated. Therefore, if the above-mentioned oxide-carbide system material layer is used for the first and the second dielectric layers 2 and 6, rapid cooling effect of the recording layer can be enhanced so that the recording sensitivity of the information recording medium can be increased.

In addition, at least one oxide selected from a group consisting of Zr and Hf, e.g., ZrO$_2$ or HfO$_2$ can be added to the above-mentioned oxide-carbide system material. The oxide of Zr or Hf has higher melting point and higher thermal resistance than the oxide of the element selected from the group GM, so the structure of the oxide can be stabilized thermally by mixing it to the oxide of the element selected from the group GM. It is also possible to mix a carbide of an element selected from the group GL to the oxide so that the structure thereof becomes complicated. Thus, the thermal conductivity is reduced, the recording sensitivity is improved, and a balance of the recording and reproducing characteristics can be secured.

A concrete example of this oxide-carbide system material is, for example, the material that is represented by the formula (3), $(D)_x(B)_{100-x}$ (mol %). In this formula, D is at least one oxide selected from a group consisting of SnO$_2$ and Ga$_2$O$_3$, B is at least one carbide selected from a group consisting of SiC, TaC and TiC. The term X that indicates a mixing ratio of each of the compounds satisfies $50 \leq X \leq 95$. If the mixing ratio of D is less than 50 mol %, light absorption becomes large, heat of the recording layer propagates to the material layer and other layers, recording sensitivity is deteriorated so that recording power becomes insufficient, and good recording and reproducing characteristics cannot be obtained. In addition, the deposition rate becomes slow, and productivity is hardly improved. If the mixing ratio of D is more than 95 mol %, mixing effect of B becomes small, and particularly the recording sensitivity becomes insufficient.

Furthermore, it is possible to form the dielectric layer using an oxide-carbide system material that contains at least one oxide selected from a group consisting of Zr and Hf and is represented by the formula (4), $(D)_X(E)_Y(B)_{100-(X+Y)}$ (mol %). Here, the element E represents at least one oxide selected from a group consisting of ZrO$_2$ and HfO$_2$, and terms X and Y satisfy the relationships $50 \leq X \leq 95$ and $0 < Y \leq 40$.

The reason why the term X is set to a value within the above-mentioned range is the same as the case of the formula (3). In addition, the reason why the term Y is set to a value within the above-mentioned range is that if the term Y exceeds the upper limit value 40, the effect of increasing the recording sensitivity is not obtained even if B is mixed by 10 mol %, and the deposition rate is lowered so that the productivity is not improved.

When using the above-mentioned oxide-carbide system material layer for forming the dielectric layer, good recording sensitivity, rewriting characteristics and reliability can be secured even if the dielectric layer is formed to be adjacent to the recording layer.

The above-mentioned oxide-carbide system material layer can contain a third component except the compounds described above, particularly it can contain a few percent or less of impurities. In addition, even if some composition elements of neighboring layers are mixed, the thermal stability and the humidity resistance thereof are not changed so that it can be used preferably as the first dielectric layer 2 and the second dielectric layer 6. The third component is inevitably contained or formed when the dielectric layer is made of oxide-carbide system material layer. The third component includes a dielectric, a metal, a semimetal, a semiconductor and/or a nonmetal, for example.

A dielectric that is contained as the third component is, for example, $Al_2O_3$, $Bi_2O_3$, $CeO_2$, $CoO$, $Cr_2O_3$, $CuO$, $Cu_2O$, $Er_2O_3$, $FeO$, $Fe_2O_3$, $Fe_3O_4$, $Ho_2O_3In_2O_3$, $La_2O_3$, $MnO$, $MgSiO_3$, $Nb_2O_5$, $Nd_2O_3$, $NiO$, $Sc_2O_3$, $SiO_2$, $Sm_2O_3$, $SnO$, $Ta_2O_5$, $Tb_4O_7$, $TeO_2$, $TiO_2$, $VO$, $WO_3$, $Y_2O_3$, $Yb_2O_3$, $ZnO$, $ZrSiO_4$, $AlN$, $BN$, $CrB_2$, $LaB_6$, $ZrB_2$, $CrN$, $Cr_2N$, $HfN$, $NbN$, $Si_3N_4$, $TaN$, $TiN$, $VN$, $ZrN$, $B_4C$, $Cr_3C_2$, $HfC$, $Mo_2C$, $NbC$, $VC$, $W_2C$, $WC$, $ZrC$, $CaF_2$, $CeF_3$, $MgF_2$, $LaF_3$ or the like.

A metal that is contained as the third component is, for example, Sc, Y, Ti, Zr, Hf, V, Nb, Ta, Cr, Mo, W, Mn, Fe, Ni, Pd, Pt, Cu, Ag, Au, Zn, La, Ce, Nd, Sm, Gd, Th, Dy, Yb or the like.

A semimetal or a semiconductor that is contained as the third component is, for example, C, Ge, or the like, while a nonmetal is, for example, Sb, Bi, Te, Se or the like.

The first dielectric layer 2 and the second dielectric layer 6 can be made of an oxide-carbide system material layer having different compositions, respectively. It is preferable that the first dielectric layer 2 is made of a material having a composition so as to have a better humidity resistance, for example. It is preferable that D in the formula (3) and the formula (4) is $SnO_2$ and more preferably $SnO_2$ and $Ga_2O_3$. Furthermore, it is preferable to add $ZrO_2$ freely in order to improve the thermal resistance of the material layer as represented by the formula (4). In addition, it is more desirable that B in the formula (3) and the formula (4) is SiC.

As described above, the oxide-carbide system material layer can be formed by optimizing types of the oxide and the carbide and/or the mixing ratio thereof in accordance with a desired function.

The first dielectric layer 2 and the second dielectric layer 6 can adjust a light absorption rate Ac (%) of the recording layer 4 in the crystalline phase, the light absorption rate Aa (%) of the recording layer 4 in the amorphous phase, an optical reflectance Rc (%) of the information recording medium when the recording layer 4 is in the crystalline phase, an optical reflectance Ra (%) of the information recording medium when the recording layer 4 is in the amorphous phase, and a phase difference $\Delta\phi$ of the light of the information recording medium between the crystalline phase portion and the amorphous phase portion of the recording layer 4 by changing each optical path length (namely, a product nd of the refractivity n of the dielectric layer and the film thickness d of the dielectric layer). In order to increase amplitude of a reproduced signal of a record mark for improving signal quality, it is desirable that the reflectance difference (|Rc−Ra|) or the reflectance ratio (Rc/Ra) is large. In addition, it is desirable that Ac and Aa are also large so that the recording layer 4 can absorb the laser beam. The optical path lengths of the first dielectric layer 2 and the second dielectric layer 6 are determined so that these conditions are satisfied at the same time. The optical path lengths that satisfy the conditions can be determined precisely by calculation in accordance with a matrix method, for example.

The oxide-carbide system material layer described above has different refractivity values in accordance with the composition. When the refractivity of the dielectric layer is denoted by n, the film thickness is denoted by d (nm), and the wavelength of the laser beam is denoted by $\lambda$ (nm), the optical path length nd is represented by $nd=a\lambda$. Here, the term "a" is a positive number. In order to increase amplitude of a reproduced signal of a record mark of the information recording medium for improving the signal quality, it is preferable that the relationships $15\% \leq Rc$ and $Ra \leq 2\%$ are satisfied, for example. In addition, in order to eliminate or reduce mark distortion due to rewriting, it is preferable that $1.1 \leq Ac/Aa$. The optical path lengths $(a\lambda)$ of the first dielectric layer 2 and the second dielectric layer 6 were determined by the matrix method so as to satisfy these preferable conditions at the same time. From the obtained optical path lengths $(a\lambda)$, $\lambda$ and n, a thickness d of the dielectric layer was determined. As a result, it was found that when the first dielectric layer 2 was made of a material that was represented by the composition formulas (3) and (4) and has a refractivity n within the range of 1.8-2.4 for example, the thickness thereof is preferably within the range of 110-160 nm. In addition, when the second dielectric layer 6 is made of this material, the thickness thereof is preferably within the range of 35-60 nm.

The light absorption adjusting layer 7 has a function of adjusting the ratio Ac/Aa of the light absorption rate Ac when the recording layer 4 is in the crystalline state to the light absorption rate Aa when the recording layer 4 is in the amorphous state so that the mark shape is not distorted upon rewriting, as described before. It is preferable that the light absorption adjusting layer 7 is made of a material that has a high refractivity and absorbs light appropriately. For example, the light absorption adjusting layer 7 can be formed by using a material having a refractivity n more than or equal to 3 and less than or equal to 5 and an extinction coefficient k more than or equal to 1 and less than or equal to 4. More specifically, it is preferable to use a material selected from an amorphous Ge alloy such as Ge—Cr, Ge—Mo or the like, an amorphous Si alloy such as Si—Cr, Si—Mo, Si—W or the like, a tellurium compound, crystalline metal such as Ti, Zr, Nb, Ta, Cr, Mo, W, SnTe, PbTe or the like, a semimetal or a semiconductor material. It is preferable that the light absorption adjusting layer 7 has a film thickness within a range of 20-60 nm.

The reflecting layer 8 has an optical function of increasing quantity of light that is absorbed by the recording layer 4 and a thermal function of diffuse rapidly heat generated in the recording layer 4 so that the recording layer 4 is cooled rapidly to become the amorphous state easily. Furthermore, the reflecting layer 8 also has a function of protecting the multi-layered film including the recording layer 4 and the dielectric layers 2 and 6 from the environment. As a material of the reflecting layer 8 for example, a single metal material having high thermal conductivity such as Al, Au, Ag, Cu or the like can be used. The reflecting layer 8 can be made of a material in which one or plural elements is added to one or plural elements selected from the above-mentioned metal materials for the purpose of improving the humidity resistance thereof and/or the purpose of adjusting the thermal conductivity or the optical characteristics (for example, optical reflectance, light absorption rate or optical transmittance). More specifically, an alloy material such as Al—Cr, Al—Ti, Ag—Pd, Ag—Pd—Cu, Ag—Pd—Ti, Au—Cr or the like can be used. Each of these materials has good corrosion resistance and good rapid cooling function. The same purpose can also be achieved by forming the reflecting layer 8 by using two or more layers. It is preferable that a thickness of the reflecting layer 8 is within the range of 50-180 nm, and more preferably within the range of 60-100 nm.

The adhesive layer 9 can be formed by using a material having high thermal resistance and high adhesive property, for example, an ultraviolet curing resin or the like. More specifically, a photo-curing material containing an acrylate resin or a methacrylate resin as a main component, a material containing an epoxy resin as a main component, a hot melt material or the like can be used. In addition, it is possible to provide a protection coating layer made of an ultraviolet curing resin having a thickness of 2-20 µm on the surface of the reflecting layer 8 before forming the adhesive layer 9, if necessary. A thickness of the adhesive layer 9 is preferably within the range of 15-40 µm and more preferably within the range of 20-35 µm.

The dummy substrate 10 has a function of increasing mechanical intensity of the information recording medium and protecting the lamination layers from the first dielectric layer 2 to the reflecting layer 8. A preferable material of the dummy substrate 10 is the same as the preferable material of the substrate 1.

Although the information recording medium in this embodiment is a disk of a single sided structure having a single recording layer, it can have two or more recording layers without limiting to this structure.

Then, a method for manufacturing the information recording medium according to this embodiment will be described.

The information recording medium of this embodiment is manufactured by placing a substrate 1 on which the guide groove (the groove face 120 and the land face 121) is formed (having a thickness of 0.6 mm, for example) in a deposition device, depositing the first dielectric layer 2 on the surface of the substrate 1 on which the guide groove is formed (step "a"), depositing the recording layer 4 (step "b"), depositing the second dielectric layer 6 (step "c"), depositing the light absorption adjusting layer 7 (step "d") and depositing the reflecting layer 8 (step "e") in sequence, and further forming the adhesive layer 9 on the surface of the reflecting layer 8, and gluing the dummy substrate 10. Note that a "surface" of each layer means an exposed surface when the layer is deposited (the surface that is perpendicular to the thickness direction) unless otherwise specified in this specification.

First, the step "a" is performed in which the first dielectric layer 2 is deposited on the surface of the substrate 1 on which the guide groove is formed. The step "a" is performed by the sputtering method by using a high frequency power source in an Ar gas atmosphere. As a gas for the sputtering, an Ar gas or a mixed gas with an oxygen gas, a nitrogen gas, $CH_4$ gas or the like can be used in accordance with a material layer to be deposited.

A sputtering target that is used in the step "a" can be a sputtering target containing an oxide of at least one element selected from one of elements of the group GM consisting of Sn and Ga, and a carbide of at least one element selected from one of elements of the group GL consisting of Si, Ta and Ti, or a sputtering target that further contains at least one oxide selected from a group consisting of Zr and Hf.

As described above, the sputtering target containing one or more elements selected from the group GM, one or more elements selected from the group GL, an oxygen atom and a carbon atom is more specifically represented by the formula (5) $M_H O_I L_J C_K$ (atom %). In this formula, the element M represents at least one element selected from one of elements of the group GM, the element L represents at least one element selected from one of elements of the group GL, and the terms H, I, J and K satisfy the relationships $10 \leq H \leq 40$, $35 \leq I \leq 70$, $0 < J \leq 30$, $0 < K \leq 30$, and $H+I+J+K=100$. The sputtering target that further contains at least one oxide selected from a group consisting of Zr and Hf freely can be provided in a form of a mixture of an oxide of an element selected from the group GM, a carbide of an element selected from the group GL, and an oxide of Zr or Hf freely. More specifically, the material is represented by the formula (6) $M_H A_P O_I L_J C_K$ (atom %). In this formula, the element M represents at least one element selected from one of elements of the group GM, the element A represents at least one element selected from one of elements of the group consisting of Zr and Hf, the element L represents at least one element selected from one of elements of the group GL, and the terms H, P, I, J and K satisfy the relationships $10 \leq H \leq 40$, $0 < P \leq 15$, $35 \leq I \leq 70$, $0 < J \leq 30$, $0 < K \leq 30$, and $H+P+I+J+K=100$.

It is more preferable that the sputtering target that is used in the manufacturing method according to the present invention contains the oxides of the element selected from the group GM by 50 mol % or more of the mixture, more preferably within the range of 50-95 mol %.

The above-mentioned sputtering target containing the specific oxide and carbide can includes a material that contains at least one oxide selected from a group consisting of $SnO_2$ and $Ga_2O_3$, and at least one carbide selected from a group consisting of SiC, TaC and TiO. More specifically, the material is represented by the formula (7) $(D)_x(B)_{100-x}$ (mol %). In this formula, the element D represents at least one oxide selected from a group consisting of $SnO_2$ and $Ga_2O_3$, the element B represents at least one carbide selected from a group consisting of SiC, TaC and TiC, and the term x indicating a mixing ratio of each compound satisfies the relationship $50 \leq x \leq 95$. By using this target, the layer containing the material represented by the formula (3) can be formed.

The sputtering target represented by the formula (7) can further contain at least one oxide selected from a group consisting of $ZrO_2$ and $HfO_2$, and it is preferable to contain a material that is represented by a formula (8) $(D)_x(E)_y(B)_{100-(x+y)}$ (mol %). In this formula, the element D represents at least one oxide selected from a group consisting of $SnO_2$ and $Ga_2O_3$, E represents at least one oxide selected from a group consisting of $ZrO_2$ and $HfO_2$, the element B represents at least one carbide selected from a group consisting of SiC, TaC and TiC, and the terms x and y satisfy the relationships $50 \leq x \leq 95$ and $0 < y \leq 40$. By using this target, the layer containing the material represented by the formula (4) can be formed.

The layer containing the above-mentioned material can contain other third components in addition to the compound, and particularly it can contain impurities of a few % or less. In addition, some composition element of neighboring layers can be mixed. The components that can be contained as the third component are as described above as examples.

Next, the step "b" is performed so that the recording layer 4 is deposited on the surface of the first dielectric layer 2. The step "b" is also performed by the sputtering process. The sputtering process is performed by using a direct current power source in an Ar gas atmosphere or in an atmosphere of a mixed gas of an Ar gas and a $N_2$ gas. Similarly to the step "a", other gas can be used in accordance with the purpose. The sputtering target can contain any one material selected from a group consisting of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te. The recording layer 4 after deposited is in the amorphous state.

Next, the step "c" is performed so that the second dielectric layer 6 is deposited on the surface of the recording layer 4. The step "c" is performed in the same manner as the step "a". The second dielectric layer 6 can be formed by using a sputtering target containing the same compound as the first dielectric layer 2 in a different mixing ratio or by using a sputtering target containing a oxide and/or a carbide different from the first dielectric layer 2. For example, it is possible to form the first dielectric layer 2 using a mixed material of $SnO_2$—$ZrO_2$—SiC and to form the second dielectric layer 6 using a mixed material of $SnO_2$—$Ga_2O_3$—TaC. In this way, the first dielectric layer 2 and the second dielectric layer 6 can be formed by optimizing types of contained oxides and carbides and/or a mixing ratio thereof in accordance with a desired function.

Next, the step "d" is performed so that the light absorption adjusting layer 7 is deposited on the surface of the second dielectric layer 6. In the step "d", a direct current power source or a high frequency power source is used for sputtering. A sputtering target that is used can be selected from a group consisting of an amorphous Ge alloy such as Ge—Cr, Ge—Mo or the like, an amorphous Si alloy such as Si—Cr, Si—Mo, Si—W or the like, a tellurium compound, crystalline metal such as Ti, Zr, Nb, Ta, Cr, Mo, W, SnTe, PbTe or the like, a crystalline metal, a semimetal, and a semiconductor material. The sputtering process is usually performed in an Ar gas atmosphere.

Next, the step "e" is performed so that the reflecting layer 8 is deposited on the surface of the light absorption adjusting layer 7. The step "e" is performed by the sputtering process. The sputtering process is performed by using a direct current power source or a high frequency power source in an Ar gas atmosphere. The sputtering target that is used can contain an alloy material such as Al—Cr, Al—Ti, Ag—Pd, Ag—Pd—Cu, Ag—Pd—Ti, Au—Cr or the like.

As described above, each of the steps "a" through "e" is a sputtering process. Therefore, the steps "a" through "e" can be performed successively in one sputtering device by changing the targets in sequence. In addition, it is possible to perform the steps "a" through "e" by using individual sputtering devices.

After depositing the reflecting layer 8, the substrate 1 on which the first dielectric layer 2 through the reflecting layer 8 are deposited in sequence is taken out of the sputtering device. Then, an ultraviolet curing resin is applied onto the surface of the reflecting layer 8 by the spin coat method, for example. The dummy substrate 10 is brought into intimate contact with the applied ultraviolet curing resin, and ultraviolet rays are applied from the side of the dummy substrate 10 so as to cure the resin for finishing the gluing step.

After the gluing step is finished, an initialization process is performed, if necessary. The initialization process is a step for irradiating the recording layer 4 in the amorphous state with laser beam from a semiconductor laser for example so as to raising the temperature of the recording layer 4 up to a crystallization temperature or higher for crystallizing the same. The initialization process can be performed before the gluing step. In this way, the steps "a" through "e", the step for forming the adhesive layer and the step for gluing the dummy substrate 10 are performed in sequence, so as to produce the information recording medium according to the first embodiment.

Embodiment 11

Figure 14:
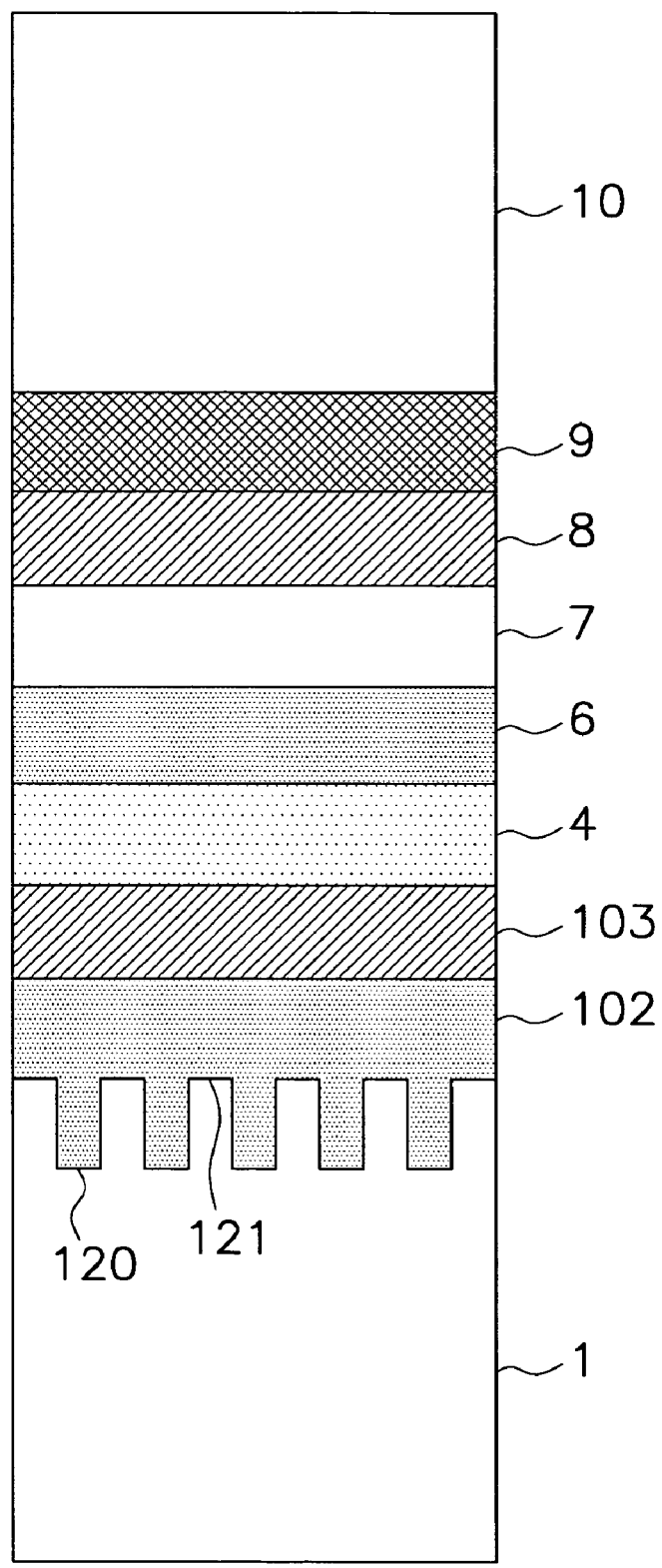
FIG. 14 is a partial cross sectional view of an information recording medium according to another embodiment of the present invention.

As an eleventh embodiment of the present invention, FIG. 14 shows an partial cross section of the information recording medium.

Figure 12:
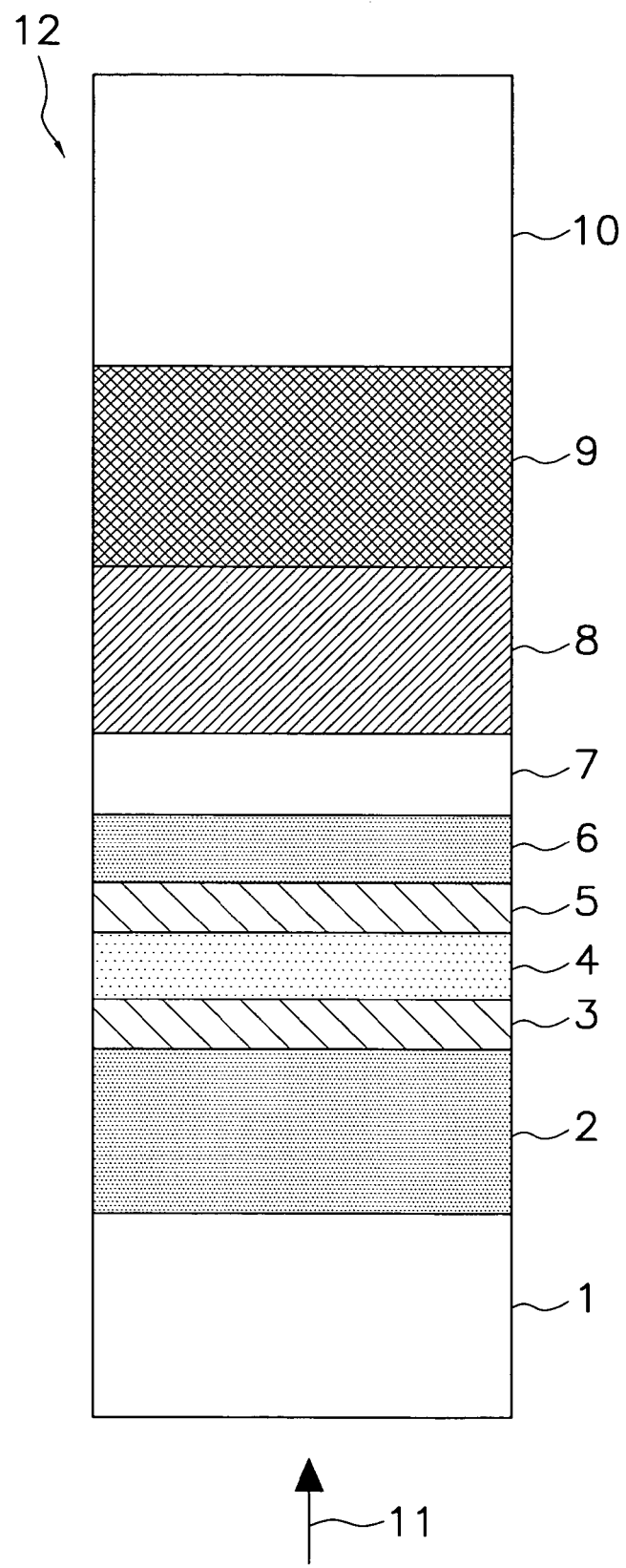
FIG. 12 is a partial cross sectional view of an information recording medium showing an example of a layer structure of a 4.7 GB/DVD-RAM.

The information recording medium of this embodiment shown in FIG. 14 has a structure in which a first dielectric layer 102, a first interface layer 103, a recording layer 4, a second dielectric layer 6, a light absorption adjusting layer 7, and a reflecting layer 8 are formed in this order on a surface of a substrate 1, and further a dummy substrate 10 is glued to the reflecting layer 8 via an adhesive layer 9. The information recording medium of this embodiment is different from the conventional information recording medium shown in FIG. 12 in that no interface layer is disposed between the recording layer 4 and the second dielectric layer 6. In addition, it is different from the information recording medium shown in FIG. 13 in that the first dielectric layer 102 and the first interface layer 103 are disposed in this order between the substrate 1 and the recording layer 4. In this embodiment, the second dielectric layer 6 is made of an oxide-carbide system material layer that is the same as the first and the second dielectric layer of the information recording medium in the tenth embodiment. Furthermore, the reference numerals in FIG. 14 that are the same as in FIG. 13 denote structuring elements having the same functions, which are formed by the same method using the same material as described with reference to FIG. 14. Therefore, detailed description of the structuring elements that were already described with reference to FIG. 14 will be omitted.

In the information recording medium of this embodiment, the first dielectric layer 102 is made of a material that is used for the dielectric layer constituting the conventional information recording medium (ZnS-20 mol % $SiO_2$). Therefore, the interface layer 103 is provided for preventing material transfer that may occur between the first dielectric layer 102 and the recording layer 4 due to repeated recording. Concerning a preferable material and a thickness of the interface layer 103, it is preferable that a mixed material such as $ZrO_2$—$SiO_2$—$Cr_2O_3$ or Ge—Cr is used for example, and the thickness is within the range of 1-10 nm, more preferably within the range of 2-7 nm. If the interface layer is thick, optical reflectance and absorption factor of the lamination layers from the first dielectric layer 102 through the reflecting layer 8 formed on the surface of the substrate 1 may change, which affects the record erasing performance.

Then, a method for manufacturing the information recording medium of this embodiment will be described. In this embodiment, on the surface of the substrate 1 on which the guide groove is formed, the first dielectric layer 102 is deposited (step "h"), the first interface layer 103 is deposited (step "i"), the recording layer 4 is deposited (step "b"), the second dielectric layer 6 is deposited (step "c"), the light absorption adjusting layer 7 is deposited (step "d") and the reflecting layer 8 is deposited (step "e") in sequence. Furthermore, the adhesive layer 9 is formed on the surface of the reflecting layer 8, and the dummy substrate 10 is glued to the same. The steps "b", "c", "d", and "e" are as described in the tenth embodiment, so the detailed description thereof is omitted here. After the step of gluing the dummy substrate 10 is finished, an initialization process is performed for obtaining the information recording medium as described in the tenth embodiment, if necessary.

Although the information recording medium for recording and reproducing information by using the laser beam is described above as the embodiment of the information recording medium according to the present invention with reference to FIGS. 13 and 14 in the tenth and eleventh embodiments, the information recording medium according to the present invention is not limited to these embodiments. The information recording medium according to the present invention can take any form for forming a dielectric layer adjacent to the recording layer by using an oxide-carbide system material layer. Namely, the present invention can be applied regardless of the order of forming layers on the substrate, the number of recording layers, the record condition, the record capacity and the like. In addition, the information recording medium according to the present invention is suitable for recording information by various wavelengths. Therefore, the structure and the manufacturing method of the information recording medium according to the present invention can be applied to a DVD-RAM or a DVD-RW for recording and reproducing information by a laser beam having a wavelength within the range of 630-680 nm, or a large capacity optical disk for recording and reproducing information by using a laser beam having a wavelength within the range of 400-450 nm, for example.

Embodiment 12

Figure 15:
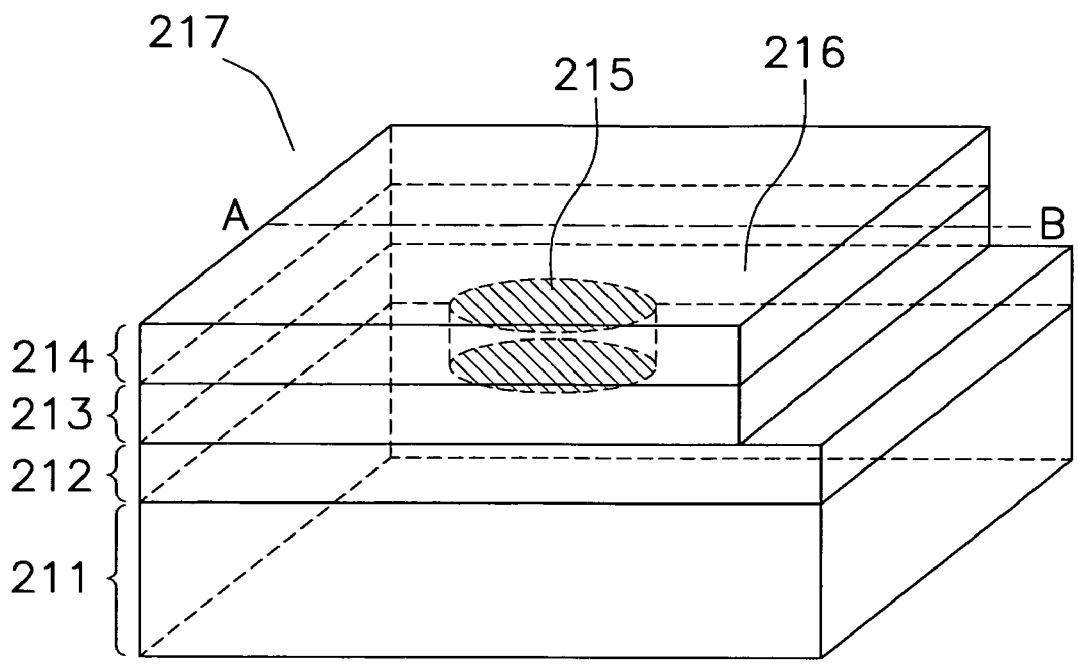
FIG. 15 is a simplified perspective view of an information recording medium in which information is recorded by applying electric energy according to the present invention.

As a twelfth embodiment of the present invention, an example of an information recording medium for recording and reproducing information by applying electric energy will be described. FIG. 15 shows a perspective view of the information recording medium of this embodiment.

As shown in FIG. 15, the information recording medium of this embodiment is a memory having a structure in which a lower electrode 212, a record portion 213 and an upper electrode 214 are formed in this order on the surface of the substrate 211. The record portion 213 of the memory has a structure including a cylinder-like recording layer 215 and a dielectric layer 216 that surrounds the recording layer 215. In contrast to the information recording medium described in the tenth and the eleventh embodiments with reference to FIGS. 13 and 14, the recording layer 215 and the dielectric layer 216 are formed on the same surface not in a lamination relationship in this form of memory. However, both the recording layer 215 and the dielectric layer 216 constitute a part of the lamination layer including the substrate 211, the lower electrode 212 and the upper electrode 214 in the memory, so each of them can be called a "layer". Therefore, the information recording medium according to the present invention includes the embodiment having a recording layer and a dielectric layer that are arranged on the same surface.

As the substrate 211 more specifically, a semiconductor substrate such as a Si substrate, a substrate made of a polycarbonate resin, an acrylic resin or the like, an insulating substrate such as a $SiO_2$ substrate or a $Al_2O_3$ substrate, for example. The lower electrode 212 and the upper electrode 214 are made of an appropriate conductive material. The lower electrode 212 and the upper electrode 214 are formed by sputtering a metal such as Au, Ag, Pt, Al, Ti, W, Cr or the like, or a mixture of them, for example.

The recording layer 215 that constitutes the record portion 213 is made of a material that causes a phase change when electric energy is applied, and it can be called a phase change portion in the record portion 213. The recording layer 215 is made of a material that changes its phase between the crystalline phase and the amorphous phase by Joule heat that is generated when electric energy is applied. A material of the recording layer 215 can be Ge—Sb—Te, Ge—Sn—Sb—Te, Ge—Bi—Te, Ge—Sn—Bi—Te, Ge—Sb—Bi—Te and Ge—Sn—Sb—Bi—Te system materials, for example. More specifically, a GeTe—$Sb_2Te_3$ system material or a GeTe—$Bi_2Te_3$ system material can be used, for example.

The dielectric layer 216 that constitutes the record portion 213 has a function of preventing current flowing in the recording layer 215 from leaking to peripheral portion by applying a voltage across the upper electrode 214 and the lower electrode 212, so that the recording layer 215 is insulated electrically and thermally. Therefore, the dielectric layer 216 can also be called a thermal insulation portion. The dielectric layer 216 is formed by using an oxide-carbide system material layer. More specifically, it is a layer containing a material represented by the formulas (1)-(4). These materials are used for the dielectric layer 216 preferably because they have high melting points, and atoms in the material layer are hardly diffused even if heated, and thermal conductivity is low.

This embodiment will be described more with an operating method in the example below.

EXAMPLES A

Embodiments of the present invention will be described in more detail with an operating method in the example below.

EXAMPLE A-1

As a first example, the information recording medium 15 shown in FIG. 1 was made, and then a relationship between materials of the second dielectric layer 106 and recording sensitivity as well as the repeated rewriting performance of the information layer 16 was studied. More specifically, samples of the information recording medium 15 having different materials of the second dielectric layers 106 of the information layer 16 were made, and then the recording sensitivity and the repeated rewriting performance of the information layer 16 were measured.

The samples were made in the method as described below. First, a polycarbonate substrate (having a diameter of 120 mm and a thickness of 1.1 mm) was prepared as the substrate 14, on which a guide groove (having a depth of 20 nm and a track pitch of 0.32 μm) was formed for leading the laser beam 11. Then, an Ag—Pd—Cu layer (having a thickness of 80 nm) as the reflecting layer 108, the second dielectric layer 106 (having a thickness of 10-20 nm), a $Ge_{28}Sn_3Bi_2Te_{34}$ layer (having a thickness of 10 nm) as the recording layer 104, a $(ZrO_2)_{50}(Cr_2O_3)_{50}$ layer (having a thickness of 5 nm) as the first interface layer 103, and a $(ZnS)_{80}(SiO_2)_{20}$ layer (having a thickness of 60 nm) as the first dielectric layer 102 were deposited in sequence on the polycarbonate substrate by the sputtering method.

Finally, an ultraviolet curing resin was applied onto the first dielectric layer 102, and a polycarbonate sheet (having a diameter of 120 mm and a thickness of 90 μm) was brought into intimate contact with the first dielectric layer 102 to be rotated for forming a uniform resin layer. Then ultraviolet rays were applied to cure the resin so that the transparent layer 13 having a thickness of 100 μm was formed. After that, an initialization process was performed for crystallizing the recording layer 104 by a laser beam. In this way, plural samples having different materials of the second dielectric layers 106 were produced.

About these samples obtained by the above-mentioned method, the recording sensitivity and the repeated rewriting performance of the information layer 16 of the information recording medium 15 were measured by using the recording and reproducing device 38 shown in FIG. 7. On this occasion, a wavelength of the laser beam 11 was set to 405 nm, a numerical aperture NA of the objective lens 34 was set to 0.85, a line speed of the sample during measurement was set to 4.9 m/second and 9.8 m/second, and the shortest mark length (2T) was set to 0.149 μm. In addition, information was recorded in grooves.

The evaluation result of material of the second dielectric layer 106 of the information layer 16 of the information recording medium 15, and the recording sensitivity and the repeated rewriting performance of the information layer 16 is shown in Table 1 when the line speed is 4.9 m/second (1×), and is shown in Table 2 when the line speed is 9.8 m/second (2×). Note that the recording sensitivity in 1× is indicated by ○ for the range less than 5.2 mW, Δ for the range more than or equal to 5.2 mW and less than 6 mW, and x for the range more than or equal to 6 mW. In addition, the recording sensitivity in 2× is indicated by ○ for the range less than 6 mW, Δ or the range more than or equal to 6 mW and less than 7 mW, and x for the range more than or equal to 7 mW. Furthermore, the repeated rewriting performance is indicated by ○ when the repeated rewriting number of times is more than or equal to 1000, Δ when it is more than or equal to 500 and less than 1000, and x when it is less than 500.

TABLE 1

| Sample No. | Material of the second dielectric layer 106 | Recording sensitivity | Repeated rewriting performance |
|---|---|---|---|
| 1-1 | $(ZnS)_{80}(SiO_2)_{20}$ | ○ | x |
| 1-2 | $SnO_2$ | Δ | Δ |
| 1-3 | $(SnO_2)_{98}(SiC)_2$ | ○ | ○ |
| 1-4 | $(SnO_2)_{95}(SiC)_5$ | ○ | ○ |
| 1-5 | $(SnO_2)_{85}(SiC)_{15}$ | ○ | ○ |
| 1-6 | $(SnO_2)_{70}(SiC)_{30}$ | ○ | ○ |
| 1-7 | $(SnO_2)_{50}(SiC)_{50}$ | ○ | ○ |
| 1-8 | $(SnO_2)_{30}(SiC)_{70}$ | Δ | ○ |
| 1-9 | SiC | x | Δ |
| 1-10 | $(SnO_2)_{75}(SiC)_{15}(TiO_2)_{10}$ | ○ | ○ |
| 1-11 | $(SnO_2)_{75}(SiC)_{15}(ZrO_2)_{10}$ | ○ | ○ |
| 1-12 | $(SnO_2)_{75}(SiC)_{15}(HfO_2)_{10}$ | ○ | ○ |
| 1-13 | $(SnO_2)_{75}(SiC)_{15}(ZnO)_{10}$ | ○ | ○ |
| 1-14 | $(SnO_2)_{75}(SiC)_{15}(Nb_2O_5)_{10}$ | ○ | ○ |
| 1-15 | $(SnO_2)_{75}(SiC)_{15}(Ta_2O_5)_{10}$ | ○ | ○ |
| 1-16 | $(SnO_2)_{75}(SiC)_{15}(SiO_2)_{10}$ | ○ | ○ |
| 1-17 | $(SnO_2)_{75}(SiC)_{15}(Al_2O_3)_{10}$ | ○ | ○ |
| 1-18 | $(SnO_2)_{75}(SiC)_{15}(Bi_2O_3)_{10}$ | ○ | ○ |
| 1-19 | $(SnO_2)_{75}(SiC)_{15}(Cr_2O_3)_{10}$ | ○ | ○ |
| 1-20 | $(SnO_2)_{75}(SiC)_{15}(Ga_2O_3)_{10}$ | ○ | ○ |
| 1-21 | $(SnO_2)_{40}(SiC)_{20}(Ga_2O_3)_{40}$ | ○ | ○ |
| 1-22 | $(SnO_2)_{75}(SiC)_{15}(Si\text{—}N)_{10}$ | ○ | ○ |
| 1-23 | $(SnO_2)_{75}(SiC)_{15}(Ge\text{—}N)_{10}$ | ○ | ○ |
| 1-24 | $(SnO_2)_{75}(SiC)_{15}(Cr\text{—}N)_{10}$ | ○ | ○ |
| 1-25 | $(SnO_2)_{75}(SiC)_{15}(LaF_3)_{10}$ | ○ | ○ |
| 1-26 | $(SnO_2)_{40}(SiC)_{15}(Ga_2O_3)_{40}(Nb_2O_5)_5$ | ○ | ○ |

TABLE 2

| Sample No. | Material of the second dielectric layer 106 | Recording sensitivity | Repeated rewriting performance |
|---|---|---|---|
| 1-1 | $(ZnS)_{80}(SiO_2)_{20}$ | ○ | x |
| 1-2 | $SnO_2$ | Δ | ○ |
| 1-3 | $(SnO_2)_{98}(SiC)_2$ | ○ | ○ |
| 1-4 | $(SnO_2)_{95}(SiC)_5$ | ○ | ○ |
| 1-5 | $(SnO_2)_{85}(SiC)_{15}$ | ○ | ○ |
| 1-6 | $(SnO_2)_{70}(SiC)_{30}$ | ○ | ○ |
| 1-7 | $(SnO_2)_{50}(SiC)_{50}$ | ○ | ○ |
| 1-8 | $(SnO_2)_{30}(SiC)_{70}$ | Δ | Δ |
| 1-9 | SiC | x | Δ |
| 1-10 | $(SnO_2)_{75}(SiC)_{15}(TiO_2)_{10}$ | ○ | ○ |
| 1-11 | $(SnO_2)_{75}(SiC)_{15}(ZrO_2)_{10}$ | ○ | ○ |
| 1-12 | $(SnO_2)_{75}(SiC)_{15}(HfO_2)_{10}$ | ○ | ○ |
| 1-13 | $(SnO_2)_{75}(SiC)_{15}(ZnO)_{10}$ | ○ | ○ |
| 1-14 | $(SnO_2)_{75}(SiC)_{15}(Nb_2O_5)_{10}$ | ○ | ○ |
| 1-15 | $(SnO_2)_{75}(SiC)_{15}(Ta_2O_5)_{10}$ | ○ | ○ |
| 1-16 | $(SnO_2)_{75}(SiC)_{15}(SiO_2)_{10}$ | ○ | ○ |
| 1-17 | $(SnO_2)_{75}(SiC)_{15}(Al_2O_3)_{10}$ | ○ | ○ |
| 1-18 | $(SnO_2)_{75}(SiC)_{15}(Bi_2O_3)_{10}$ | ○ | ○ |
| 1-19 | $(SnO_2)_{75}(SiC)_{15}(Cr_2O_3)_{10}$ | ○ | ○ |
| 1-20 | $(SnO_2)_{75}(SiC)_{15}(Ga_2O_3)_{10}$ | ○ | ○ |
| 1-21 | $(SnO_2)_{40}(SiC)_{20}(Ga_2O_3)_{40}$ | ○ | ○ |
| 1-22 | $(SnO_2)_{75}(SiC)_{15}(Si\text{—}N)_{10}$ | ○ | ○ |
| 1-23 | $(SnO_2)_{75}(SiC)_{15}(Ge\text{—}N)_{10}$ | ○ | ○ |
| 1-24 | $(SnO_2)_{75}(SiC)_{15}(Cr\text{—}N)_{10}$ | ○ | ○ |
| 1-25 | $(SnO_2)_{75}(SiC)_{15}(LaF_3)_{10}$ | ○ | ○ |
| 1-26 | $(SnO_2)_{40}(SiC)_{15}(Ga_2O_3)_{40}(Nb_2O_5)_5$ | ○ | ○ |

As a result of this evaluation, it was found that the repeated rewriting performance in 1× and 2× was not good concerning the sample 1-1 in which $(ZnS)_{80}(SiO_2)_{20}$ was used for the second dielectric layer 106 because sulfur contained in ZnS were diffused into the recording layer. In addition, it was found that when a material represented by a composition formula $(SnO_2)_{1-x}(SiC)_x$ (mol %) was used for the second dielectric layer 106, the recording sensitivity in 1× and 2× and the repeated rewriting performance in 1× were little inferior concerning the sample 1-2 in which x=0. In addition, it was found concerning the sample 1-8 in which x=70 that the recording sensitivity in 1× and 2× and the repeated rewriting performance in 2× were little inferior. In addition, it was found about the sample 1-9 in which x=100 that the recording sensitivity in 1× and 2× was low. It was found concerning the samples 1-3 through 1-7 in which 0<x≦50 that the recording sensitivity and the repeated rewriting performance in 1× and 2× were both good. In addition, it was found concerning the samples 1-10 through 1-26 in which another compound is added to $SnO_2$—SiC that the recording sensitivity and the repeated rewriting performance in 1× and 2× were both good.

EXAMPLE A-2

As a second example A, the information recording medium 24 shown in FIG. 3 was produced, and then a relationship between a material of the second dielectric layer 306 and the recording sensitivity as well as the repeated rewriting performance of the second information layer 25 was studied. More specifically, samples of the information recording medium 24 having different materials of the second dielectric layer 306 of the second information layer 25 were made, and then the recording sensitivity and the repeated rewriting performance of the second information layer 25 were measured.

The samples were made in the method as described below. First, a polycarbonate substrate (having a diameter of 120 mm and a thickness of 1.1 mm) was prepared as the substrate 14, on which a guide groove (having a depth of 20 nm and a track pitch of 0.32 μm) was formed for leading the laser beam 11. Then, an Ag—Pd—Cu layer (having a thickness of 80 nm) as the second reflecting layer 208, the second dielectric layer 306 (having a thickness of 10-20 nm), a $Ge_{28}Sn_3Bi_2Te_{34}$ layer (having a thickness of 10 nm) as the second recording layer 304, a $(ZrO_2)_{50}(Cr_2O_3)_{50}$ layer (having a thickness of 5 nm) as the first interface layer 303, and a $(ZnS)_{80}(SiO_2)_{20}$ layer (having a thickness of 60 nm) as the first dielectric layer 302 were deposited in sequence on the polycarbonate substrate by the sputtering method.

Next, an ultraviolet curing resin was applied onto the first dielectric layer 302, and a substrate on which a guide groove (having a depth of 20 nm and a track pitch of 0.32 μm) was formed were placed on the same, which were brought into intimate contact with each other and were rotated so as to form a uniform resin layer. After that, the resin was cured, and then the substrate was removed. By this process, the optical separation layer 17 having a thickness of 25 μm, on which the guide groove for leading the laser beam 11 were formed on the side close to the first information layer 23, were formed.

After that, a $TiO_2$ layer (having a thickness of 20 nm) as the transmittance adjusting layer 209, an Ag—Pd—Cu layer (having a thickness of 10 nm) as the first reflecting layer 208, a $(ZrO_2)_{25}(SiO_2)_{25}(Ga_2O_3)_{50}$ layer (having a thickness of 10 nm) as the fourth interface layer 205, a $Ge_{28}Sn_3Bi_2Te_{34}$ layer (having a thickness of 6 nm) as the first recording layer 204, a $(ZrO_2)_{25}(SiO_2)_{25}(Cr_2O_3)_{50}$ layer (having a thickness of 5 nm) as the third interface layer 203, and a $(ZnS)_{80}(SiO_2)_{20}$ layer (having a thickness of 40 nm) as the third dielectric layer 202 were deposited in sequence on the optical separation layer 17 by the sputtering method.

Finally, an ultraviolet curing resin was applied onto the third dielectric layer 202, and a polycarbonate sheet (having a diameter of 120 mm and a thickness 65 μm) was brought into intimate contact with the third dielectric layer 202 to be rotated for forming a uniform resin layer. Then ultraviolet rays were applied to cure the resin so that the transparent layer 13 having a thickness 75 μm was formed. After that, an initialization process was performed for crystallizing the second recording layer 304 and the first recording layer 204 by a laser beam. In this way, plural samples having different materials of the second dielectric layer 306 were produced.

About these samples obtained by the above-mentioned method, the recording sensitivity and the repeated rewriting performance of the second information layer 25 of the information recording medium 24 were measured by using the recording and reproducing device 38 shown in FIG. 7. On this occasion, a wavelength of the laser beam 11 was set to 405 nm, a numerical aperture NA of the objective lens 34 was set to 0.85, a line speed of the sample during measurement was set to 4.9 m/second and 9.8 m/second, and the shortest mark length (2T) was set to 0.149 μm. In addition, information was recorded in grooves.

The evaluation result of material of the second dielectric layer 306 of the second information layer 25 of the information recording medium 24, and the recording sensitivity as well as the repeated rewriting performance of the second information layer 25 is shown in Table 3 when the line speed is 4.9 m/second (1×), and is shown in Table 4 when the line speed is 9.8 m/second (2×). Note that the recording sensitivity in 1× is indicated by ○ for the range less than 10.4 mW, Δ for the range more than or equal to 10.4 mW and less than 12 mW, and x for the range more than or equal to 12 mW. In addition, the recording sensitivity in 2× is indicated by ○ for the range less than 12 mW, Δ for the range more than or equal to 12 mW and less than 14 mW, and x for the range more than or equal to 14 mW. Furthermore, the repeated rewriting performance is indicated by ○ when the repeated rewriting number of times is more than or equal to 1000, Δ when it is more than or equal to 500 and less than 1000, and x when it is less than 500.

TABLE 3

| Sample No. | Material of the second dielectric layer 306 | Recording sensitivity | Repeated rewriting performance |
|---|---|---|---|
| 2-1 | $(ZnS)_{80}(SiO_2)_{20}$ | ○ | x |
| 2-2 | $SnO_2$ | Δ | Δ |
| 2-3 | $(SnO_2)_{98}(SiC)_2$ | ○ | ○ |
| 2-4 | $(SnO_2)_{95}(SiC)_5$ | ○ | ○ |
| 2-5 | $(SnO_2)_{85}(SiC)_{15}$ | ○ | ○ |
| 2-6 | $(SnO_2)_{70}(SiC)_{30}$ | ○ | ○ |
| 2-7 | $(SnO_2)_{50}(SiC)_{50}$ | ○ | ○ |
| 2-8 | $(SnO_2)_{30}(SiC)_{70}$ | Δ | ○ |
| 2-9 | SiC | x | Δ |
| 2-10 | $(SnO_2)_{75}(SiC)_{15}(TiO_2)_{10}$ | ○ | ○ |
| 2-11 | $(SnO_2)_{75}(SiC)_{15}(ZrO_2)_{10}$ | ○ | ○ |
| 2-12 | $(SnO_2)_{75}(SiC)_{15}(HfO_2)_{10}$ | ○ | ○ |
| 2-13 | $(SnO_2)_{75}(SiC)_{15}(ZnO)_{10}$ | ○ | ○ |
| 2-14 | $(SnO_2)_{75}(SiC)_{15}(Nb_2O_5)_{10}$ | ○ | ○ |
| 2-15 | $(SnO_2)_{75}(SiC)_{15}(Ta_2O_5)_{10}$ | ○ | ○ |
| 2-16 | $(SnO_2)_{75}(SiC)_{15}(SiO_2)_{10}$ | ○ | ○ |
| 2-17 | $(SnO_2)_{75}(SiC)_{15}(Al_2O_3)_{10}$ | ○ | ○ |
| 2-18 | $(SnO_2)_{75}(SiC)_{15}(Bi_2O_3)_{10}$ | ○ | ○ |
| 2-19 | $(SnO_2)_{75}(SiC)_{15}(Cr_2O_3)_{10}$ | ○ | ○ |
| 2-20 | $(SnO_2)_{75}(SiC)_{15}(Ga_2O_3)_{10}$ | ○ | ○ |
| 2-21 | $(SnO_2)_{40}(SiC)_{20}(Ga_2O_3)_{40}$ | ○ | ○ |
| 2-22 | $(SnO_2)_{75}(SiC)_{15}(Si\text{—}N)_{10}$ | ○ | ○ |
| 2-23 | $(SnO_2)_{75}(SiC)_{15}(Ge\text{—}N)_{10}$ | ○ | ○ |
| 2-24 | $(SnO_2)_{75}(SiC)_{15}(Cr\text{—}N)_{10}$ | ○ | ○ |
| 2-25 | $(SnO_2)_{75}(SiC)_{15}(LaF_3)_{10}$ | ○ | ○ |
| 2-26 | $(SnO_2)_{40}(SiC)_{15}(Ga_2O_3)_{40}(Nb_2O_5)_5$ | ○ | ○ |

TABLE 4

| Sample No. | Material of the second dielectric layer 306 | Recording sensitivity | Repeated rewriting performance |
|---|---|---|---|
| 2-1 | $(ZnS)_{80}(SiO_2)_{20}$ | ○ | x |
| 2-2 | $SnO_2$ | Δ | ○ |
| 2-3 | $(SnO_2)_{98}(SiC)_2$ | ○ | ○ |
| 2-4 | $(SnO_2)_{95}(SiC)_5$ | ○ | ○ |
| 2-5 | $(SnO_2)_{85}(SiC)_{15}$ | ○ | ○ |
| 2-6 | $(SnO_2)_{70}(SiC)_{30}$ | ○ | ○ |
| 2-7 | $(SnO_2)_{50}(SiC)_{50}$ | ○ | ○ |
| 2-8 | $(SnO_2)_{30}(SiC)_{70}$ | Δ | Δ |
| 2-9 | SiC | x | Δ |
| 2-10 | $(SnO_2)_{75}(SiC)_{15}(TiO_2)_{10}$ | ○ | ○ |
| 2-11 | $(SnO_2)_{75}(SiC)_{15}(ZrO_2)_{10}$ | ○ | ○ |
| 2-12 | $(SnO_2)_{75}(SiC)_{15}(HfO_2)_{10}$ | ○ | ○ |
| 2-13 | $(SnO_2)_{75}(SiC)_{15}(ZnO)_{10}$ | ○ | ○ |
| 2-14 | $(SnO_2)_{75}(SiC)_{15}(Nb_2O_5)_{10}$ | ○ | ○ |
| 2-15 | $(SnO_2)_{75}(SiC)_{15}(Ta_2O_5)_{10}$ | ○ | ○ |
| 2-16 | $(SnO_2)_{75}(SiC)_{15}(SiO_2)_{10}$ | ○ | ○ |
| 2-17 | $(SnO_2)_{75}(SiC)_{15}(Al_2O_3)_{10}$ | ○ | ○ |
| 2-18 | $(SnO_2)_{75}(SiC)_{15}(Bi_2O_3)_{10}$ | ○ | ○ |
| 2-19 | $(SnO_2)_{75}(SiC)_{15}(Cr_2O_3)_{10}$ | ○ | ○ |
| 2-20 | $(SnO_2)_{75}(SiC)_{15}(Ga_2O_3)_{10}$ | ○ | ○ |
| 2-21 | $(SnO_2)_{40}(SiC)_{20}(Ga_2O_3)_{40}$ | ○ | ○ |
| 2-22 | $(SnO_2)_{75}(SiC)_{15}(Si\text{—}N)_{10}$ | ○ | ○ |
| 2-23 | $(SnO_2)_{75}(SiC)_{15}(Ge\text{—}N)_{10}$ | ○ | ○ |
| 2-24 | $(SnO_2)_{75}(SiC)_{15}(Cr\text{—}N)_{10}$ | ○ | ○ |
| 2-25 | $(SnO_2)_{75}(SiC)_{15}(LaF_3)_{10}$ | ○ | ○ |
| 2-26 | $(SnO_2)_{40}(SiC)_{15}(Ga_2O_3)_{40}(Nb_2O_5)_5$ | ○ | ○ |

As a result of this evaluation, it was found that the repeated rewriting performance in 1× and 2× was not good concerning the sample 2-1 in which $(ZnS)_{80}(SiO_2)_{20}$ was used for the second dielectric layer 306 because sulfur contained in ZnS were diffused into the recording layer. In addition, it was found that when a material represented by a composition formula $(SnO_2)_{1-x}(SiC)_x$ (mol %) was used for the second dielectric layer 306, the recording sensitivity in 1× and 2× and the repeated rewriting performance in 1× were little inferior concerning the sample 2-2 in which x=0. In addition, it was found concerning the sample 2-8 in which x=70 that the recording sensitivity in 1× and 2× and the repeated rewriting performance in 2× were little inferior. In addition, it was found about the sample 2-9 in which x=100 that the recording sensitivity in 1× and 2× was low. It was found concerning the samples 2-3 through 2-7 in which 0<x≦50 that the recording sensitivity and the repeated rewriting performance in 1× and 2× were both good. In addition, it was found concerning the samples 2-10 through 2-26 in which another compound is added to $SnO_2$—SiC that the recording sensitivity and the repeated rewriting performance in 1× and 2× were both good.

EXAMPLE A-3

When the second interface layer 105 was arranged in the first example A, the repeated rewriting number of times of the information layer 16 of the information recording medium 15 was improved. In the same way, when the second interface layer 305 was arranged in the Example A-2, the repeated rewriting number of times of the second information layer 25 of the information recording medium 24 was improved. Note that it was found that it was preferable that the second interface layer 105 and the second interface layer 305 were made of a material containing at least one of elements of the group consisting of Zr, Hf, Y and Si as well as at least one of elements of the group consisting of Ga and Cr as well as O. In this case, it was also found that it was preferable that they were made of a material containing at least one oxide selected from the group consisting of $ZrO_2$, $HfO_2$, $Y_2O_3$ and $SiO_2$ as well as at least one oxide selected from the group consisting of $Ga_2O_3$ and $Cr_2O_3$.

EXAMPLE A-4

As a fourth example A, the information recording medium 24 shown in FIG. 3 was produced, and then a relationship between a material of the fourth dielectric layer 206 and the recording sensitivity as well as the repeated rewriting performance of the first information layer 23 was studied. More specifically, samples of the information recording medium 24 having different materials of the fourth dielectric layer 206 of the first information layer 23 were made, and then the recording sensitivity and the repeated rewriting performance of the first information layer 23 were measured.

The samples were made in the method as described below. First, a polycarbonate substrate (having a diameter of 120 mm and a thickness of 1.1 mm) was prepared as the substrate 14, on which a guide groove (having a depth of 20 nm and a track pitch of 0.32 μm) was formed for leading the laser beam 11. Then, an Ag—Pd—Cu layer (having a thickness of 80 nm) as the second reflecting layer 308, a $(SnO_2)_{80}(SiC)_{20}$ layer (having a thickness of 15 nm) as the second dielectric layer 306, a $(ZrO_2)_{25}(SiO_2)_{25}(Ga_2O_3)_{50}$ layer (having a thickness of 5 nm) as the second interface layer 305, a $Ge_{28}Sn_3Bi_2Te_{34}$ layer (having a thickness of 10 nm) as the second recording layer 304, a $(ZrO_2)_{25}(SiO_2)_{25}(Cr_2O_3)_{50}$ layer (having a thickness of 5 nm) as the first interface layer 303, and a $(ZnS)_{80}(SiO_2)_{20}$ layer (having a thickness of 60 nm) as the first dielectric layer 302 were deposited in sequence on the polycarbonate substrate by the sputtering method.

Next, an ultraviolet curing resin was applied onto the first dielectric layer 302, and a substrate on which a guide groove (having a depth of 20 nm and a track pitch of 0.32 μm) was formed were placed on the same, which were brought into intimate contact with each other and were rotated so as to form a uniform resin layer. After that, the resin was cured, and then the substrate was removed. By this process, the optical separation layer 17 having a thickness of 25 μm, on which the guide groove for leading the laser beam 11 were formed on the side close to the first information layer 23, were formed.

After that, a $TiO_2$ layer (having a thickness of 20 nm) as the transmittance adjusting layer 209, an Ag—Pd—Cu layer (having a thickness of 10 nm) as the first reflecting layer 208, a $(ZrO_2)_{25}(SiO_2)_{25}(Ga_2O_3)_{50}$ layer (having a thickness of 10 nm) as the fourth interface layer 205, a $Ge_{28}Sn_3Bi_2Te_{34}$ layer (having a thickness of 6 nm) as the first recording layer 204, a $(ZrO_2)_{25}(SiO_2)_{25}(Cr_2O_3)_{50}$ layer (having a thickness of 5 nm) as the third interface layer 203, and a $(ZnS)_{80}(SiO_2)_{20}$ layer (having a thickness of 40 nm) as the third dielectric layer 202 were deposited in sequence on the optical separation layer 17 by the sputtering method.

Finally, an ultraviolet curing resin was applied onto the third dielectric layer 202, and a polycarbonate sheet (having a diameter of 120 mm and a thickness 65 μm) was brought into intimate contact with the third dielectric layer 202 to be rotated for forming a uniform resin layer. Then ultraviolet rays were applied to cure the resin so that the transparent layer 13 having a thickness 75 μm was formed. After that, an initialization process was performed for crystallizing the second recording layer 304 and the first recording layer 204 by a laser beam. In this way, plural samples having different materials of the fourth dielectric layer 206 were produced.

About these samples obtained by the above-mentioned method, the recording sensitivity and the repeated rewriting performance of the first information layer 23 of the information recording medium 24 were measured by using the recording and reproducing device 38 shown in FIG. 7. On this occasion, a wavelength of the laser beam 11 was set to 405 nm, a numerical aperture NA of the objective lens 34 was set to 0.85, a line speed of the sample during measurement was set to 4.9 m/second and 9.8 m/second, and the shortest mark length (2T) was set to 0.149 μm. In addition, information was recorded in grooves.

The evaluation result of material of the fourth dielectric layer 206 of the first information layer 23 of the information recording medium 24, and the recording sensitivity as well as the repeated rewriting performance of the first information layer 23 is shown in Table 5 when the line speed is 4.9 m/second (1×), and is shown in Table 6 when the line speed is 9.8 m/second (2×). Note that the recording sensitivity in 1× is indicated by ○ for the range less than 10.4 mW, Δ for the range more than or equal to 10.4 mW and less than 12 mW, and x for the range more than or equal to 12 mW. In addition, the recording sensitivity in 2× is indicated by ○ for the range less than 12 mW, Δ for the range more than or equal to 12 mW and less than 14 mW, and x for the range more than or equal to 14 mW. Furthermore, the repeated rewriting performance is indicated by ○ when the repeated rewriting number of times is more than or equal to 1000, Δ when it is more than or equal to 500 and less than 1000, and x when it is less than 500.

TABLE 5

| Sample No. | Material of the fourth dielectric layer 206 | Recording sensitivity | Repeated rewriting performance |
|---|---|---|---|
| 3-1 | $(ZnS)_{80}(SiO_2)_{20}$ | ○ | x |
| 3-2 | $SnO_2$ | Δ | Δ |
| 3-3 | $(SnO_2)_{98}(SiC)_2$ | ○ | ○ |
| 3-4 | $(SnO_2)_{95}(SiC)_5$ | ○ | ○ |
| 3-5 | $(SnO_2)_{85}(SiC)_{15}$ | ○ | ○ |
| 3-6 | $(SnO_2)_{70}(SiC)_{30}$ | ○ | ○ |
| 3-7 | $(SnO_2)_{50}(SiC)_{50}$ | ○ | ○ |
| 3-8 | $(SnO_2)_{30}(SiC)_{70}$ | Δ | ○ |
| 3-9 | SiC | x | Δ |
| 3-10 | $(SnO_2)_{75}(SiC)_{15}(TiO_2)_{10}$ | ○ | ○ |
| 3-11 | $(SnO_2)_{75}(SiC)_{15}(ZrO_2)_{10}$ | ○ | ○ |
| 3-12 | $(SnO_2)_{75}(SiC)_{15}(HfO_2)_{10}$ | ○ | ○ |
| 3-13 | $(SnO_2)_{75}(SiC)_{15}(ZnO)_{10}$ | ○ | ○ |
| 3-14 | $(SnO_2)_{75}(SiC)_{15}(Nb_2O_5)_{10}$ | ○ | ○ |
| 3-15 | $(SnO_2)_{75}(SiC)_{15}(Ta_2O_5)_{10}$ | ○ | ○ |
| 3-16 | $(SnO_2)_{75}(SiC)_{15}(SiO_2)_{10}$ | ○ | ○ |
| 3-17 | $(SnO_2)_{75}(SiC)_{15}(Al_2O_3)_{10}$ | ○ | ○ |
| 3-18 | $(SnO_2)_{75}(SiC)_{15}(Bi_2O_3)_{10}$ | ○ | ○ |
| 3-19 | $(SnO_2)_{75}(SiC)_{15}(Cr_2O_3)_{10}$ | ○ | ○ |
| 3-20 | $(SnO_2)_{75}(SiC)_{15}(Ga_2O_3)_{10}$ | ○ | ○ |
| 3-21 | $(SnO_2)_{40}(SiC)_{20}(Ga_2O_3)_{40}$ | ○ | ○ |
| 3-22 | $(SnO_2)_{75}(SiC)_{15}(Si-N)_{10}$ | ○ | ○ |
| 3-23 | $(SnO_2)_{75}(SiC)_{15}(Ge-N)_{10}$ | ○ | ○ |
| 3-24 | $(SnO_2)_{75}(SiC)_{15}(Cr-N)_{10}$ | ○ | ○ |
| 3-25 | $(SnO_2)_{75}(SiC)_{15}(LaF_3)_{10}$ | ○ | ○ |
| 3-26 | $(SnO_2)_{40}(SiC)_{15}(Ga_2O_3)_{40}(Nb_2O_5)_5$ | ○ | ○ |

TABLE 6

| Sample No. | Material of the fourth dielectric layer 206 | Recording sensitivity | Repeated rewriting performance |
|---|---|---|---|
| 3-1 | $(ZnS)_{80}(SiO_2)_{20}$ | ○ | x |
| 3-2 | $SnO_2$ | Δ | ○ |
| 3-3 | $(SnO_2)_{98}(SiC)_2$ | ○ | ○ |
| 3-4 | $(SnO_2)_{95}(SiC)_5$ | ○ | ○ |
| 3-5 | $(SnO_2)_{85}(SiC)_{15}$ | ○ | ○ |
| 3-6 | $(SnO_2)_{70}(SiC)_{30}$ | ○ | ○ |
| 3-7 | $(SnO_2)_{50}(SiC)_{50}$ | ○ | ○ |
| 3-8 | $(SnO_2)_{30}(SiC)_{70}$ | Δ | Δ |

TABLE 6-continued

| Sample No. | Material of the fourth dielectric layer 206 | Recording sensitivity | Repeated rewriting performance |
|---|---|---|---|
| 3-9 | SiC | x | Δ |
| 3-10 | $(SnO_2)_{75}(SiC)_{15}(TiO_2)_{10}$ | ○ | ○ |
| 3-11 | $(SnO_2)_{75}(SiC)_{15}(ZrO_2)_{10}$ | ○ | ○ |
| 3-12 | $(SnO_2)_{75}(SiC)_{15}(HfO_2)_{10}$ | ○ | ○ |
| 3-13 | $(SnO_2)_{75}(SiC)_{15}(ZnO)_{10}$ | ○ | ○ |
| 3-14 | $(SnO_2)_{75}(SiC)_{15}(Nb_2O_5)_{10}$ | ○ | ○ |
| 3-15 | $(SnO_2)_{75}(SiC)_{15}(Ta_2O_5)_{10}$ | ○ | ○ |
| 3-16 | $(SnO_2)_{75}(SiC)_{15}(SiO_2)_{10}$ | ○ | ○ |
| 3-17 | $(SnO_2)_{75}(SiC)_{15}(Al_2O_3)_{10}$ | ○ | ○ |
| 3-18 | $(SnO_2)_{75}(SiC)_{15}(Bi_2O_3)_{10}$ | ○ | ○ |
| 3-19 | $(SnO_2)_{75}(SiC)_{15}(Cr_2O_3)_{10}$ | ○ | ○ |
| 3-20 | $(SnO_2)_{75}(SiC)_{15}(Ga_2O_3)_{10}$ | ○ | ○ |
| 3-21 | $(SnO_2)_{40}(SiC)_{20}(Ga_2O_3)_{40}$ | ○ | ○ |
| 3-22 | $(SnO_2)_{75}(SiC)_{15}(Si-N)_{10}$ | ○ | ○ |
| 3-23 | $(SnO_2)_{75}(SiC)_{15}(Ge-N)_{10}$ | ○ | ○ |
| 3-24 | $(SnO_2)_{75}(SiC)_{15}(Cr-N)_{10}$ | ○ | ○ |
| 3-25 | $(SnO_2)_{75}(SiC)_{15}(LaF_3)_{10}$ | ○ | ○ |
| 3-26 | $(SnO_2)_{40}(SiC)_{15}(Ga_2O_3)_{40}(Nb_2O_5)_5$ | ○ | ○ |

As a result of this evaluation, it was found that the repeated rewriting performance in 1× and 2× was not good concerning the sample 3-1 in which $(ZnS)_{80}(SiO_2)_{20}$ was used for the fourth dielectric layer 206 because sulfur contained in ZnS were diffused into the recording layer. In addition, it was found that when a material represented by a composition formula $(SnO_2)_{1-x}(SiC)_x$ (mol %) was used for the fourth dielectric layer 206, the recording sensitivity in 1× and 2× and the repeated rewriting performance in 1× were little inferior concerning the sample 3-2 in which x=0. In addition, it was found concerning the sample 3-8 in which x=70 that the recording sensitivity in 1× and 2× and the repeated rewriting performance in 2× were little inferior. In addition, it was found about the sample 3-9 in which x=100 that the recording sensitivity in 1× and 2× was low. It was found concerning the samples 3-3 through 3-7 in which 0<x≦50 that the recording sensitivity and the repeated rewriting performance in 1× and 2× were both good. In addition, it was found concerning the samples 3-10 through 3-26 in which another compound is added to $SnO_2$—SiC that the recording sensitivity and the repeated rewriting performance in 1× and 2× were both good.

EXAMPLE A-5

As a fifth example A, the information recording medium 29 shown in FIG. 4 was made, and the same experiment as the first example A was performed.

The sample was made in the method as described below. First, a polycarbonate substrate (having a diameter of 120 mm and a thickness 0.6 mm) was prepared as the substrate 26, on which a guide groove (having a depth of 40 nm and a track pitch 0.344 μm) was formed for leading the laser beam 11. Then, a $(ZnS)_{80}(SiO_2)_{20}$ layer (having a thickness of 60 nm) as the first dielectric layer 102, a $(ZrO_2)_{50}(Cr_2O_3)_{50}$ layer (having a thickness of 5 nm) as the first interface layer 103, a $Ge_{28}Sn_3Bi_2Te_{34}$ layer (having a thickness of 10 nm) as the recording layer 104, the second dielectric layer 106 (having a thickness of 10-20 nm), and an Ag—Pd—Cu layer (having a thickness of 80 nm) as the reflecting layer 108 were deposited in sequence on the polycarbonate substrate by the sputtering method.

After that, an ultraviolet curing resin was applied onto the dummy substrate 28, and the reflecting layer 108 of the substrate 26 was brought into intimate contact with the dummy substrate 28 to be rotated for forming a uniform resin layer (having a thickness of 20 μm). Then ultraviolet rays were applied to cure the resin so that the substrate 26 and the dummy substrate 28 were glued to each other via the adhesive layer 27. Finally, an initialization process was performed for crystallizing the entire surface of the recording layer 104 by a laser beam.

About these samples obtained by the above-mentioned method, the recording sensitivity and the repeated rewriting performance of the information layer 16 of the information recording medium 29 were measured by the same method as the first example A. On this occasion, a wavelength of the laser beam 11 was set to 405 nm, a numerical aperture NA of the objective lens 34 was set to 0.65, a line speed of the sample during measurement was set to 8.6 m/second and 17.2 m/second, and the shortest mark length was set to 0.294 μm. In addition, information was recorded in grooves.

As a result, in the same manner as the first example A, it was found that the repeated rewriting performance in 1× and 2× was not good when $(ZnS)_{80}(SiO_2)_{20}$ was used for the second dielectric layer 106 because sulfur contained in ZnS were diffused into the recording layer. In addition, it was found that when a material represented by a composition formula $(SnO_2)_{1-x}(SiC)_x$ (mol %) was used for the second dielectric layer 106, the recording sensitivity and the repeated rewriting performance in 1× and 2× were both good using a material in which 0<x≦50. In addition, it was found that the recording sensitivity and the repeated rewriting performance in 1× and 2× were both good also when another compound is added to $SnO_2$—SiC.

EXAMPLE A-6

As a sixth example A, the information recording medium 32 shown in FIG. 6 was made, and the same experiment as the second example A was performed.

The sample was made in the method as described below. First, a polycarbonate substrate (having a diameter of 120 mm and a thickness 0.6 mm) was prepared as the substrate 26, on which a guide groove (having a depth of 40 nm and a track pitch 0.344 μm) was formed for leading the laser beam 11. Then, a $(ZnS)_{80}(SiO_2)_{20}$ layer (having a thickness of 40 nm) as the third dielectric layer 202, a $(ZrO_2)_{25}(SiO_2)_{25}(Cr_2O_3)_{50}$ layer (having a thickness of 5 nm) as the third interface layer 203, a $Ge_{28}Sn_3Bi_2Te_{34}$ layer (having a thickness of 6 nm) as the first recording layer 204, a $(ZrO_2)_{25}(SiO_2)_{25}(Ga_2O_3)_{50}$ layer (having a thickness of 10 nm) as the fourth interface layer 205, an Ag—Pd—Cu layer (having a thickness of 10 nm) as the first reflecting layer 208, and a $TiO_2$ layer (having a thickness of 20 nm) as the transmittance adjusting layer 209 were deposited in sequence on the polycarbonate substrate by the sputtering method.

In addition, a polycarbonate substrate (having a diameter of 120 mm and a thickness 0.58 mm) was prepared as the substrate 30, on which a guide groove (having a depth of 40 nm and a track pitch 0.344 μm) was formed for leading the laser beam 11. Then, an Ag—Pd—Cu layer (having a thickness of 80 nm) as the second reflecting layer 208, the second dielectric layer 306 (having a thickness of 10-20 nm), a $Ge_{28}Sn_3Bi_2Te_{34}$ layer (having a thickness of 10 nm) as the second recording layer 304, a $(ZrO_2)_{50}(Cr_2O_3)_{50}$ layer (having a thickness of 5 nm) as the first interface layer 303, and a $(ZnS)_{80}(SiO_2)_{20}$ layer (having a thickness of 60 nm) as the first dielectric layer 302 were deposited in sequence on the polycarbonate substrate by the sputtering method.

After that, an ultraviolet curing resin was applied onto the first dielectric layer 302 of the substrate 30, and the transmittance adjusting layer 209 of the substrate 26 was brought into intimate contact with the substrate 30 to be rotated for forming a uniform resin layer (having a thickness of 20 μm). Then, ultraviolet rays were applied to cure the resin so that the substrate 26 and the substrate 30 were glued to each other via the adhesive layer 27. Finally, an initialization process was performed for crystallizing the entire surface of the second recording layer 304 and the first recording layer 204 by a laser beam.

About these samples obtained by the above-mentioned method, the recording sensitivity and the repeated rewriting performance of the second information layer 25 of the information recording medium 32 were measured by the same method as the second example A. On this occasion, a wavelength of the laser beam 11 was set to 405 nm, a numerical aperture NA of the objective lens 34 was set to 0.65, a line speed of the sample during measurement was set to 8.6 m/second and 17.2 m/second, and the shortest mark length was set to 0.294 μm. In addition, information was recorded in grooves.

As a result, in the same manner as the second example A, it was found that the repeated rewriting performance in 1× and 2× was not good when $(ZnS)_{80}(SiO_2)_{20}$ was used for the second dielectric layer 306 because sulfur contained in ZnS were diffused into the recording layer. In addition, it was found that when a material represented by a composition formula $(SnO_2)_{1-x}(SiC)_x$ (mol %) was used for the second dielectric layer 306, the recording sensitivity and the repeated rewriting performance in 1× and 2× were both good using a material in which $0<x\leqq50$. In addition, it was found that the recording sensitivity and the repeated rewriting performance in 1× and 2× were both good also when another compound is added to $SnO_2$—SiC.

EXAMPLE A-7

When the second interface layer 105 was arranged in the fifth example A, the repeated rewriting number of times of the information layer 16 of the information recording medium 29 was improved. In the same way, when the second interface layer 305 was arranged in the Example A-6, the repeated rewriting number of times of the second information layer 25 of the information recording medium 32 was improved. Note that it was found that it was preferable that the second interface layer 105 and the second interface layer 305 were made of a material containing at least one of elements of the group consisting of Zr, Hf, Y and Si as well as at least one of elements of the group consisting of Ga and Cr as well as O. In this case, it was also found that it was preferable that they were made of a material containing at least one oxide selected from the group consisting of $ZrO_2$, $HfO_2$, $Y_2O_3$ and $SiO_2$ as well as at least one oxide selected from the group consisting of $Ga_2O_3$ and $Cr_2O_3$.

EXAMPLE A-8

As an eighth example A, the information recording medium 32 shown in FIG. 6 was produced, and then the same experiment as the fourth example A was performed.

The samples were made in the method as described below. First, a polycarbonate substrate (having a diameter of 120 mm and a thickness 0.6 mm) was prepared as the substrate 26, on which a guide groove (having a depth of 40 nm and a track pitch 0.344 μm) was formed for leading the laser beam 11. Then, a $(ZnS)_{80}(SiO_2)_{20}$ layer (having a thickness of 40 nm) as the third dielectric layer 202, a $(ZrO_2)_{25}(SiO_2)_{25}(Cr_2O_3)_{50}$ layer (having a thickness of 5 nm) as the third interface layer 203, a $Ge_{28}Sn_3Bi_2Te_{34}$ layer (having a thickness of 6 nm) as the first recording layer 204, a $(ZrO_2)_{25}(SiO_2)_{25}(Ga_2O_3)_{50}$ layer (having a thickness of 5 nm) as the fourth interface layer 205, the fourth dielectric layer 206 (having a thickness of 5 nm), an Ag—Pd—Cu layer (having a thickness of 10 nm) as the first reflecting layer 208, and a $TiO_2$ layer (having a thickness of 20 nm) as the transmittance adjusting layer 209 were deposited in sequence on the polycarbonate substrate by the sputtering method.

In addition, a polycarbonate substrate (having a diameter of 120 mm and a thickness 0.58 mm) was prepared as the substrate 30, on which a guide groove (having a depth of 40 nm and a track pitch 0.344 μm) was formed for leading the laser beam 11. Then, an Ag—Pd—Cu layer (having a thickness of 80 nm) as the second reflecting layer 308, a $(SnO_2)_{80}(SiC)_{20}$ layer (having a thickness of 15 nm) as the second dielectric layer 306, a $(ZrO_2)_{25}(SiO_2)_{25}(Ga_2O_3)_{50}$ layer (having a thickness of 5 nm) as the second interface layer 305, a $Ge_{28}Sn_3Bi_2Te_{34}$ layer (having a thickness of 10 nm) as the second recording layer 304, a $(ZrO_2)_{25}(SiO_2)_{25}(Cr_2O_3)_{50}$ layer (having a thickness of 5 nm) as the first interface layer 303, and a $(ZnS)_{80}(SiO_2)_{20}$ layer (having a thickness of 60 nm) as the first dielectric layer 302 were deposited in sequence on the polycarbonate substrate by the sputtering method.

After that, an ultraviolet curing resin was applied onto the first dielectric layer 302 of the substrate 30, and the transmittance adjusting layer 209 of the substrate 26 was brought into intimate contact with the substrate 30 to be rotated for forming a uniform resin layer (having a thickness of 20 μm). Then, ultraviolet rays were applied to cure the resin so that the substrate 26 and the substrate 30 were glued to each other via the adhesive layer 27. Finally, an initialization process was performed for crystallizing the entire surface of the second recording layer 304 and the first recording layer 204 by a laser beam.

About these samples obtained by the above-mentioned method, the recording sensitivity and the repeated rewriting performance of the first information layer 23 of the information recording medium 32 were measured by the same method as the fourth example A. On this occasion, a wavelength of the laser beam 11 was set to 405 nm, a numerical aperture NA of the objective lens 34 was set to 0.65, a line speed of the sample during measurement was set to 8.6 m/second and 17.2 m/second, and the shortest mark length was set to 0.294 μm. In addition, information was recorded in grooves.

As a result, in the same manner as the fourth example A, it was found that the repeated rewriting performance in 1× and 2× was not good when $(ZnS)_{80}(SiO_2)_{20}$ was used for the fourth dielectric layer 206 because sulfur contained in ZnS were diffused into the recording layer. In addition, it was found that when a material represented by a composition formula $(SnO_2)_{1-x}(SiC)_x$ (mol %) was used for the fourth dielectric layer 206, the recording sensitivity and the repeated rewriting performance in 1× and 2× were both good using a material in which $0<x\leqq50$. In addition, it was found that the recording sensitivity and the repeated rewriting performance in 1× and 2× were both good also when another compound is added to $SnO_2$—SiC.

EXAMPLE A-9

In the first example A through the eighth example A, a material that is represented by a composition formula one of formulas (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2Te_3$ and (Ge—Sn)Te—(Sb—Bi)$_2Te_3$ is used for the recording layer 104 or the second recording layer 304. Consequently, the same result was obtained.

EXAMPLE A-10

As the tenth example A, the electrical information recording medium 44 shown in FIG. 8 was produced, and then the phase change due to application of electric current was checked.

A Si substrate on which a nitriding process is performed was prepared as the substrate 39. Then a Pt layer as the lower electrode 40 having an area of 6 μm×6 μm and a thickness of 0.1 μm, a $(SnO_2)_{80}(SiC)_{20}$ layer as the first dielectric layer 401 having an area of 4.5 μm×5 μm and a thickness of 0.01 μm, a $Ge_{22}Bi_2Te_{25}$ layer as the first recording layer 41 having an area of 5 μm×5 μm and a thickness of 0.1 μm, a $Sb_{70}Te_{25}Ge_5$ layer as the second recording layer 42 having an area of 5 μm×5 μm and a thickness of 0.1 μm, a $(SnO_2)_{80}(SiC)_{20}$ layer as the second dielectric layer 402 having an area of 4.5 μm×5 μm and a thickness of 0.01 μm, a Pt layer as the upper electrode 43 having an area of 5 μm×5 μm and a thickness of 0.1 μm were deposited on the substrate in sequence by the sputtering method. The first dielectric layer 401 and the second dielectric layer 402 are insulators. Therefore, in order to supply current to the first recording layer 41 and the second recording layer 42, the first dielectric layer 401 and the second dielectric layer 402 are formed in a smaller area than the first recording layer 41 and the second recording layer 42, so that portions for contacting the lower electrode 40, the first recording layer 41, the second recording layer 42 and the upper electrode 43 is secured.

After that, Au lead wires were bonded to the lower electrode 40 and the upper electrode 43 so that the electrical information recording and reproducing device 50 was connected to the electrical information recording medium 44 via the application portion 45. This electrical information recording and reproducing device 50 enables the pulse power source 48 to be connected across the lower electrode 40 and the upper electrode 43 via the switch 47. Furthermore, changes of resistance values of the first recording layer 41 and the second recording layer 42 due to the phase change can be detected by the resistance measuring device 46 that is connected across the lower electrode 40 and the upper electrode 43 via the switch 49.

Here, a melting point $T_{m1}$ of the first recording layer 41 is 630 degrees Celsius, a crystallization temperature $T_{x1}$ is 170 degrees Celsius, and a crystallization time $t_{x1}$ is 100 ns. In addition, a melting point $T_{m2}$ of the second recording layer 42 is 550 degrees Celsius, a crystallization temperature $T_{x2}$ is 200 degrees Celsius, a crystallization time $t_{x2}$ is 50 ns. Furthermore, a resistance value $r_{a1}$ is 500 ohms when the first recording layer 41 is in the amorphous phase, a resistance value $r_{c1}$ is 10 ohms when the first recording layer 41 is in the crystalline phase, a resistance value $r_{a2}$ is 800 ohms when the second recording layer 42 is in the amorphous phase, and a resistance value $r_{c2}$ is 20 ohms when the second recording layer 42 is in the crystalline phase.

When the first recording layer 41 and the second recording layer 42 are both in a first state that is the amorphous phase, a current pulse having $I_{c1}$=5 mA and $t_{c1}$=150 ns in the recording waveform 501 shown in FIG. 11 was applied across the lower electrode 40 and the upper electrode 43. Then, only the first recording layer 41 changed from the amorphous phase to the crystalline phase (hereinafter, referred to as a second state). Furthermore, in the first state a current pulse having $I_{c2}$=10 mA and $t_{c2}$=100 ns in the recording waveform 502 shown in FIG. 11 was applied across the lower electrode 40 and the upper electrode 43. Then, only the second recording layer 42 changed from the amorphous phase to the crystalline phase (hereinafter, referred to as a third state). Furthermore, in the first state a current pulse having $I_{c2}$=10 mA and $t_{c1}$=150 ns in the recording waveform 503 shown in FIG. 11 was applied across the lower electrode 40 and the upper electrode 43. Then, both the first recording layer 41 and the second recording layer 42 changed from the amorphous phase to the crystalline phase (hereinafter, referred to as a fourth state).

Next, when both the first recording layer 41 and the second recording layer 42 were in the fourth state that is the crystalline phase and the low resistance state, a current pulse having $I_{a1}$=20 mA, $I_{c2}$=10 mA and $t_{a2}$=100 ns in the recording waveform 504 shown in FIG. 11 was applied across the lower electrode 40 and the upper electrode 43. Then, only the first recording layer 41 changed from the crystalline phase to the amorphous phase (the third state). Furthermore, in the fourth state a current pulse having $I_{a2}$=15 mA and $t_{a2}$=50 ns in the recording waveform 505 shown in FIG. 11 was applied across the lower electrode 40 and the upper electrode 43. Then, only the second recording layer 42 changed from the crystalline phase to the amorphous phase (the second state). Furthermore, in the fourth state a current pulse having $I_{a1}$=20 mA and $t_{a1}$=50 ns in the erasing waveform 506 shown in FIG. 11 was applied across the lower electrode 40 and the upper electrode 43. Then, both the first recording layer 41 and the second recording layer 42 changed from the crystalline phase to the amorphous phase (the first state).

Furthermore, in the second state or the third state a current pulse having $I_{c2}$=10 mA and $t_{c1}$=150 ns in the recording waveform 503 shown in FIG. 11 was applied. Then, both the first recording layer 41 and the second recording layer 42 changed from the amorphous phase to the crystalline phase (the fourth state). Furthermore, in the second state or the third state a current pulse having $I_{a1}$=20 mA, $I_{c2}$=10 mA, $t_{c1}$=150 ns, and $t_{a1}$=50 ns in the erasing waveform 507 shown in FIG. 11 was applied. Then, both the first recording layer 41 and the second recording layer 42 changed from the crystalline phase to the amorphous phase (the first state). Furthermore, in the second state a current pulse having $I_{a1}$=20 mA, $I_{c2}$=10 mA, $t_{c2}$=100 ns, and $t_{a1}$=50 ns in the recording waveform 508 shown in FIG. 11 was applied. Then, the first recording layer 41 changed from the crystalline phase to the amorphous phase, while the second recording layer 42 changed from the amorphous phase to the crystalline phase (the third state). Furthermore, in the third state a current pulse having $I_{a2}$=15 mA, $I_{c1}$=5 mA, $t_{c2}$=150 ns, and $t_{a2}$=50 ns in the recording waveform 509 shown in FIG. 11 was applied. Then, the first recording layer 41 changed from the amorphous phase to the crystalline phase, while the second recording layer 42 changed from the crystalline phase to the amorphous phase (the second state).

From the results described above, it was found that each of the first recording layer 41 and the second recording layer 42 can be changed electrically and reversibly between the crystalline phase and the amorphous phase in the electric phase-change type information recording medium 44 shown in FIG. 8. Thus, four states can be realized. The first state is the sate where both the first recording layer 41 and the second recording layer 42 are in the amorphous phase. The second state is the sate where the first recording layer 41 is in the crystalline phase, while the second recording layer 42 in the amorphous phase. The third state is the sate where the first recording layer 41 is in the amorphous phase, while the second recording layer 42 is in the crystalline phase. The fourth state is the sate where both the first recording layer 41 and the second recording layer 42 are in the crystalline phase.

In addition, the repeated rewriting number of times of the electric phase-change type information recording medium 44 was measured. Then, it was found that the repeated rewriting number of times was improved by ten times or more compared with the case where the first dielectric layer 401 and the second dielectric layer 402 are not provided. This is because the first dielectric layer 401 and the second dielectric layer 402 suppress material transfer from the lower electrode 40 and the upper electrode 43 to the first recording layer 41 and the second recording layer 42, respectively.

EXAMPLES B

The present invention will be described in more detail.

First, concerning the target made of an oxide-carbide system material layer that is used for depositing the dielectric layer of the information recording medium according to the present invention, a relationship between a nominal composition (namely, a composition disclosed by a manufacturer of the target for provision) and an analyzed composition was checked by a test in advance.

In this test, a sputtering target that is disclosed to have a nominal composition of $(SnO_2)_{40}(Ga_2O_3)_{40}(SiC)_{20}$ (mol %) that corresponds to the composition formula (11) was used as an example. This sputtering target was grained to powder, and a composition analysis was performed by an x-ray micro analyzer method. As a result, an analyzed composition of the sputtering target was obtained as an composition formula expressed in ratio of elements (atom %). The analysis result is shown in Table 7. Furthermore, Table 7 also shows a conversion composition that is an element composition calculated from the nominal composition.

TABLE 7

| Nominal composition (mol %): $(SnO_2)_{40}(Ga_2O_3)_{40}(SiC)_{20}$ Composition analysis of material layer: $Sn_{11.1}Ga_{22.2}O_{55.5}Si_{5.6}C_{5.6}$ | Composition analysis of material layer Analyzed composition (atom %): $Sn_{10.2}Ga_{23.1}O_{56.4}Si_{5.1}C_{5.2}$ |
|---|---|

As shown in Table 7, the analyzed composition was substantially the same as the conversion composition. From this result, it was confirmed that the actual composition of the sputtering target represented by a composition formula (3) and the formula (4) (namely, the analyzed composition) is substantially identical to the element composition determined by the calculation (namely, the conversion composition), which means the nominal composition is correct. Therefore, the composition of the sputtering target is represented by the nominal composition (mol %) in the following examples. In addition, it was considered there was no problem if the nominal composition of the sputtering target is regarded as the composition (mol %) of the oxide-carbide system material layer formed by using the sputtering target by the sputtering method. Therefore, the composition of the layer formed by using the sputtering target was regarded to be the disclosed composition of the sputtering target in the following examples.

EXAMPLE B-1

In a first example, the first dielectric layer 2 and the second dielectric layer 6 were formed by using the sputtering target whose nominal composition is represented by $(SnO_2)_{95}(SiC)_5$ (mol %) in the information recording medium described in the eleventh embodiment with reference to FIG. 13. The first dielectric layer 2 and the second dielectric layer 6 were made of the same material. Hereinafter, a method for manufacturing the information recording medium of this example will be described. In the following description, reference numerals that are the same as the structuring elements shown in FIG. 13 will be used.

First, as the substrate 1, a disk-like polycarbonate substrate having a diameter of 120 mm and a thickness of 0.6 mm was prepared on which a guide groove was formed on one surface in advance, the guide groove having a depth of 56 nm and a track pitch of 0.615 μm that is a distance between centers of the groove surface and the land surface on the plane that is parallel with a main surface of the substrate 1.

On the substrate 1, there were deposited a first dielectric layer 2 having a thickness of 145 nm, a recording layer 4 having a thickness of 8 nm, a second dielectric layer 6 having a thickness of 45 nm, a light absorption adjusting layer 7 having a thickness of 40 nm, and a reflecting layer 8 having a thickness of 80 nm in this order by the sputtering method and the method that will be described below.

As a material that constitutes the first dielectric layer 2 and the second dielectric layer 6, $(SnO_2)_{95}(SiC)_5$ (mol %) was used.

In the step for forming the first dielectric layer 2 and the second dielectric layer 6, the sputtering target containing the above-mentioned material (having a diameter of 100 mm and a thickness of 6 mm) was attached to the deposition device, and high frequency sputtering was performed for deposition under the pressure of 0.13 Pa.

The step for forming the recording layer 4 was performed by setting a sputtering target (having a diameter of 100 mm and a thickness of 6 mm) made of a Ge—Sn—Sb—Te system material in which a part of Ge is replaced with Sn in the GeTe—$Sb_2Te_3$ quasi-binary system composition to the deposition device, and by direct current sputtering under 0.13 Pa. The composition of the recording layer was $Ge_{27}Sn_8Sb_{12}Te_{53}$ (atom %).

The step for forming the light absorption adjusting layer 7 was performed by setting a sputtering target (having a diameter of 100 mm and a thickness of 6 mm) made of a material having a composition $Ge_{80}Cr_{20}$ (atom %) to the deposition device and by direct current sputtering under approximately 0.4 Pa.

The step for forming the reflecting layer 8 was performed by setting a sputtering target (having a diameter of 100 mm and a thickness of 6 mm) made of an Ag—Pd—Cu alloy to the deposition device and by direct current sputtering under approximately 0.4 Pa.

After forming the reflecting layer 8, an ultraviolet curing resin was applied onto the reflecting layer 8. A dummy substrate 10 made of a polycarbonate having a diameter of 120 mm and a thickness of 0.6 mm is brought into intimate contact with the applied ultraviolet curing resin. Then, ultraviolet rays were applied from the side of the dummy substrate 10 to cure the resin so that they are glued.

After the gluing step mentioned above, a semiconductor laser having a wavelength of 810 nm was used for performing an initialization process so that the recording layer 4 is crystallized. When the initialization process was finished, the information recording medium was produced.

EXAMPLE B-2

The information recording medium of a second example B was produced by the process similar to the information recording medium in the first example B except that the first dielectric layer 2 and the second dielectric layer 6 were deposited by using a sputtering target represented by the nominal composition $(SnO_2)_{80}(SiC)_{20}$ (mol %).

EXAMPLE B-3

The information recording medium of a third example B was produced by the process similar to the information recording medium in the first example B except that the first dielectric layer 2 and the second dielectric layer 6 were deposited by using a sputtering target represented by the nominal composition $(SnO_2)_{60}(SiC)_{40}$ (mol %).

EXAMPLE B-4

The information recording medium of a fourth example B was produced by the process similar to the information recording medium in the first example B except that the first dielectric layer 2 and the second dielectric layer 6 were deposited by using a sputtering target represented by the nominal composition $(SnO_2)_{75}(ZrO_2)_{10}(SiC)_{15}$ (mol %).

EXAMPLE B-5

The information recording medium of a fifth example B was produced by the process similar to the information recording medium in the first example B except that the first dielectric layer 2 and the second dielectric layer 6 were deposited by using a sputtering target represented by the nominal composition $(SnO_2)_{60}(HfO_2)_{20}(SiC)_{20}$ (mol %).

EXAMPLE B-6

The information recording medium of a sixth example B was produced by the process similar to the information recording medium in the first example B except that the first dielectric layer 2 and the second dielectric layer 6 were deposited by using a sputtering target represented by the nominal composition $(SnO_2)_{50}(ZrO_2)_{40}(SiC)_{10}$ (mol %).

EXAMPLE B-7

The information recording medium of a seventh example B was produced by the process similar to the information recording medium in the first example B except that the first dielectric layer 2 and the second dielectric layer 6 were deposited by using a sputtering target represented by the nominal composition $(Ga_2O_3)_{80}(SiC)_{20}$ (mol %).

EXAMPLE B-8

The information recording medium of a eighth example B was produced by the process similar to the information recording medium in the first example B except that the first dielectric layer 2 and the second dielectric layer 6 were deposited by using a sputtering target represented by the nominal composition $(Ga_2O_3)_{70}(ZrO_2)_{15}(TaC)_{15}$ (mol %).

EXAMPLE B-9

The information recording medium of a ninth example B was produced by the process similar to the information recording medium in the first example B except that the first dielectric layer 2 and the second dielectric layer 6 were deposited by using a sputtering target represented by the nominal composition $(SnO_2)_{60}(Ga_2O_3)_{20}(SiC)_{20}$ (mol %).

EXAMPLE B-10

The information recording medium of a tenth example B was produced by the process similar to the information recording medium in the first example B except that the first dielectric layer 2 and the second dielectric layer 6 were deposited by using a sputtering target represented by the nominal composition $(SnO_2)_{40}(Ga_2O_3)_{40}(SiC)_{20}$ (mol %).

EXAMPLE B-11

The information recording medium of an eleventh example B was produced by the process similar to the information recording medium in the first example B except that the first dielectric layer 2 and the second dielectric layer 6 were deposited by using a sputtering target represented by the nominal composition $(SnO_2)_{20}(Ga_2O_3)_{60}(SiC)_{20}$ (mol %).

EXAMPLE B-12

The information recording medium of a twelfth example B was produced by the process similar to the information recording medium in the first example B except that the first dielectric layer 2 and the second dielectric layer 6 were deposited by using a sputtering target represented by the nominal composition $(SnO_2)_{40}(Ga_2O_3)_{40}(ZrO_2)_{10}(TiC)_{10}$ (mol %).

EXAMPLE B-13

The information recording medium of a thirteenth example B was produced by the process similar to the information recording medium in the first example B except that the first dielectric layer 2 and the second dielectric layer 6 were deposited by using a sputtering target represented by the nominal composition $(SnO_2)_{60}(Ga_2O_3)_{20}(ZrO_2)_{5}(SiC)_{15}$ (mol %).

COMPARISON EXAMPLE 1

As an information recording medium of a first comparison example, an information recording medium having a structure shown in FIG. 17 was manufactured. Here, the first dielectric layer 102 and the second dielectric layer 106 were deposited by using a sputtering target represented by $(ZnS)_{80}(SiO_2)_{20}$ (mol %). In addition, the first interface layer 103 and the second interface layer 105 were made of $ZrO_2$—$SiO_2$—$Cr_2O_3$ to be layers having a thickness of 5 nm.

The first dielectric layer 102 and the second dielectric layer 106 were formed by using a sputtering target (having a diameter of 100 mm and a thickness of 6 mm) made of $(ZnS)_{80}(SiO_2)_{20}$ (mol %) under pressure of 0.13 Pa by high frequency sputtering.

The first interface layer 103 and the second interface layer 105 were formed by setting a sputtering target (having a diameter of 100 mm and a thickness of 6 mm) made of a material having a composition $(ZrO_2)_{25}(SiO_2)_{25}(CrO_2)_{50}$ (mol %) to the deposition device and by high frequency sputtering. The other light absorption adjusting layer 7, the reflecting layer 8 and gluing with the dummy substrate 10 are the same as the case of the information recording medium in the first example.

COMPARISON EXAMPLE 2

The information recording medium of a second comparison example was produced by the process similar to the information recording medium in the first example B except that the first dielectric layer 2 and the second dielectric layer 6 were deposited by using a sputtering target represented by the nominal composition $SnO_2$ only.

COMPARISON EXAMPLE 3

The information recording medium of a third comparison example was produced by the process similar to the information recording medium in the first example B except that the first dielectric layer 2 and the second dielectric layer 6 were deposited by using a sputtering target represented by the nominal composition $Ga_2O_3$ only.

COMPARISON EXAMPLE 4

The information recording medium of a fourth comparison example was produced by the process similar to the information recording medium in the first example B except that the first dielectric layer 2 and the second dielectric layer 6 were deposited by using a sputtering target represented by the nominal composition SiC only.

COMPARISON EXAMPLE 5

The information recording medium of a fifth comparison example was produced by the process similar to the information recording medium in the first example B except that the first dielectric layer 2 and the second dielectric layer 6 were deposited by using a sputtering target represented by the nominal composition $(SnO_2)_{50}(Ga_2O_3)_{50}$ (mol %).

COMPARISON EXAMPLE 6

The information recording medium of a sixth comparison example was produced by the process similar to the information recording medium in the first example B except that the first dielectric layer 2 and the second dielectric layer 6 were deposited by using a sputtering target represented by the nominal composition $(SnO_2)_{80}(ZrO_2)_{20}$ (mol %).

Next, the information recording media of the above first through the thirteenth examples and the first through the fifth comparison examples were evaluated. Hereinafter, a method of the evaluation will be described. As items of evaluation, three items (1) adhesiveness between the dielectric layer and the recording layer, (2) recording sensitivity and (3) rewriting performance were evaluated.

First, the adhesiveness of the item (1) was evaluated by checking whether or not there was an exfoliation under a condition of high temperature and high humidity. More specifically, the information recording medium after the initialization process was placed in a chamber at a temperature of 90 degrees Celsius and a relative humidity of 80% for 100 hours, and after that it was checked by an optical microscope whether or not an exfoliation is generated at one or more of interfaces between the recording layer 4 and dielectric layers 2 and 6.

The recording sensitivity of the item (2) and the repeated rewriting performance of the item (3) are evaluated by using a recording and reproducing evaluation device for checking an optimal power and the repeated rewriting number at the recording power.

The signal evaluation of the information recording medium was performed by using an information recording system having an ordinary structure including a spindle motor for rotating the information recording medium, an optical head with a semiconductor laser for emitting a laser beam and an objective lens for focusing the laser beam on the recording layer 4 of the information recording medium. More specifically, a record corresponding to approximately 4.7 GB was performed by using a semiconductor laser having a wavelength of 660 nm and an objective lens having a numerical aperture of 0.6. On this occasion, the line speed of rotating the information recording medium was set to 8.2 m/sec. In addition, a time interval analyzer was used for measuring jitter values so as to calculate an average jitter value that will be described later.

First, a peak power (Pp) and a bias power (Pb) were set in the following procedure so as to determine a measurement condition for determining the number of repeating times. Using the above-mentioned system, a power of the laser beam was modulated between the peak power (mW) that is a high power level and the bias power (mW) that is a low power level power, and the laser beam is applied to the information recording medium so that a random signal having a mark length within the range of 0.42 μm (3T) to 1.96 μm (14T) was recorded ten times in the same groove surface of the recording layer 4 (as groove record). Then, a jitter value of leading edges (a jitter at the leading edge portion of a record mark) and a jitter value of trailing edges (a jitter at the trailing edge portion of a record mark) were measured so as to calculate an average value of them as the average jitter value. The average jitter value was measured under record conditions in which the peak power was changed variously while the bias power was fixed to a constant value. The peak power was increased gradually, and a power of 1.3 times the peak power was determined to be a temporary Pp1 when the average jitter value of the random signal reached the value of 13%. Next, the average jitter value was measured under record conditions in which the bias power was changed variously while the peak power was fixed to Pp1. Then, the mean value of the upper limit value and the lower limit value of the bias power was set to Pb when the average jitter value of the random signal became a value of 13% or less. The average jitter value was measured under record conditions in which the peak power was changed variously while the bias power was fixed to Pb. The peak power was gradually increased, and a power of 1.3 times the peak power was set to Pp when the average jitter value of the random signal reached the value of 13%. When recording was performed under the condition of Pp and Pb set as described above, the average jitter value within the range of 8-9% was obtained after ten times of repeated recording, for example. Considering the upper limit value of the laser power in the system, it is desirable that the relationships $Pp \leq 14$ mW and $Pb \leq 8$ mW are satisfied.

The repeated number was determined in accordance with the average jitter value in this example. The laser beam whose power was modulated between Pp and Pb set as described above was applied to the information recording medium so as to record the random signal having a mark length within the range of 0.42 μm (3T) to 1.96 μm (14T) (as groove record) in the same groove surface repeatedly a predetermined times, and then the average jitter value were measured. The average jitter value was measured when the repeated number was 1, 2, 3, 5, 10, 100, 200 and 500 times, and every 1,000 times over 1,000 times up to 10,000 times. The repeated rewriting performance was evaluated by the repeated number when the average jitter value reached 13%. The larger the repeated number is, the higher the repeated rewriting performance is. It is preferable that the repeated number is more than or equal to 10,000 times, more preferably 10,000 times when the information recording medium is used for an image and sound recorder.

TABLE 8

|  |  | Nominal composition (mol %) | Conversion composition (atom %) | Exfoliation | Pp (mW) | Rewriting Performance |
|---|---|---|---|---|---|---|
| Example B | 1 | $(SnO_2)_{95}(SiC)_5$ | $Sn_{32.2}O_{64.4}Si_{1.7}C_{1.7}$ | Non | 12.9 | ○ |
|  | 2 | $(SnO_2)_{80}(SiC)_{20}$ | $Sn_{28.6}O_{57.1}Si_{7.1}C_{7.1}$ | Non | 11.7 | ○ |
|  | 3 | $(SnO_2)_{60}(SiC)_{40}$ | $Sn_{23.1}O_{46.2}Si_{15.4}C_{15.4}$ | Non | 10.8 | ○ |
|  | 4 | $(SnO_2)_{75}(ZrO_2)_{10}(SiC)_{15}$ | $Sn_{26.3}Zr_{3.5}O_{59.6}Si_{5.3}C_{5.3}$ | Non | 12.0 | ○ |
|  | 5 | $(SnO_2)_{60}(HfO_2)_{20}(SiC)_{20}$ | $Sn_{21.4}Zr_{7.1}O_{57.1}Hf_{7.1}C_{7.1}$ | Non | 12.2 | ○ |
|  | 6 | $(SnO_2)_{50}(ZrO_2)_{40}(SiC)_{10}$ | $Sn_{17.2}Zr_{13.8}O_{62.1}Si_{3.4}C_{3.4}$ | Non | 12.7 | ○ |
|  | 7 | $(Ga_2O_3)_{80}(SiC)_{20}$ | $Ga_{36.4}O_{54.5}Si_{4.5}C_{4.5}$ | Non | 13.8 | ○ |
|  | 8 | $(Ga_2O_3)_{70}(ZrO_2)_{15}(TaC)_{15}$ | $Ga_{32.9}Zr_{3.5}O_{56.5}Ta_{3.5}C_{3.5}$ | Non | 13.7 | ○ |
|  | 9 | $(SnO_2)_{60}(Ga_2O_3)_{20}(SiC)_{20}$ | $Sn_{18.8}Ga_{12.5}O_{56.3}Si_{6.3}C_{6.3}$ | Non | 12.6 | ○ |
|  | 10 | $(SnO_2)_{40}(Ga_2O_3)_{40}(SiC)_{20}$ | $Sn_{11.1}Ga_{22.2}O_{55.6}Si_{5.6}C_{5.6}$ | Non | 13.1 | ○ |
|  | 11 | $(SnO_2)_{20}(Ga_2O_3)_{60}(SiC)_{20}$ | $Sn_5Ga_{30}O_{55}Si_5C_5$ | Non | 13.2 | ○ |
|  | 12 | $(SnO_2)_{40}(Ga_2O_3)_{40}(ZrO_2)_{10}(TiC)_{10}$ | $Sn_{10.8}Ga_{21.6}Zr_{2.7}O_{59.5}Ti_{2.7}C_{2.7}$ | Non | 13.3 | ○ |
|  | 13 | $(SnO_2)_{60}(Ga_2O_3)_{20}(ZrO_2)_5(SiC)_{15}$ | $Sn_{18.5}Ga_{12.3}Zr_{1.5}O_{58.5}Si_{4.6}C_{4.6}$ | Non | 13.5 | ○ |
| Comparison Example | 1 | Seven layers as the conventional example | — | Non | 12.0 | ○ |
|  | 2 | $SnO_2$ | $Sn_{33.3}O_{66.7}$ | Non | 14.5 | Δ |
|  | 3 | $Ga_2O_3$ | $Ga_{40}O_{60}$ | Non | 14.9 | ○ |
|  | 4 | SiC | $Si_{50}C_{50}$ | Non | 14< | — |
|  | 5 | $(SnO_2)_{50}(Ga_2O_3)_{50}$ | $Sn_{12.5}Ga_{25}O_{62.5}$ | Non | 14.3 | Δ |
|  | 6 | $(SnO_2)_{80}(ZrO_2)_{20}$ | $Sn_{26.7}Zr_{6.7}O_{66.7}$ | Non | 14.7 | x |

Table 8 shows an evaluation result of (1) adhesiveness, (2) recording sensitivity and (3) rewriting performance in the information recording media of the first through the thirteenth examples and the first through the sixth comparison examples. Note that atom % of the material that was used for the dielectric layer is also shown concerning the information recording media of the first through the thirteenth examples and the second through the sixth comparison examples. Here, whether there was an exfoliation or not after the above-mentioned high temperature and high humidity test is shown as the evaluation result of the adhesiveness. The recording sensitivity shows a set peak power and evaluated to be good if it is less than or equal to 14 mW. In addition, the rewriting performance was evaluated to be x (bad) if the repeated number is less than 1,000 times, Δ if it is more than or equal to 1,000 times and less than 10,000 times, and ○ (good) if it is more than or equal to 10,000 times.

As understood from Table 8 first, if the materials of the dielectric layers 2 and 6 are $SnO_2$, $Ga_2O_3$ or SiC, the recording sensitivity was insufficient although the adhesiveness between the recording layer 4 and the dielectric layers 2 and 6 was good (see second through fourth comparison examples). In addition, as SiC itself has a large thermal conductivity, heat of record was diffused so that a power more than the set value of the evaluation optical pick up was necessary. Therefore, the recording power could not be evaluated precisely, and the rewriting performance could not be evaluated either. On the contrary, like the first through the thirteenth examples, when carbides consisting of SiC, TaC and TiC or $ZrO_2$ or $HfO_2$ was added freely to the oxides consisting of $SnO_2$ and $Ga_2O_3$ within the rage defined by the present invention, good recording sensitivity and good rewriting performance were obtained.

In addition, it was confirmed that considering the valance between the recording sensitivity and the rewriting performance, it is preferable that a ratio of the oxides consisting of $SnO_2$ and $Ga_2O$ is more than or equal to 50 mol %. It was also confirmed that considering the recording sensitivity, it is preferable that a ratio of carbides consisting of SiC, TaC and TiC is at least 5 mol % or more.

Next, an example of the information recording medium having a structure shown in the second embodiment will be described below.

EXAMPLE B-14

The information recording medium of this example is an information recording medium described in the eleventh embodiment with reference to FIG. 14. The first dielectric layer 102 was formed by using $(ZnS)_{80}(SiO_2)_{20}$ (mol %), and the first interface layer 103 was formed by using $ZrO_2$—$SiO_2$—$Cr_2O_3$ to have a thickness within the range of 2-5 nm. Other structures are the same as the case of the information recording medium in the first example. In the fourteenth example, the second dielectric layer 6 that is arranged to be adjacent to the recording layer 4 was formed by using the sputtering target of the material that was used in the first example B.

EXAMPLE B-15

The information recording medium of a fifteenth example B was produced in the same manner as the case of the information recording medium in the second example B except that the second dielectric layer 6 was formed by using the sputtering target of the material that was used in the second example B.

EXAMPLE B-16

The information recording medium of a sixteenth example B was produced in the same manner as the case of the information recording medium in the third example B except that the second dielectric layer 6 was formed by using the sputtering target of the material that was used in the third example.

EXAMPLE B-17

The information recording medium of a seventeenth example B was produced in the same manner as the case of the information recording medium in the fourteenth example B except that the second dielectric layer 6 was formed by using the sputtering target of the material that was used in the fourth example.

EXAMPLE B-18

The information recording medium of an eighteenth example B was produced in the same manner as the case of the information recording medium in the fourteenth example B except that the second dielectric layer 6 was formed by using the sputtering target of the material that was used in the fifth example.

EXAMPLE B-19

The information recording medium of a nineteenth example B was produced in the same manner as the case of the information recording medium in the fourteenth example B except that the second dielectric layer 6 was formed by using the sputtering target of the material that was used in the seventh example.

EXAMPLE B-20

The information recording medium of a twentieth example B was produced in the same manner as the case of the information recording medium in the fourteenth example B except that the second dielectric layer 6 was formed by using the sputtering target of the material that was used in the ninth example.

EXAMPLE B-21

The information recording medium of a twenty-first example B was produced in the same manner as the case of the information recording medium in the fourteenth example B except that the second dielectric layer 6 was formed by using the sputtering target of the material that was used in the tenth example.

EXAMPLE B-22

The information recording medium of a twenty-second example B was produced in the same manner as the case of the information recording medium in the fourteenth example B except that the second dielectric layer 6 was formed by using the sputtering target represented by the nominal composition $(SnO_2)_{40}(Ga_2O_3)_{40}(TaC)_{20}$ (mol %).

EXAMPLE B-23

The information recording medium of a twenty-third example B was produced in the same manner as the case of the information recording medium in the fourteenth example B except that the second dielectric layer 6 was formed by using the sputtering target of the material that was used in the twelfth example.

EXAMPLE B-24

The information recording medium of a twenty-fourth example B was produced in the same manner as the case of the information recording medium in the fourteenth example B except that the second dielectric layer 6 was formed by using the sputtering target of the material that was used in the thirteenth example.

COMPARISON EXAMPLE 7

The information recording medium of a seventh comparison example was produced in the same manner as the case of the information recording medium in the fourteenth example B except that the second dielectric layer 6 was formed by using the sputtering target of the material that was used in the second comparison example.

COMPARISON EXAMPLE 8

The information recording medium of an eighth comparison example was produced in the same manner as the case of the information recording medium in the fourteenth example B except that the second dielectric layer 6 was formed by using the sputtering target of the material that was used in the third comparison example.

COMPARISON EXAMPLE 9

The information recording medium of a ninth comparison example was produced in the same manner as the case of the information recording medium in the fourteenth example B except that the second dielectric layer 6 was formed by using the sputtering target of the material that was used in the fourth comparison example.

COMPARISON EXAMPLE 10

The information recording medium of a tenth comparison example was produced in the same manner as the case of the information recording medium in the fourteenth example B except that the second dielectric layer 6 was formed by using the sputtering target of the material that was used in the fifth comparison example.

COMPARISON EXAMPLE 11

The information recording medium of an eleventh comparison example was produced in the same manner as the case of the information recording medium in the fourteenth example B except that the second dielectric layer 6 was formed by using the sputtering target of the material that was used in the sixth comparison example.

TABLE 9

|  |  | Nominal composition (mol %) | Conversion composition (atom %) | Exfoliation | Pp (mW) | Rewriting performance |
|---|---|---|---|---|---|---|
| Example B | 14 | $(SnO_2)_{95}(SiC)_5$ | $Sn_{32.2}O_{64.4}Si_{1.7}C_{1.7}$ | Non | 12.1 | ○ |
|  | 15 | $(SnO_2)_{80}(SiC)_{20}$ | $Sn_{28.6}O_{57.1}Si_{7.1}C_{7.1}$ | Non | 10.8 | ○ |
|  | 16 | $(SnO_2)_{60}(SiC)_{40}$ | $Sn_{23.1}O_{46.2}Si_{15.4}C_{15.4}$ | Non | 10.3 | ○ |
|  | 17 | $(SnO_2)_{75}(ZrO_2)_{10}(SiC)_{15}$ | $Sn_{26.3}Zr_{3.5}O_{59.6}Si_{5.3}C_{5.3}$ | Non | 11.3 | ○ |
|  | 18 | $(SnO_2)_{60}(HfO_2)_{20}(SiC)_{20}$ | $Sn_{21.4}Zr_{7.1}O_{57.1}Hf_{7.1}C_{7.1}$ | Non | 11.5 | ○ |
|  | 19 | $(Ga_2O_3)_{80}(SiC)_{20}$ | $Ga_{36.4}O_{54.5}Si_{4.5}C_{4.5}$ | Non | 13.7 | ○ |
|  | 20 | $(SnO_2)_{60}(Ga_2O_3)_{20}(SiC)_{20}$ | $Sn_{18.8}Ga_{12.5}O_{56.3}Si_{6.3}C_{6.3}$ | Non | 11.9 | ○ |
|  | 21 | $(SnO_2)_{40}(Ga_2O_3)_{40}(SiC)_{20}$ | $Sn_{11.1}Ga_{22.2}O_{55.6}Si_{5.6}C_{5.6}$ | Non | 12.2 | ○ |

TABLE 9-continued

| | | Nominal composition (mol %) | Conversion composition (atom %) | Exfoliation | Pp (mW) | Rewriting performance |
|---|---|---|---|---|---|---|
| | 22 | $(SnO_2)_{40}(Ga_2O_3)_{40}(TaC)_{20}$ | $Sn_{11.1}Ga_{22.2}O_{55.6}Ta_{5.6}C_{5.6}$ | Non | 12.6 | ○ |
| | 23 | $(SnO_2)_{40}(Ga_2O_3)_{40}(ZrO_2)_{10}(TiC)_{10}$ | $Sn_{10.8}Ga_{21.6}Zr_{2.7}O_{59.5}Ti_{2.7}C_{2.7}$ | Non | 12.8 | ○ |
| | 24 | $(SnO_2)_{60}(Ga_2O_3)_{20}(ZrO_2)_5(SiC)_{15}$ | $Sn_{18.5}Ga_{12.3}Zr_{1.5}O_{58.5}Si_{4.6}C_{4.6}$ | Non | 12.5 | ○ |
| Comparison Example | 7 | $SnO_2$ | $Sn_{33.3}O_{66.7}$ | Non | 14.5 | Δ |
| | 8 | $Ga_2O_3$ | $Ga_{40}O_{60}$ | Non | 14.8 | ○ |
| | 9 | SiC | $Si_{50}C_{50}$ | Non | 14< | — |
| | 10 | $(SnO_2)_{50}(Ga_2O_3)_{50}$ | $Sn_{12.5}Ga_{25}O_{62.5}$ | Non | 13.7 | Δ |
| | 11 | $(SnO_2)_{80}(ZrO_2)_{20}$ | $Sn_{26.7}Zr_{6.7}O_{66.7}$ | Non | 14.2 | x |

Table 9 shows (1) adhesiveness, (2) recording sensitivity and (3) rewriting performance in the information recording media of the fourteenth through the twenty-fourth examples and the seventh through the eleventh comparison examples. Criteria of expression here is the same as the Table 8.

As understood from Table 9, the case where the first dielectric layer 102 and the interface layer 103 were provided between the substrate 1 and the recording layer 4 and the material of the present invention was used only for the second dielectric layer 6 had substantially the same tendency as Table 8. Namely, in the case of $SnO_2$, $Ga_2O_3$ and a mixture thereof or $SnO_2$, $ZrO_2$ and a mixture thereof and single SiC, the adhesiveness between the recording layer 4 and the dielectric layers 102 and 6 was good, but it was insufficient for both good recording sensitivity and good rewriting performance (see seventh through eleventh comparison examples). On the contrary, as shown in fourteenth through twenty-third examples, when carbides consisting of SiC, TaC and TiC were added to oxides consisting of $SnO_2$ and $Ga_2O_3$, and further at least one oxide selected from a group consisting of $ZrO_2$ and $HfO_2$ was added within the range defined by the present invention, good recording sensitivity was obtained.

In addition, it was confirmed that considering a balance between the adhesiveness and the recording sensitivity, it was preferable that a ratio of the oxides consisting of $SnO_2$ and $Ga_2O_3$ is more than or equal to 50 mol %. It was also confirmed that considering the recording sensitivity, it was preferable that a ratio of SiC is more than or equal to 5 mol %.

As shown in the information recording media of the first through the twenty-third examples, when the above-mentioned oxide-carbide system material layer is used for the dielectric layer that is formed to be adjacent to the recording layer, the object of reducing the number of layers can be achieved and good rewriting performance can be obtained. Note that the present invention is not limited to these examples. It is sufficient that at least one of the layers that are formed to be adjacent to the recording layer is made of the above-mentioned oxide-carbide system material layer in the information recording medium according to the present invention.

EXAMPLE B-25

In the first through twenty-fourth examples, the information recording media for recording information by the optical means were made. In the twenty-fifth example, the information recording medium for recording information by the electric means as shown in FIG. 15 was made. This is a so-called memory.

The information recording medium in this example was made in the following process. First, a Si substrate 211 having a length of 5 mm, a width of 5 mm and a thickness of 1 mm with nitriding processed surface was prepared. On this substrate 211, a lower electrode 212 made of Au was formed in the area of 1.0 mm×1.0 mm to have a thickness of 0.1 μm. On the lower electrode 212, a recording layer 215 having a function as a phase change portion (hereinafter, referred to as a phase change portion 215) was formed using a material $Ge_{38}Sb_{10}Te_{52}$ (the compound is represented by $Ge_8Sb_2Te_{11}$) in a circular area having a diameter of 0.2 mm to have a thickness of 0.1 μm. Then, using a material $(SnO)_{40}(Ga_2O_3)_{40}(SiC)_{20}$ (mol %), a dielectric layer 216 having a function as a thermal insulation portion (hereinafter, referred to as a thermal insulation portion 216) was formed in an area of 0.6 mm×0.6 mm (except the phase change portion 215) to have the same thickness as the phase change portion 215. Furthermore, an upper electrode 214 made of Au was formed in an area of 0.6 mm×0.6 mm to have a thickness of 0.1 μm. The lower electrode 212, the phase change portion 215, the thermal insulation portion 216 and the upper electrode 214 were formed by the sputtering method.

In the step for depositing the phase change portion 215, a sputtering target (having a diameter of 100 mm and a thickness of 6 mm) consisting of a Ge—Sb—Te system material is set to the deposition device, and the direct current sputtering was performed by a power of 100 W in an Ar gas. A pressure during the sputtering process was set to approximately 0.13 Pa. In addition, in the step for depositing the thermal insulation portion 216, a sputtering target (having a diameter of 100 mm and a thickness of 6 mm) consisting of a material having a composition $(SnO)_{40}(Ga_2O_3)_{40}(SiC)_{20}$ (mol %) is set to the deposition device, and the high frequency sputtering was performed under a pressure of approximately 0.13 Pa. A power was set to 400 W. During the sputtering process, an Ar gas was used. The sputtering processes in these steps were performed by covering areas except the surfaces on which the deposition were performed by a masking tool so that the phase change portion 215 and the thermal insulation portion 216 are not overlapped with each other. Note that the order of depositing the phase change portion 215 and the thermal insulation portion 216 is not important, and either of them can be deposited first. In addition, the phase change portion 215 and the thermal insulation portion 216 constitute the record portion 213. The phase change portion 215 corresponds to the recording layer of the present invention, while the thermal insulation portion 216 corresponds to the material layer of the present invention.

Note that the lower electrode 212 and the upper electrode 214 can be formed by the sputtering method that is widely used in fields of electrode forming technique, so detailed description of the film forming process thereof will be omitted.

When electric energy was applied to the information recording medium manufactured by the above-mentioned process, it was confirmed that a phase change was caused in the phase change portion 215 by using a system shown in FIG.

16. The cross section of the information recording medium shown in FIG. 16 is a section along the I-I line in the thickness direction of information recording medium shown in FIG. 15.

Figure 16:
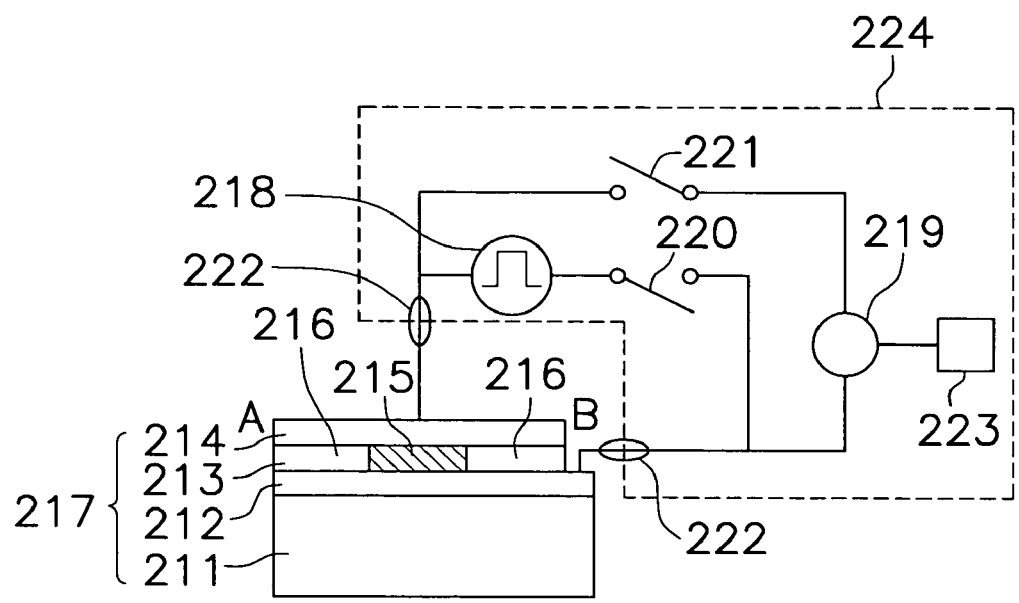
FIG. 16 is a is a simplified schematic illustration of showing an example of a system that uses the information recording medium shown in FIG. 15.

In more detail as shown in FIG. 16, by bonding two application portions 222 to the lower electrode 212 and the upper electrode 214 using Au lead wires, an electric writing/reading device 224 is connected to the information recording medium (the memory) via the application portions 222. In this electric writing/reading device 224, a pulse generating portion 218 is connected across the two application portions 222 via a switch 220, the two application portions 222 being connected to the lower electrode 212 and the upper electrode 214, respectively. In addition, a resistance measuring device 219 is connected via a switch 221. The resistance measuring device 219 is connected to a decision portion 223 for deciding high or low of a resistance value that is measured by the resistance measuring device 219. Using the pulse generating portion 218, a current pulse is applied across the upper electrode 214 and the lower electrode 212 via the application portions 222, a resistance value across the lower electrode 212 and the upper electrode 214 is measured by the resistance measuring device 219, and the decision portion 223 decides high or low of the resistance value. In general, as the phase change in the phase change portion 215 causes a change of the resistance value, this decision result can be used for knowing a phase state of the phase change portion 215.

In the example B 25, a melting point of the phase change portion 215 was 630 degrees Celsius, a crystallization temperature was 170 degrees Celsius, and a crystallization time was 130 nsec. A resistance value across the lower electrode 212 and the upper electrode 214 was 1,000 ohms when the phase change portion 215 is in the amorphous phase state and 20 ohms in the crystalline phase state. A current pulse of 20 mA and 150 ns was applied across the lower electrode 212 and the upper electrode 214 when the phase change portion 215 was in the amorphous phase state (namely in the high resistance state). Then, the resistance value across the lower electrode 212 and the upper electrode 214 was decreased, and the phase change portion 215 transferred from the amorphous phase state to the crystalline phase state. Next, a current pulse of 200 mA and 100 ns was applied across the lower electrode 212 and the upper electrode 214 when the phase change portion 215 was in the crystalline phase state (namely in the low resistance state). Then, the resistance value across the lower electrode 212 and the upper electrode 214 was increased and the phase change portion 215 transferred from the crystalline phase to the amorphous phase.

From the result described above, it was confirmed that when a layer containing a material having a composition $(SnO)_{40}(Ga_2O_3)_{40}(SiC)_{20}$ (mol %) was formed as the thermal insulation portion 216 surrounding the phase change portion 215, phase change could be caused in the phase change portion 215 by applying electric energy so that a function of recording information was realized. This phenomenon can be considered to mean that the same effect as the oxide-carbide system material layer used in the first through the twenty-fourth example B was obtained considering the recording sensitivity of the first through the twenty-fourth example.

Like the example B 25, when the thermal insulation portion 216 that is a dielectric made of $(SnO)_{40}(Ga_2O_3)_{40}(SiC)_{20}$ (mol %) is provided around the cylinder-like phase change portion 215, current flowing in the phase change portion 215 when a voltage is applied across the upper electrode 214 and the lower electrode 212 can be prevented effectively from leaking into the peripheral portion. As a result, temperature of the phase change portion 215 can be increased efficiency by Joule heat generated by the current. Particularly, when the phase change portion 215 is transferred to the amorphous phase state, it is necessary to melt $Ge_{38}Sb_{10}Te_{52}$ of the phase change portion 215 once and then cool the same rapidly. The phase change portion 215 can be melted by a small value of the current when the thermal insulation portion 216 is provided around the phase change portion 215.

$(SnO)_{40}(Ga_2O_3)_{40}(SiC)_{20}$ (mol %) that is used for the thermal insulation portion 216 has a high melting point and hardly cause atom diffuse due to heat, so it can be used for the above-mentioned electric memory. In addition, if the thermal insulation portion 216 exists around the phase change portion 215, the thermal insulation portion 216 becomes an obstacle so that the phase change portion 215 is separated substantially on the surface of the record portion 213 in electrical and thermal manner. Utilizing this phenomenon, a memory capacity of the information recording medium can be increased, and an access function and a switching function can be improved when plural phase change portions 215 are provided in the state separated by the thermal insulation portions 216 from each other in the information recording medium. Alternatively, it is also possible to connect plural information recording media.

As described above about the information recording medium according to the present invention using various examples, both in an information recording medium for recording information by optical means and in an information recording medium for recording information by electric means, a novel structure can be realized by providing an oxide-carbide system material layer defined by the present invention as a dielectric layer to be adjacent to a recording layer. Thus, performances that are superior to the conventional information recording medium can be obtained.

The information recording medium and the method for manufacturing the same according to the present invention is useful for a high density rewritable and write once optical disks as the medium has a property of holding record information for a long period (nonvolatile property). In addition, it can be also applied to a usage of an electric nonvolatile memory or the like, too.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An information recording medium comprising:
   an information layer including:
   a recording layer that is changeable between a crystalline phase and an amorphous phase by applying at least one of a laser beam and electric current, and
   a dielectric layer containing at least C, Si, Sn and O, the dielectric layer being represented by a composition formula $C_d Si_e Sn_f O_{100-d-e-f}$, where $0<d<25$, $0<e<25$, and $15<f<40$ (atom %).

2. An information recording medium comprising:
   a plurality of information layers including at least one information layer having:
   a recording layer that is changeable between a crystalline phase and an amorphous phase by applying at lease one of a laser beam and electric current, and a dielectric layer containing at least C, Si, Sn and O, the dielectric layer being represented by a composition formula $C_dSi_eSn_fO_{100-d-e-f}$, where 0<d<25, 0<e<25, and 15<f<40 (atom %).

3. The information recording medium according to claim 1, wherein
the recording layer is arranged closer to a laser incident side of the information recording medium than the dielectric layer.

4. The information recording medium according to claim 3, further comprising
an interface layer disposed between the recording layer and the dielectric layer.

5. The information recording medium according to claim 1, wherein
the dielectric layer contains mixture of $SnO_2$ and SiC.

6. The information recording medium according to claim 5, wherein
the dielectric layer is represented by a composition formula $(SnO_2)_{100-x}(SiC)_x$, where 0<x≦50 (mol %).

7. The information recording medium according to claim 1, wherein
the dielectric layer further contains at least one of a following group of elements of Ti, Zr, Hf, Y, Zn, Nb, Ta, Al, Bi, Cr, Ga, Ge and La.

8. The information recording medium according to claim 5, wherein
the dielectric layer further contains at least one of a following group of compounds of $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Si—N, Ge—N, Cr—N, and $LaF_3$.

9. The information recording medium according to claim 1, wherein
the dielectric layer has a film thickness within a range of 2 nm to 75 nm.

10. The information recording medium according to claim 1, wherein
the dielectric layer has a film thickness within a range of 2 nm to 40 nm.

11. The information recording medium according to claim 1, wherein
the recording layer contains at least one of a following group of elements of Sb, Bi and Sn, and contains Ge and Te.

12. The information recording medium according to claim 1, wherein
the recording layer is represented by one of a following group of compositions (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2Te_3$ and (Ge—Sn)Te—(Sb—Bi)$_2Te_3$.

13. The information recording medium according to claim 4, wherein
the interface layer contains at least one of a following group of elements of Zr, Hf, Y and Si, contains at least one of a following group of elements of Ga and Cr, and contains O.

14. The information recording medium according to claim 4, wherein
the interface layer contains at least one oxide of a following group of oxides of $ZrO_2$, $HfO_2$, $Y_2O_3$ and $SiO_2$, and contains at least one oxide of a following group of oxides of $Ga_2O_3$ and $Cr_2O_3$.

15. The information recording medium according to claim 13, wherein
the interface layer has a film thickness within a range of 0.5 nm to 15 nm.

16. The information recording medium according to claim 13, wherein
the interface layer has a film thickness within a range of 1 nm to 7 nm.

17. A method for manufacturing an information recording medium comprising:
forming an information layer including forming a phase-change type recording layer and forming a dielectric layer; and
using a sputtering target containing at least C, Si, Sn and O in forming the dielectric layer, the sputtering target being represented by a composition formula $C_gSi_hSn_iO_{100-g-h-i}$, where 0<g<30, 0<h<30, and 15<i<40 (atom %).

18. A method for manufacturing an information recording medium comprising:
forming a plurality of information layers, the forming of the information layers including forming at least one information layer having a phase-change type recording layer and a dielectric layer; and
using a sputtering target containing at least C, Si, Sn and O in forming the dielectric layer, the sputtering target being represented by a composition formula $C_gSi_hSn_iO_{100-g-h-i}$, where 0<g<30, 0<h<30, and 15<i<40 (atom %).

19. The method according to claim 17, further comprising
forming an interface layer between the recording layer and the dielectric layer.

20. The method according to claim 17, wherein
the sputtering target used for forming the dielectric layer contains a mixture of $SnO_2$ and SiC.

21. The method according to claim 20, wherein
the sputtering target used for forming the dielectric layer is represented by a composition formula $(SnO_2)_{100-y}(SiC)_y$, where 0<y≦55 (mol %).

22. The method according to claim 17, wherein
the sputtering target used for forming the dielectric layer further contains at least one of a following group of elements of Ti, Zr, Hf, Y, Zn, Nb, Ta, Al, Bi, Cr, Ga, Ge and La.

23. The method according to claim 17, wherein
the sputtering target used for forming the dielectric layer further contains at least one of a following group of compounds of $TiO_2$, $ZrO_2$, $HfO_2$, ZnO, $Nb_2O_5$, $Ta_2O_5$, $SiO_2$, $Al_2O_3$, $Bi_2O_3$, $Cr_2O_3$, $Ga_2O_3$, Si—N, Ge—N, Cr—N and $LaF_3$.

24. The method according to claim 17, wherein
the dielectric layer is formed using Ar gas, or a mixed gas of Ar gas and $O_2$ gas.

25. An information recording medium for at least one of recording and reproducing information by applying at least one of light and electric energy, comprising:
an information layer including a dielectric layer that contains at least one of elements of a group GM consisting of Sn and Ga, contains at least one of elements of a group GL consisting of Si, Ta and Ti, and contains oxygen and carbon,
wherein the dielectric layer is represented by a composition formula $M_HO_IL_JC_K$ (atom %), where element M is at least one of elements of the group GM, element L is at least one of elements of the group GL, term H falls in a range 10≦H≦40, term I falls in a range 35≦I≦70, term J falls in a range 0<J≦30, term K falls in a range 0<K≦30, and equation H+I+J+K=100 is satisfied.

26. The information recording medium according to claim 25, wherein
the element M is Sn in the dielectric layer.

27. The information recording medium according to claim 25, wherein
the element M contains Sn and Ga in the dielectric layer.

28. The information recording medium according to claim 25, wherein
the element A contains Zr in the dielectric layer.

29. The information recording medium according to claim 25, wherein
the information layer includes a phase-change type recording layer.

30. The information recording medium according to claim 29, wherein
the recording layer contains one of a following group of materials of Ge—Sb—Te, Ge—Sn—Sb—Te, Ge—Bi—Te, Ge—Sn—Bi—Te, Ge—Sb—Bi—Te, Ge—Sn—Sb—Bi—Te, Ag—In—Sb—Te and Sb—Te.

31. The information recording medium according to claim 30, wherein
the recording layer has a film thickness of less than or equal to 15 nm.

32. The information recording medium according to claim 29, wherein
the dielectric layer is arranged to contact at least one interface of the recording layer.

33. A method for manufacturing an information recording medium for at least one of recording and reproducing information by applying at least one of light and electric energy comprising:
providing the information recording medium with a dielectric layer; and
forming the dielectric layer by a sputtering method using a sputtering target that contains at least one of elements of a group GM consisting of Sn and Ga, contains at least one of elements of a group GL consisting of Si, Ta and Ti, and contains oxygen and carbon, wherein the sputtering target contains a material represented by a composition formula $M_hO_iL_jC_k$ (atom %), where element M is at least one of elements of the group GM, element L is at least one of elements of the group GL, term h falls in a range $10 \leq h \leq 40$, term i falls in a range $35 \leq i \leq 70$, term j falls in a range $0 < j \leq 30$, term k falls in a range $0 < k \leq 30$, and equation h+i+j+k=100 is satisfied.

34. The method according to claim 33, wherein
the element M is Sn in the sputtering target.

35. The method according to claim 33, wherein
the element M contains Sn and Ga in the sputtering target.

36. The method according to claim 33, wherein
the element A contains Zr in the sputtering target.

37. The method according to claim 33, wherein
the sputtering target contains:
(a) an oxide of at least one of elements of the group GM consisting of Sn and Ga; and
(b) a carbide of at least one of elements of the group GL consisting of Si, Ta and Ti.

38. The method according to claim 37, wherein
the sputtering target contains at least one of oxides of Zr and Hf.

39. The method according to claim 37, wherein
the sputtering target contains oxides of elements of the group GM by 50 mol % or more.

40. The method according to claim 39, wherein
the sputtering target contains an oxide of Sn by 50 mol % or more.

41. The method according to claim 39, wherein
the sputtering target contains an oxide of Sn and an oxide of Ga by total 50 mol % or more.

42. The method according to claim 38, wherein
the sputtering target contains an oxide of Zr.

43. The method according to claim 37, wherein
the sputtering target contains a material that is represented by a composition formula $(D)_x(B)_{100-x}$ (mol %), where element D is at least one of compounds of $SnO_2$ and $Ga_2O_3$, element B is at least one of compounds of SiC, TaC and TiC, and term x falls in a range $50 \leq x \leq 95$.

44. The method according to claim 38, wherein
the sputtering target contains a material that contains at least one of oxides of Zr and Hf and is represented by a composition formula $(D)_x(E)_y(B)_{100-(x+y)}$ (mol %), where element D is at least one of compounds of $SnO_2$ and $Ga_2O_3$, element E is at least one of compounds of $ZrO_2$ and $HfO_2$, element B is at least one of SiC, TaC and TiC, term x falls in a range $50 \leq x \leq 95$ and term y falls in a range $0 < y \leq 40$.

45. The method according to claim 43, wherein
the sputtering target contains a material in which the element D is represented by a composition formula $SnO_2$.

46. The method according to claim 43, wherein
the sputtering target contains a material in which the element D is represented by a composition formula $SnO_2$ and $Ga_2O_3$.

47. The method according to claim 44, wherein
the sputtering target contains a material in which the element A is represented by a composition formula $ZrO_2$.

48. The method according to claim 43, wherein
the sputtering target contains a material in which the element B is represented by a composition formula SiC.

* * * * *